(12) United States Patent
Chen et al.

(10) Patent No.: US 11,973,144 B2
(45) Date of Patent: Apr. 30, 2024

(54) METHOD OF MANUFACTURING A SEMICONDUCTOR AND A SEMICONDUCTOR DEVICE

(71) Applicant: TAIWAN SEMICONDUCTOR MANUFACTURING COMPANY, LTD., Hsinchu (TW)

(72) Inventors: Chang-Yin Chen, Taipei (TW); Che-Cheng Chang, New Taipei (TW); Chih-Han Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 61 days.

(21) Appl. No.: 17/536,819

(22) Filed: Nov. 29, 2021

(65) Prior Publication Data

US 2022/0085203 A1    Mar. 17, 2022

Related U.S. Application Data

(63) Continuation of application No. 16/562,406, filed on Sep. 5, 2019, now Pat. No. 11,189,728.

(51) Int. Cl.
*H01L 29/06* (2006.01)
*H01L 21/02* (2006.01)
(Continued)

(52) U.S. Cl.
CPC ...... *H01L 29/785* (2013.01); *H01L 21/02129* (2013.01); *H01L 21/02532* (2013.01);
(Continued)

(58) Field of Classification Search
CPC .................................................. H01L 29/0673
See application file for complete search history.

(56) References Cited

U.S. PATENT DOCUMENTS 9,461,110 B1   10/2016 Wang et al.
9,490,365 B2   11/2016 Jangjian et al.
(Continued)

FOREIGN PATENT DOCUMENTS

CN   104246994 A   12/2014
CN   106169499 A   11/2016
(Continued)

OTHER PUBLICATIONS

Non-Final Office Action issued in U.S. Appl. No. 16/562,406, dated Mar. 26, 2021.
(Continued)

*Primary Examiner* — Christopher A Johnson
(74) *Attorney, Agent, or Firm* — STUDEBAKER & BRACKETT PC

(57) ABSTRACT

A semiconductor device includes an isolation insulating layer disposed over a substrate, a semiconductor fin disposed over the substrate, an upper portion of the semiconductor fin protruding from the isolation insulating layer and a lower portion of the semiconductor fin being embedded in the isolation insulating layer, a gate structure disposed over the upper portion of the semiconductor fin and including a gate dielectric layer and a gate electrode layer, gate sidewall spacers disposed over opposing side faces of the gate structure, and a source/drain epitaxial layer. The upper portion of the semiconductor fin includes a first epitaxial growth enhancement layer made of a semiconductor material different from a remaining part of the semiconductor fin. The first epitaxial growth enhancement layer is in contact with the source/drain epitaxial layer. The gate dielectric layer covers the upper portion of the semiconductor fin including the first epitaxial growth enhancement layer.

20 Claims, 46 Drawing Sheets

(51) Int. Cl.
*H01L 29/08* (2006.01)
*H01L 29/66* (2006.01)
*H01L 29/78* (2006.01)

(52) U.S. Cl.
CPC .... *H01L 29/0847* (2013.01); *H01L 29/66545* (2013.01); *H01L 29/66795* (2013.01)

(56) References Cited

U.S. PATENT DOCUMENTS

| | | | |
|---|---|---|---|
| 9,583,598 | B2 | 2/2017 | Lee et al. |
| 10,002,969 | B2 | 6/2018 | Chen et al. |
| 10,062,779 | B2 | 8/2018 | Colinge et al. |
| 10,158,007 | B2 | 12/2018 | Lee et al. |
| 10,170,332 | B2 | 1/2019 | Huang |
| 10,297,690 | B2 | 5/2019 | Li et al. |
| 10,361,309 | B2 | 7/2019 | Lee et al. |
| 10,886,268 | B2 | 1/2021 | Lee |
| 11,107,734 | B2 | 8/2021 | Lee et al. |
| 2013/0270655 | A1 | 10/2013 | Adam et al. |
| 2016/0204260 | A1 | 7/2016 | Ching |
| 2016/0322358 | A1 | 11/2016 | Ching et al. |
| 2016/0365414 | A1 | 12/2016 | Peng et al. |
| 2017/0194213 | A1 | 7/2017 | Ching et al. |
| 2017/0256456 | A1 | 9/2017 | Lee et al. |
| 2019/0006491 | A1 | 1/2019 | Lee et al. |
| 2019/0081153 | A1 | 3/2019 | Ching et al. |
| 2019/0131431 | A1* | 5/2019 | Cheng ............... H01L 29/66439 |
| 2019/0140080 | A1 | 5/2019 | Lee et al. |
| 2019/0148151 | A1 | 5/2019 | Okuno et al. |
| 2019/0148490 | A1* | 5/2019 | Fung ................ H01L 29/78654 438/157 |
| 2020/0403099 | A1 | 12/2020 | Cheng et al. |

FOREIGN PATENT DOCUMENTS

| | | | |
|---|---|---|---|
| CN | 107017205 | A | 8/2017 |
| CN | 107154356 | A | 9/2017 |
| CN | 107154384 | A | 9/2017 |
| CN | 108269850 | A | 7/2018 |
| KR | 10-2015-0143259 | A | 12/2015 |
| KR | 10-2016-0002305 | A | 1/2016 |
| KR | 10-2016-0040424 | A | 4/2016 |
| KR | 10-2016-0085692 | A | 7/2016 |
| KR | 10-2016-0114010 | A | 10/2016 |
| KR | 10-2016-0129667 | A | 11/2016 |
| KR | 10-2016-0129689 | A | 11/2016 |
| KR | 10-2016-0147608 | A | 12/2016 |
| KR | 10-2017-0088115 | A | 8/2017 |
| KR | 10-2018-0060909 | A | 6/2018 |

OTHER PUBLICATIONS

Notice of Allowance issued in U.S. Appl. No. 16/562,406, dated Jul. 16, 2021.

Office Action dated Feb. 26, 2024 in Chinese App. No. 202010387082.5, together with English language translation thereof.

* cited by examiner

METHOD OF MANUFACTURING A SEMICONDUCTOR AND A SEMICONDUCTOR DEVICE

RELATED APPLICATIONS

This application is a continuation of U.S. patent application Ser. No. 16/562,406 filed Sep. 5, 2019, now U.S. Pat. No. 11,189,728, the entire content of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. As transistor dimensions are continually scaled down to sub 10-15 nm technology nodes, further improvements of the FinFET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5B and 5D are top (plan) view and FIGS. 5A and 5C show cross sectional views.

FIG. 15B is a top (plan) view and FIG. 15B is a cross sectional view.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

FIGS. 1A-10B show exemplary sequential processes for manufacturing the FET device according to an embodiment of the present disclosure. It is understood that additional operations can be provided before, during, and after processes shown by FIGS. 1-10B, and some of the operations described below can be replaced or eliminated, for additional embodiments of the method. The order of the operations/processes may be interchangeable.

Figure 1A:
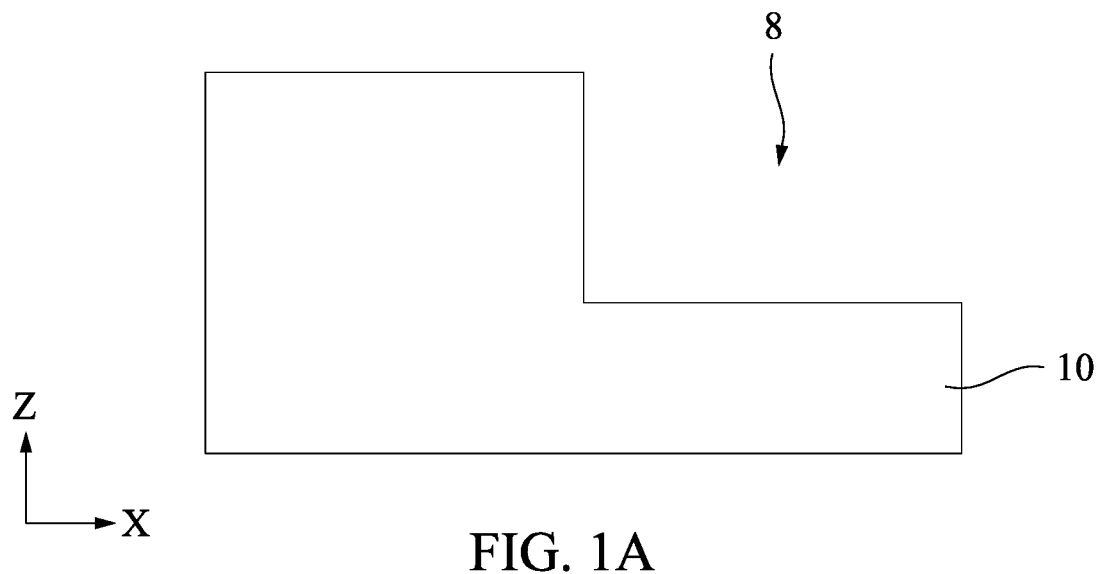
FIG. 1A shows a cross sectional view of one of the stages of a sequential process for manufacturing a FinFET device according to an embodiment of the present disclosure.

As shown in FIG. 1A, a part of a substrate 10, in which one or more p-type FETs are subsequently formed, is etched to form a recess 8 by one or more lithography and etching operations. In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include various regions that have been suitably doped with impurities (e.g., p-type or n-type conductivity). The dopants are, for example boron ($BF_2$) for an n-type Fin FET and phosphorus for a p-type Fin FET.

Figure 1B:
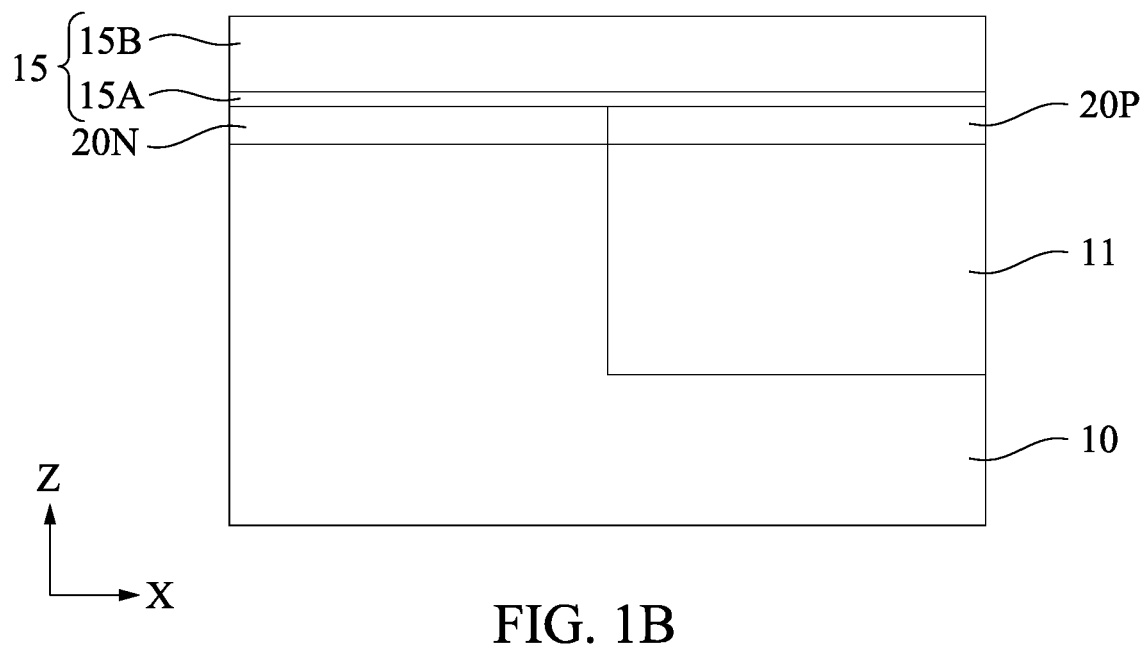
FIG. 1B shows a cross sectional view of one of the stages of a sequential process for manufacturing a FinFET device according to an embodiment of the present disclosure.

As shown in FIG. 1B, an epitaxial layer 11 is formed in the recess 8. In some embodiment, the epitaxial layer 11 is made of SiGe. In some embodiments, the germanium concentration of the SiGe layer is in a range from about 5 atomic % to about 30 atomic %. In some embodiments, one or more buffer layer having a lower Ge concentration than the epitaxial layer 11 is formed between the epitaxial layer 11 and the substrate 10.

Further, as shown in FIG. 1B, epitaxial growth enhancement layers 20N and 20P are formed over the substrate 10 for one or more n-type FETs (n-type region) and over the epitaxial layer for one or more p-type FET (p-type region). In some embodiments, the n-type epitaxial growth enhancement layer 20N includes one or more of SiP, SiCP, SiGe and SiGeB. In some embodiments, SiP and/or SiCP are used as the n-type epitaxial growth enhancement layer 20N for n-type FETs. In some embodiments, an amount of P in the n-type epitaxial growth enhancement layer 20N is in a range from about 3 atomic % to about 30 atomic %. If the amount of P is too large, the n-type epitaxial growth layer 20N may include defects caused by lattice mismatch and the amount of P is too small, the epitaxial enhancement effect may not be obtained. For the p-type epitaxial growth enhancement layer 20P, one or more of SiGe and SiGeB are used for a p-type FET. In some embodiments, an amount of Ge in the p-type epitaxial growth enhancement layer 20P is higher than the amount of Ge in the epitaxial layer 11 and is in a range from about 10 atomic % to about 40 atomic %. If the amount of Ge is too large, the p-type epitaxial growth layer 20P may include defects caused by lattice mismatch and the amount of Ge is too small, the epitaxial enhancement effect may not be obtained. When the epitaxial growth enhancement layers 20N and 20P are a semiconductor material, the epitaxial growth enhancement layers can be epitaxially formed on the semiconductor substrate 10 and on the epitaxial layer 11, respectively.

In some embodiments, the epitaxial growth enhancement layer includes an oxide of one or more of Si, SiP and SiGe. The oxide of the Si, SiP and/or SiGe can be formed by chemical vapor deposition (CVD), such as low pressure CVD (LPCVD) and plasma enhanced CVD (PECVD), physical vapor deposition (PVD), atomic layer deposition (ALD), or other suitable process.

In some embodiments, the epitaxial growth enhancement layer is formed by one or more ion implantation operations. The dopants are P and/or Ge in some embodiments.

The thickness of the epitaxial growth enhancement layer 20N, 20P is in a range from about 1 nm to about 50 nm in some embodiments, and is in a range from 5 nm to 30 nm in other embodiments. When the thickness is larger than these ranges, channel properties may degrade, and when the thickness is smaller than these ranges, function as an epitaxial growth enhancement layer becomes insufficient.

In other embodiments, either one of the n-type epitaxial growth enhancement layer 20N or the p-type epitaxial growth enhancement layer 20P is formed.

In some embodiments, a mask layer 15 is further formed over the epitaxial growth enhancement layers 20N, 20P. In some embodiments, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by CVD, PVD, ALD, or other suitable process.

Figure 2A:
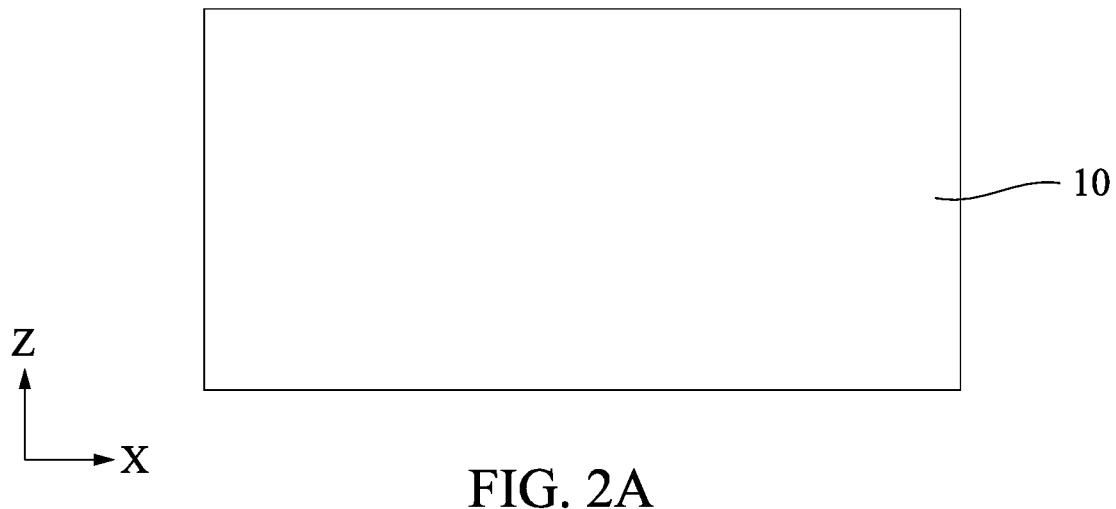
FIG. 2A shows a cross sectional view of one of the stages of a sequential process for manufacturing a FinFET device according to an embodiment of the present disclosure.
Figure 2B:
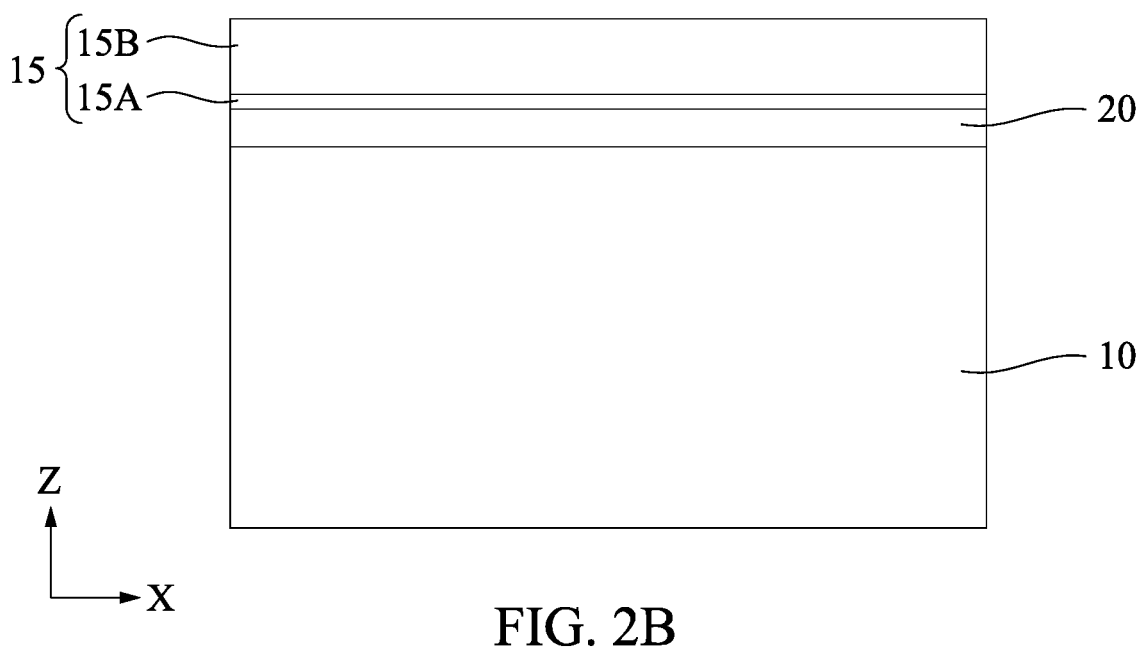
FIG. 2B shows a cross sectional view of one of the stages of a sequential process for manufacturing a FinFET device according to an embodiment of the present disclosure.

In other embodiments, no recess 8 is formed and no epitaxial layer 11 is formed, and thus n-type FETs and p-type FETs are formed over a Si substrate 10 as shown in FIGS. 2A and 2B. In such a case, an epitaxial growth enhancement layer 20 is formed on both n-type region and p-type region. In other embodiments, an epitaxial growth enhancement layer 20 is formed on either of the n-type region or the p-type region. In yet other embodiments, the n-type regions of the substrate 10 is also etched to form recesses and silicon layer is epitaxially formed in the recesses. The followings show the embodiments in which the epitaxial layer 11 (e.g., a SiGe layer) is formed. However, the following embodiments are applicable to the case where no epitaxial layer 11 is formed. In such case, the p-type FET and the n-type FET have substantially the same fin (channel0 structures except for the epitaxial growth layers.

Figure 3:
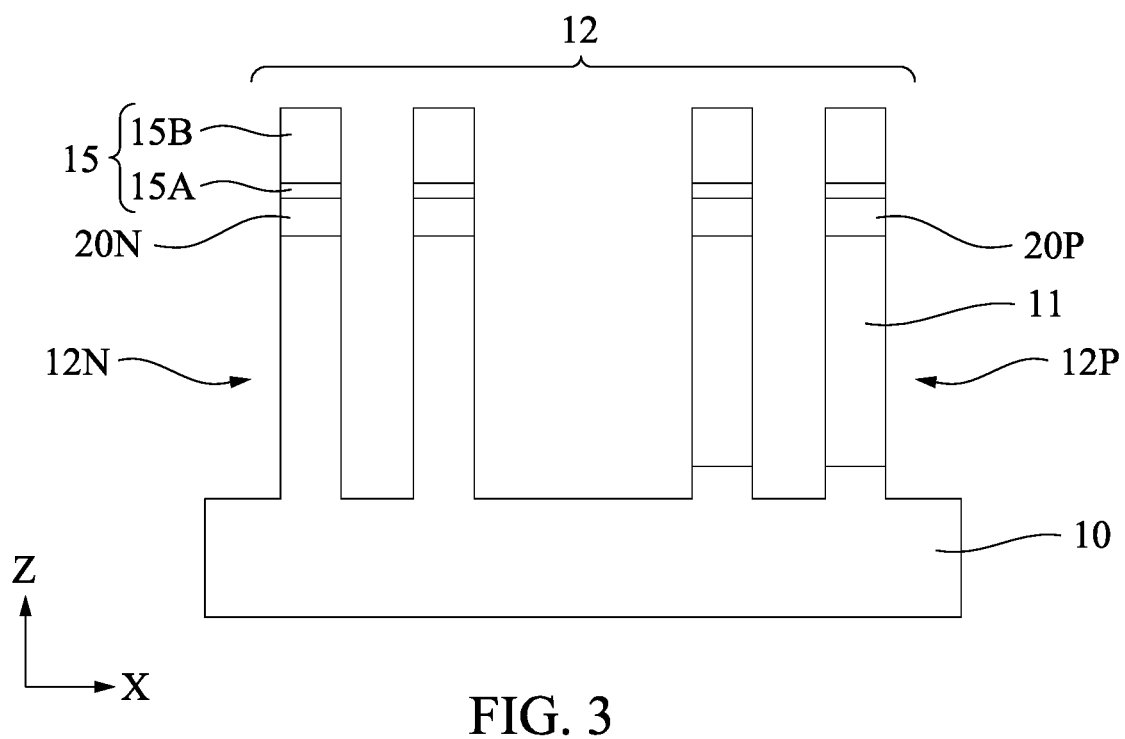
FIG. 3 shows a cross sectional view of one of the stages of a sequential process for manufacturing a FinFET device according to an embodiment of the present disclosure.

Next, as shown in FIG. 3, the mask layer 15 and the substrate 10 and the epitaxial layer 11 in the p-type region are patterned by using the patterned mask layer, thereby forming fin structures 12N and 12P (collectively fin structures 12) extending in the Y direction. In some embodiments, the fin structures 12N are for an n-type FET, and the fin structures 12P are for a p-type FET. In FIG. 3, two fin structures are arranged in the X direction for an n-type FET and a p-type FET respectively. But the number of the fin structures is not limited to two, and may be as small as one and three or more. In some embodiments, one or more dummy fin structures are formed on both sides of the fin structures 12 to improve pattern fidelity in the patterning operations.

The fin structures 12 can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures.

Figure 4:
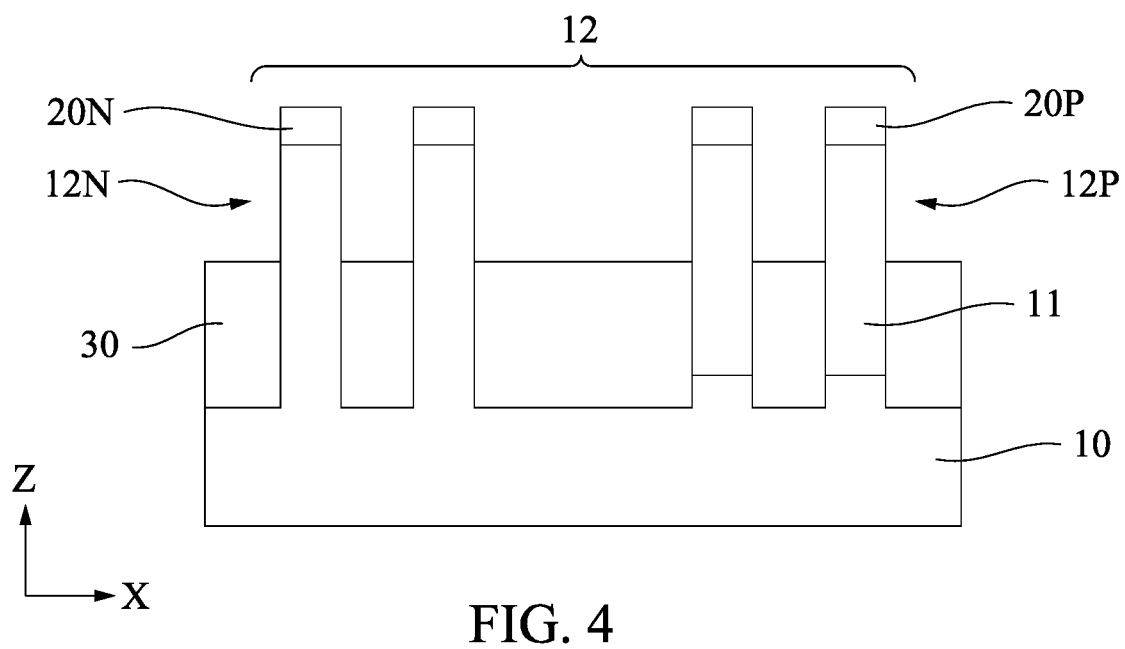
FIG. 4 shows a cross sectional view of one of the stages of a sequential process for manufacturing a FinFET device according to an embodiment of the present disclosure.

After the fin structure is formed, an insulating material layer including one or more layers of insulating material is formed over the substrate so that the fin structures 12 are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surfaces of the epitaxial growth enhancement layers 20N, 20P are exposed from the insulating material layer. Then, as shown in FIG. 4, the insulating material layer is recessed to form an isolation insulating layer 30 so that the upper portions of the fin structures 12 are exposed. With this operation, the fin structures 12 are electrically separated from each other by the isolation insulating layer 30, which is also called a shallow trench isolation (STI).

Figure 5A:
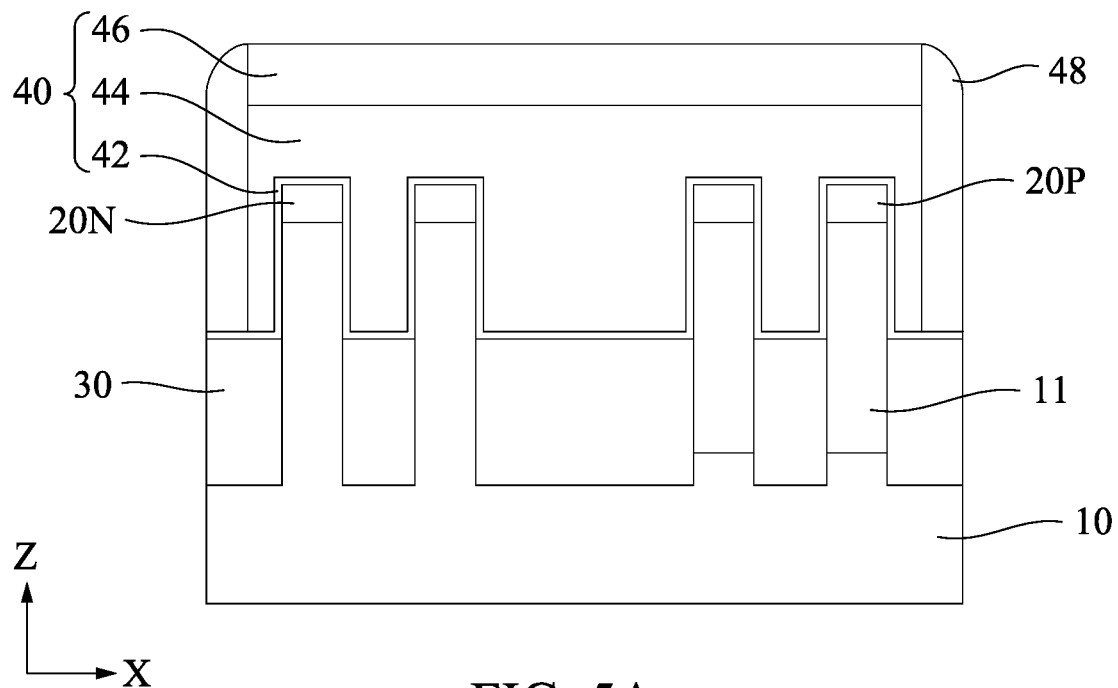
FIGS. 5A and 5B show views of one of the stages of a sequential process for manufacturing a FinFET device according to an embodiment of the present disclosure.
Figure 5B:
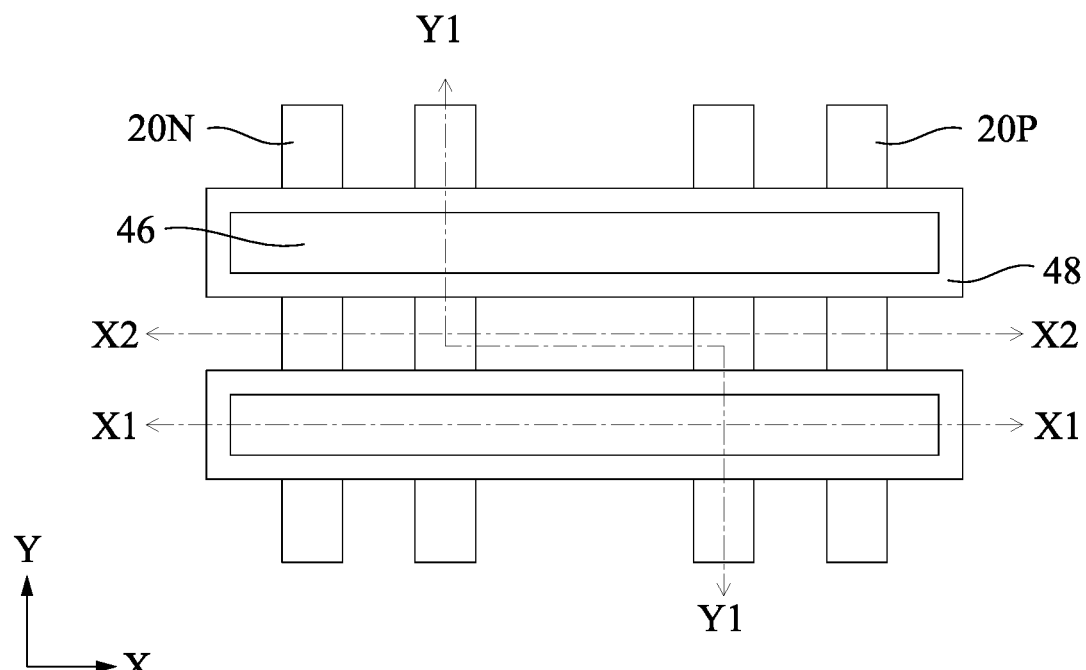

After the isolation insulating layer 30 is formed, a sacrificial gate structures 40 are formed over the fin structures, as shown in FIGS. 5A and 5B. FIG. 5B is a top (plan) view and FIG. 5A is a cross sectional view corresponding to line X1-X1 of FIG. 5B. In some embodiments, the sacrificial gate structure includes a sacrificial dielectric layer 42, a sacrificial gate electrode layer 44 and a hard mask layer 46. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments. The sacrificial gate electrode layer 44 includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. The hard mask layer 46 is used to form the sacrificial gate electrode layer 44 and includes one or more layers of silicon nitride and silicon. In some embodiments, the sacrificial gate dielectric layer 42 also cover the source/drain region of the fin structures 12 having the epitaxial growth enhancement layers 20N, 20P. FIG. 5B does not show the sacrificial gate dielectric layer 42 for simplicity.

After the sacrificial gate structure is formed, a blanket layer of an insulating material for sidewall spacers 48 is conformally formed by using CVD or other suitable methods. The blanket layer is deposited in a conformal manner so that it is formed to have substantially equal thicknesses on vertical surfaces, such as the sidewalls, horizontal surfaces, and the top of the sacrificial gate structure. In some embodiments, the blanket layer is deposited to a thickness in a range from about 2 nm to about 10 nm. In one embodiment, the insulating material of the blanket layer is a silicon nitride-based material, such as SiN, SiON, SiOCN or SiCN and combinations thereof. The sidewall spacers 48 are formed on opposite sidewalls of the sacrificial gate structures 40, as shown in FIGS. 5A and 5B.

Figure 5C:
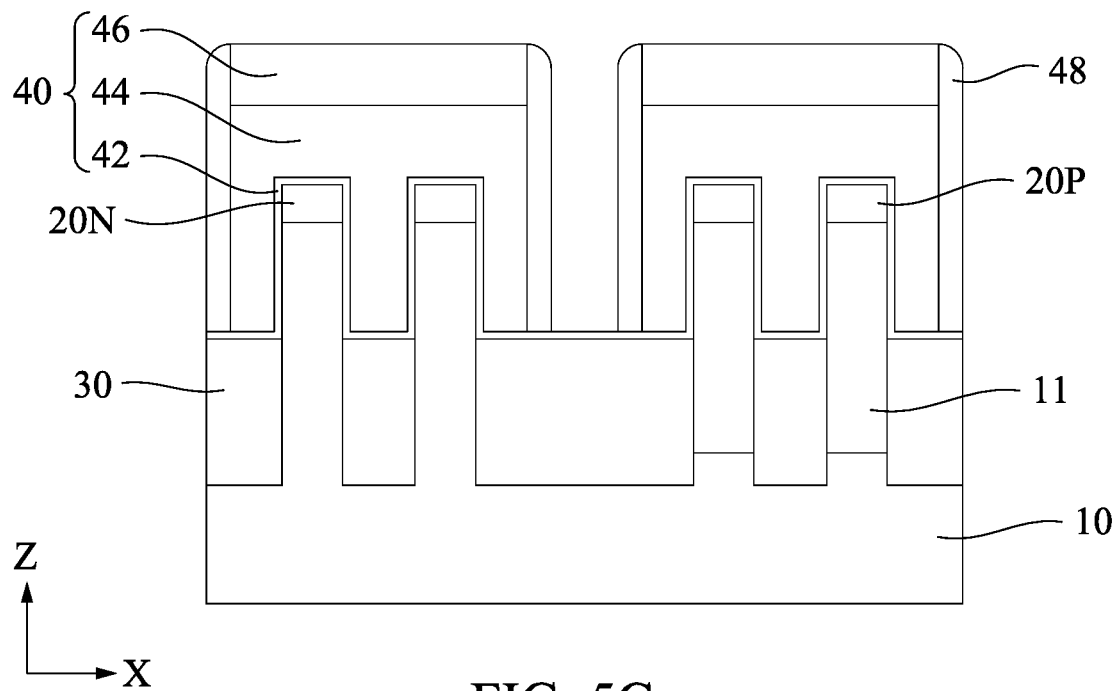
FIGS. 5C and 5D show views of one of the stages of a sequential process for manufacturing a FinFET device according to an embodiment of the present disclosure.
Figure 5D:
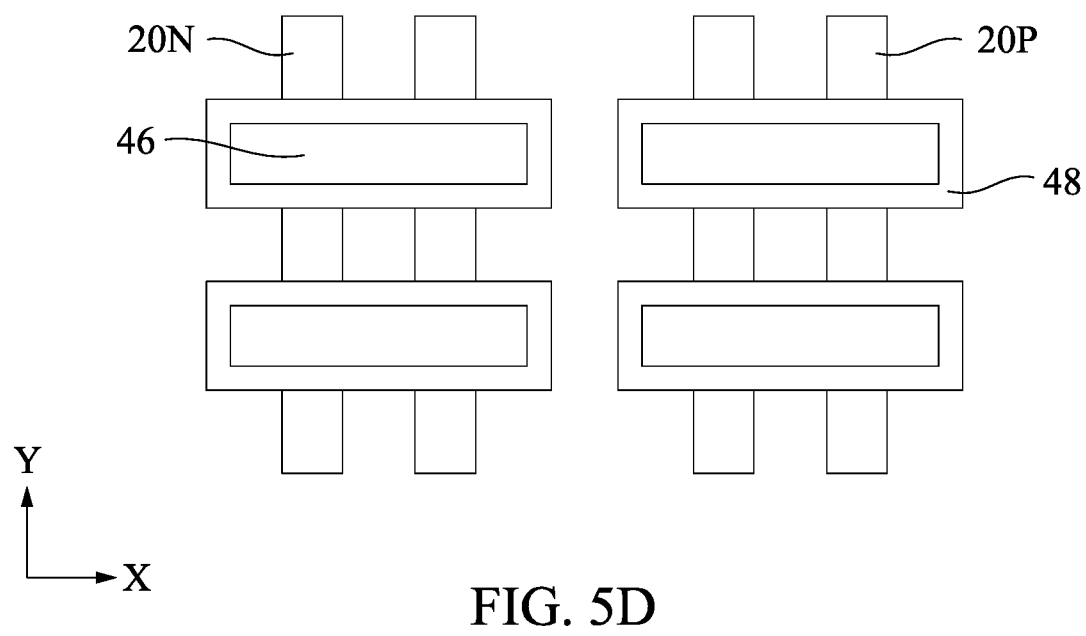

In the embodiment of FIGS. 5A and 5B, the sacrificial gate structure 40 is disposed over the n-type fin structures 12N and the p-type fin structures. In other embodiments, separate sacrificial gate structures are formed over the n-type fin structures 12N and the p-type fin structures, respectively, as shown in FIGS. 5C and 5D.

Figure 6A:
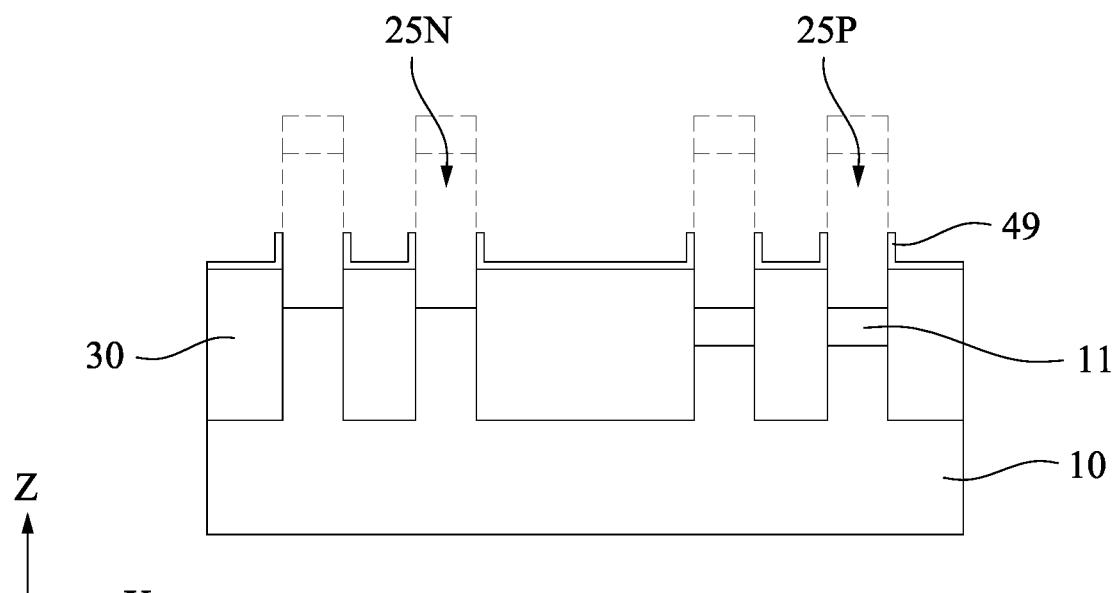
FIGS. 6A and 6B show cross sectional views of one of the stages of a sequential process for manufacturing a FinFET device according to an embodiment of the present disclosure.
Figure 6B:
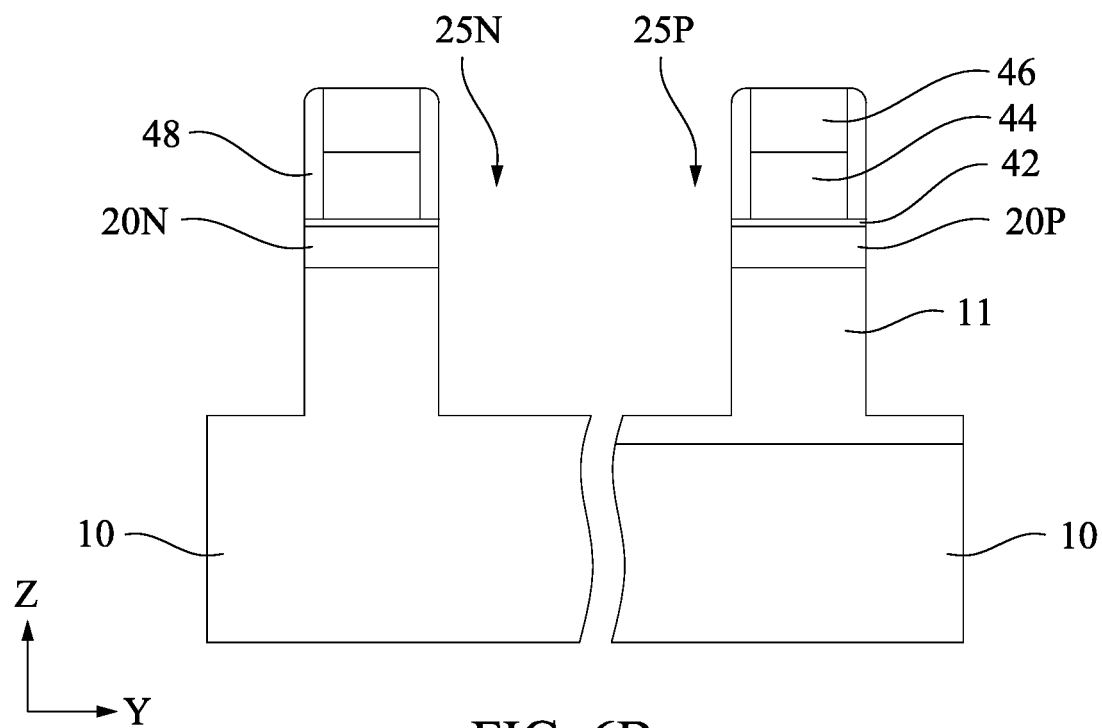

Subsequently, the fin structures of source/drain regions are recessed down below the upper surface of the isolation insulating layer 30 by using dry etching and/or wet etching, as shown in FIGS. 6A and 6B. FIG. 6A is the cross sectional view corresponding to line X2-X2 of FIG. 5B, and FIG. 6B is the cross sectional view corresponding to line Y1-Y1 of FIG. 5B.

As shown in FIG. 6B, the side faces of the epitaxial growth enhancement layers 20N and 20P are exposed in the source/drain recesses 25N and 25P, respectively.

In some embodiments, before the recess etching a blanket layer of dielectric material for fin sidewalls is formed, and anisotropic etching is performed on the blanket layer using, for example, reactive ion etching (RIE). In some embodiments, the fin sidewall spacers 49 remain around the source/drain recess as shown in FIG. 6A.

Figure 7A:
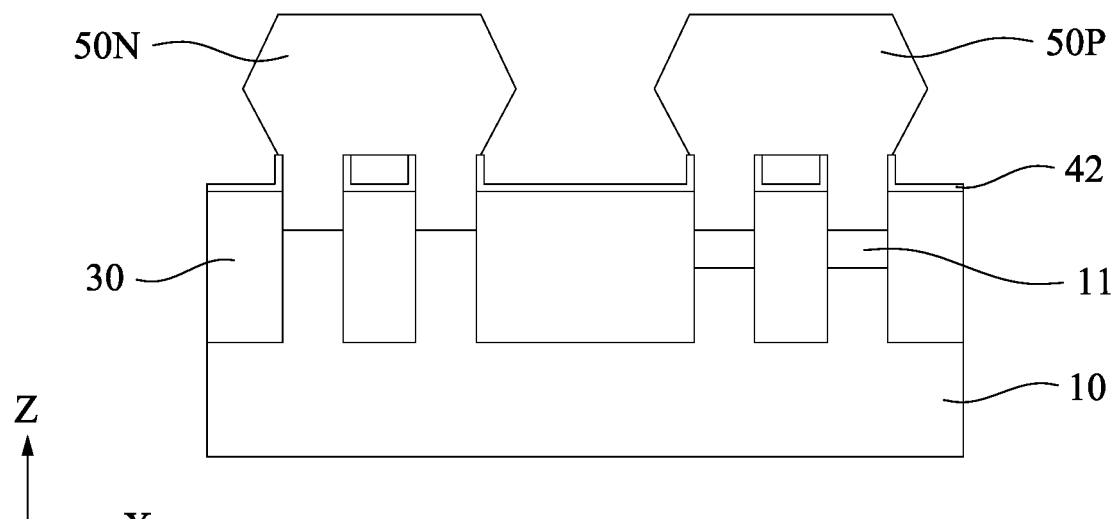
FIGS. 7A and 7B show cross sectional views of one of the stages of a sequential process for manufacturing a FinFET device according to an embodiment of the present disclosure.
Figure 7B:
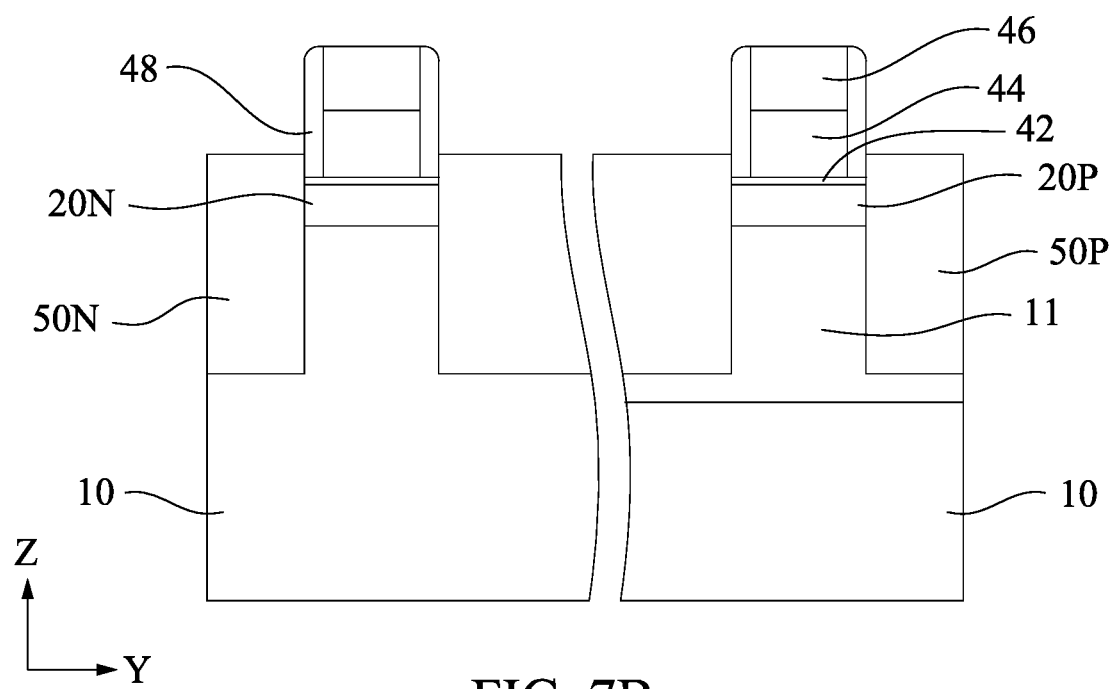

After the source/drain recesses are formed, source/drain (S/D) epitaxial layers 50N and 50P are formed, as shown in FIGS. 7A and 7B. FIG. 7A is the cross sectional view corresponding to line X2-X2 of FIG. 5B, and FIG. 7B is the cross sectional view corresponding to line Y1-Y1 of FIG. 5B. The S/D epitaxial layer 50N for n-type FETs includes one or more layers of SiP and SiCP. In at least one embodiment, the epitaxial layers are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH_3$; phosphorus source gas such as $PH_3$; and/or boron source gas such as $B_2H_6$. In some embodiments, two or more layers with different composition (e.g., different P, C, Ge and/or B concentrations) are formed as the source/drain epitaxial layers 50N and 50P, respectively.

Since the n-type epitaxial growth enhancement layer 20N includes P, the n-type epitaxial growth enhancement layer 20N functions as an additional source of P in addition to P source gas for the epitaxial growth. Thus, the size (volume) of the source/drain epitaxial layer 50N can be larger compared with the case where no epitaxial growth enhancement layer 20N is formed. Similarly, the S/D epitaxial layer 50P for p-type FETs includes SiGe, Ge and SiGeB. Since the p-type epitaxial growth enhancement layer 20P includes Ge, the p-type epitaxial growth enhancement layer 20P functions as an additional source of Ge in addition to Ge source gas for the epitaxial growth. Thus, the size (volume) of the source/drain epitaxial layer 50P can be larger compared with the case where no epitaxial growth enhancement layer 20P is formed.

Figure 8A:
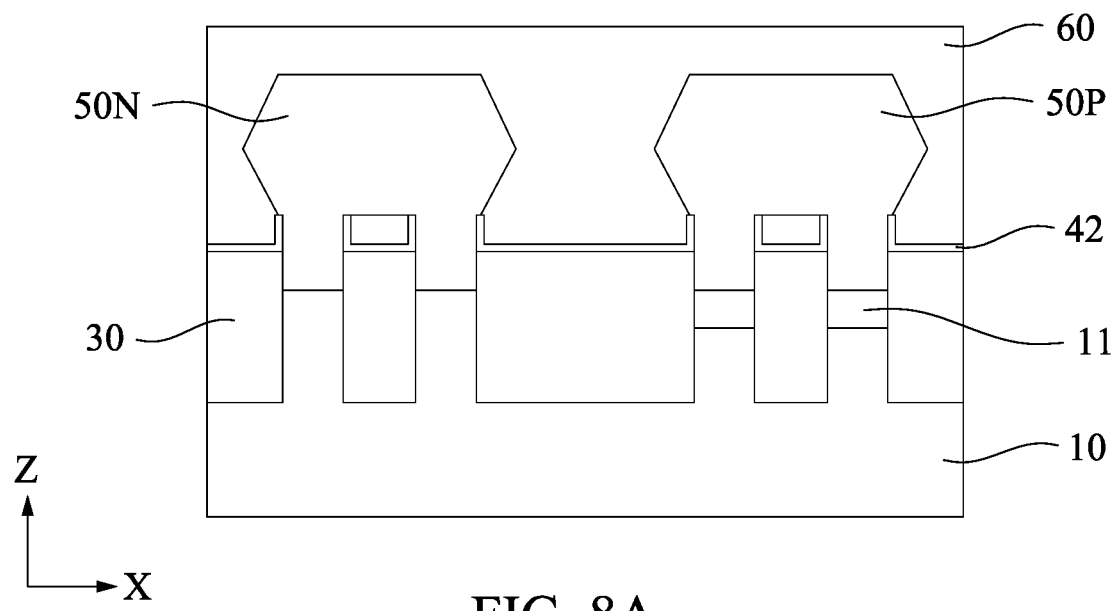
FIGS. 8A and 8B show cross sectional views of one of the stages of a sequential process for manufacturing a FinFET device according to an embodiment of the present disclosure.
Figure 8B:
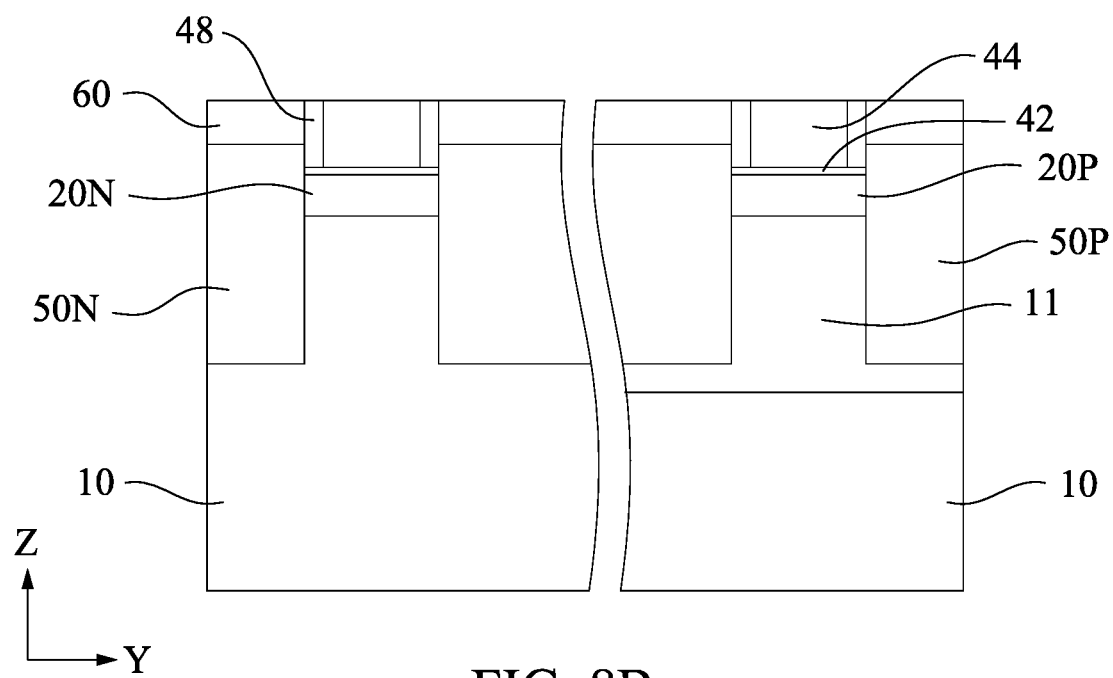

Subsequently, a first interlayer dielectric (ILD) layer 60 is formed over the source/drain epitaxial layers 50N and 50P and the sacrificial gate structures 40. Then, a planarization operation, such as CMP, is performed, so that the top portion of the sacrificial gate electrode layer 44 is exposed, as shown in FIGS. 8A and 8B. FIG. 8A is the cross sectional view corresponding to line X2-X2 of FIG. 5B, and FIG. 8B is the cross sectional view corresponding to line Y1-Y1 of FIG. 5B. The materials for the first ILD layer 60 include compounds comprising Si, O, C and/or H, such as silicon oxide, SiCOH and SiOC. Organic materials, such as polymers, may be used for the first ILD layer 60.

Next, the sacrificial gate electrode layer 44 and sacrificial gate dielectric layer 42 are removed, thereby exposing the fin structures. The first ILD layer 60 protects the S/D structures 50N, 50P during the removal of the sacrificial gate structures. The sacrificial gate structures 40 can be removed using plasma dry etching and/or wet etching. When the sacrificial gate electrode layer 44 is polysilicon and the first ILD layer 60 is silicon oxide, a wet etchant such as a TMAH solution can be used to selectively remove the sacrificial gate electrode layer 44. The sacrificial gate dielectric layer 42 is thereafter removed using plasma dry etching and/or wet etching.

Figure 9A:
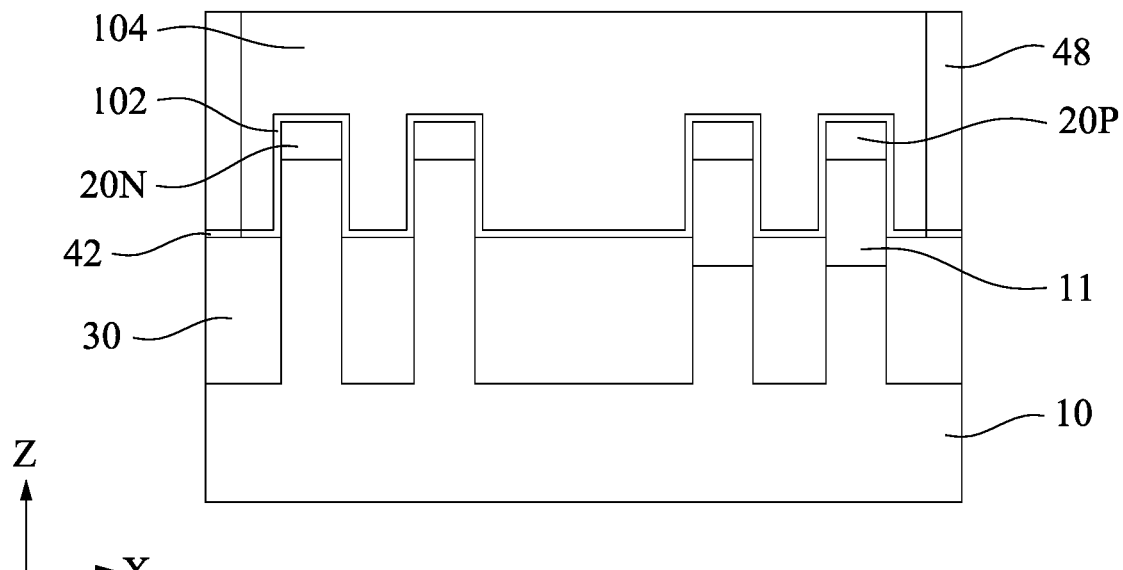
FIGS. 9A and 9B show cross sectional views of one of the stages of a sequential process for manufacturing a FinFET device according to an embodiment of the present disclosure.
Figure 9B:
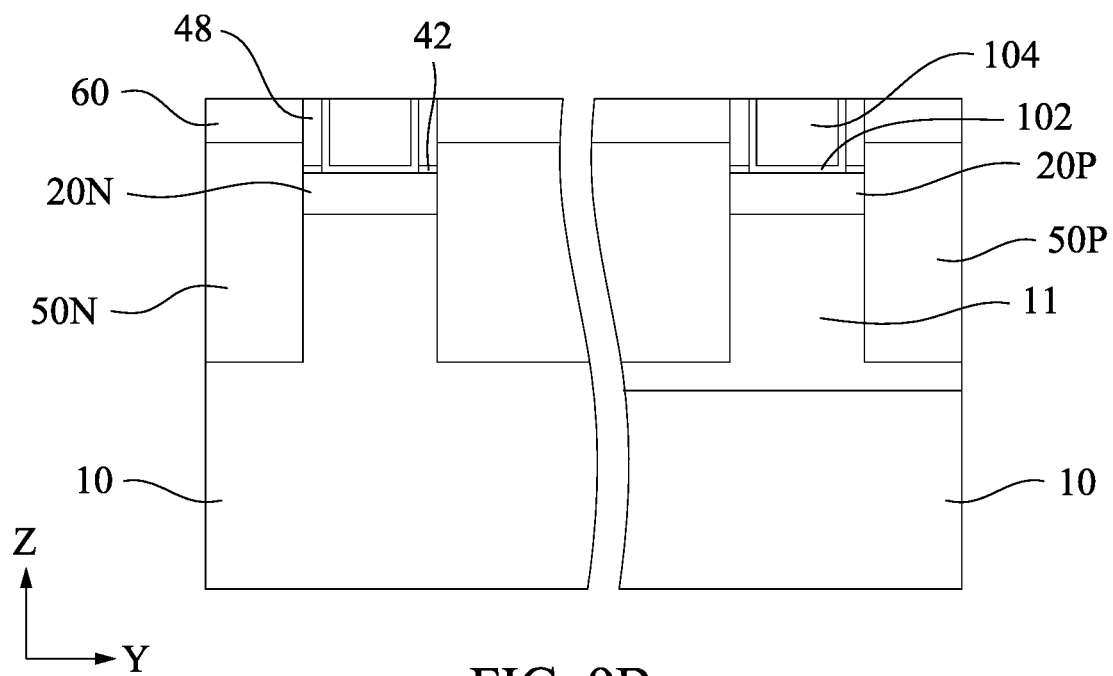

After the sacrificial gate structures are removed, a gate dielectric layer 102 is formed over channel regions (upper portions of the fin structure above the isolation insulating layer 30), and a gate electrode layer 104 is formed on the gate dielectric layer 102, as shown in FIGS. 9A and 9B. FIG. 9A is the cross sectional view corresponding to line X1-X1 of FIG. 5B, and FIG. 9B is the cross sectional view corresponding to line Y1-Y1 of FIG. 5B.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness over each channel layers. The thickness of the gate dielectric layer 102 is in a range from about 1 nm to about 6 nm in one embodiment.

The gate electrode layer 104 is formed on the gate dielectric layer 102. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the first ILD layer 60. The gate dielectric layer and the gate electrode layer formed over the first ILD layer 60 are then planarized by using, for example, CMP, until the top surface of the first ILD layer 60 is revealed. In some embodiments, after the planarization operation, the gate electrode layer 104 is recessed and a cap insulating layer is formed over the recessed gate electrode 104. The cap insulating layer includes one or more layers of a silicon nitride-based material, such as SiN. The cap insulating layer can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

It is understood that the semiconductor device shown in FIGS. 9A and 9B undergoes further CMOS processes to form various features such as contacts/vias, interconnect metal layers, dielectric layers, passivation layers, etc.

Figure 9C:
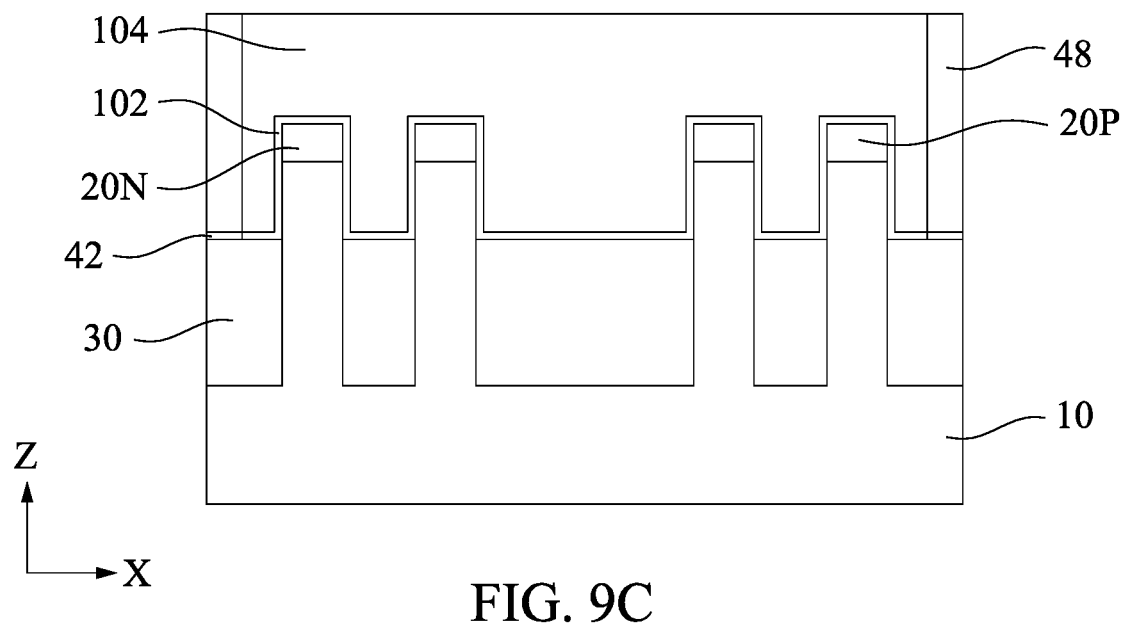
FIGS. 9C and 9D show cross sectional views of one of the stages of a sequential process for manufacturing a FinFET device according to another embodiment of the present disclosure.
Figure 9D:
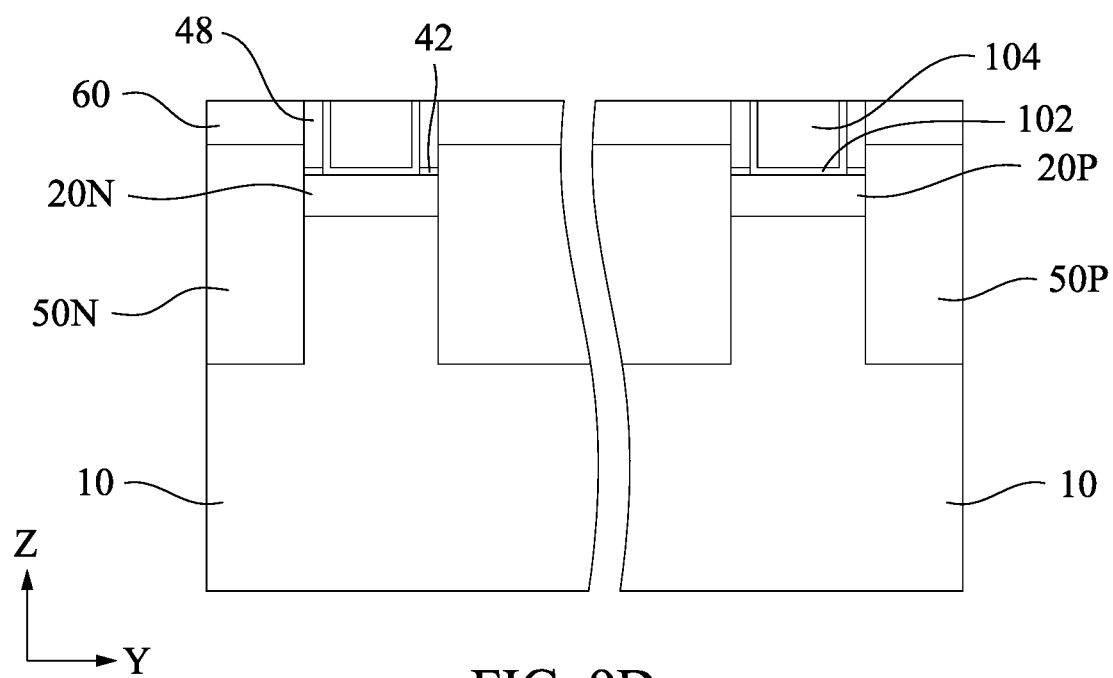

FIGS. 9C and 9D show a semiconductor device according to another embodiment, in which no epitaxial layer 11 is formed. The epitaxial growth enhancement layer 20P is formed on the Si fin structure.

Figure 10A:
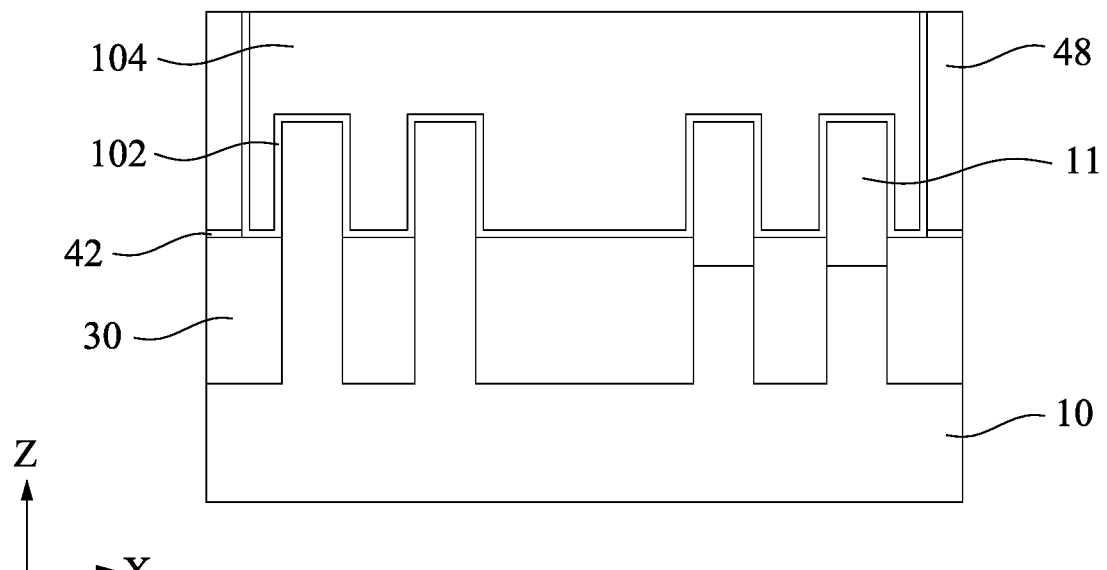
FIGS. 10A and 10B show cross sectional views of one of the stages of a sequential process for manufacturing a FinFET device according to an embodiment of the present disclosure.
Figure 10B:
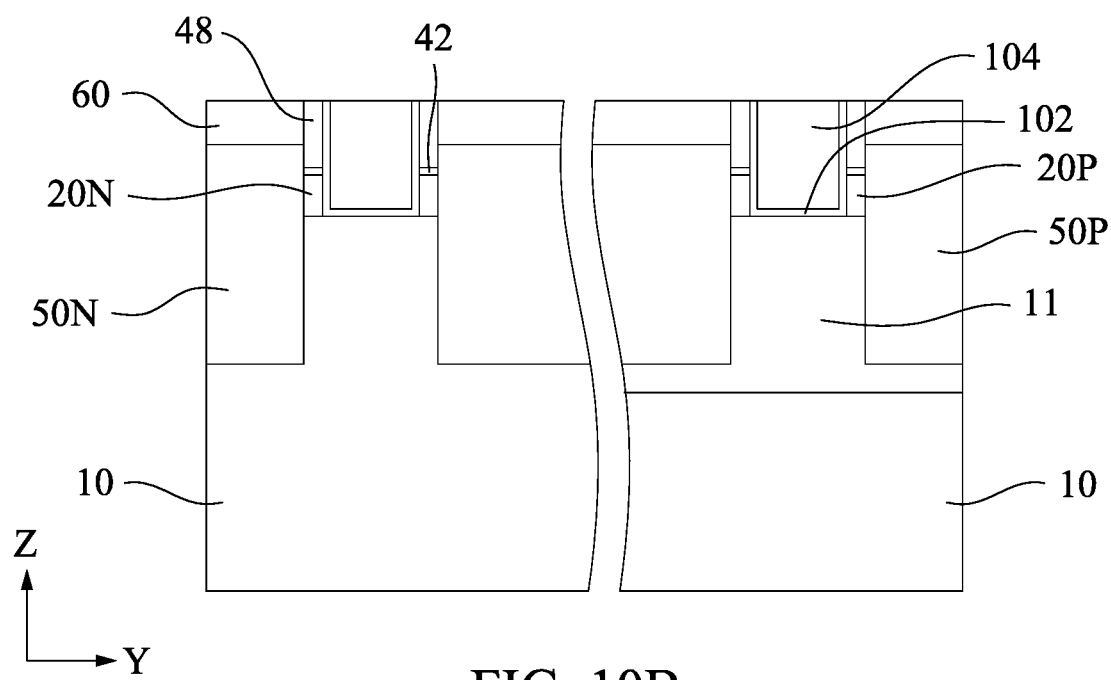

In other embodiments, before the gate dielectric layer 102 is formed, at least one of the epitaxial growth enhancement layers 20N and 20P is removed by a suitable etching operation, and then the gate dielectric layer 102 and the gate electrode layer 104 are formed, as shown in FIGS. 10A and 10B. FIG. 10A is the cross sectional view corresponding to line X1-X1 of FIG. 5B, and FIG. 10B is the cross sectional view corresponding to line Y1-Y1 of FIG. 5B. When the epitaxial growth enhancement layers 20N and 20P are made of oxide material (e.g., SiP oxide, SiGe oxide), the epitaxial growth enhancement layers 20N and 20P are removed. As shown in FIG. 10B, part of the epitaxial growth enhancement layers 20N and/or 20P remains under the sidewall spacers 48 in some embodiments.

Figure 10C:
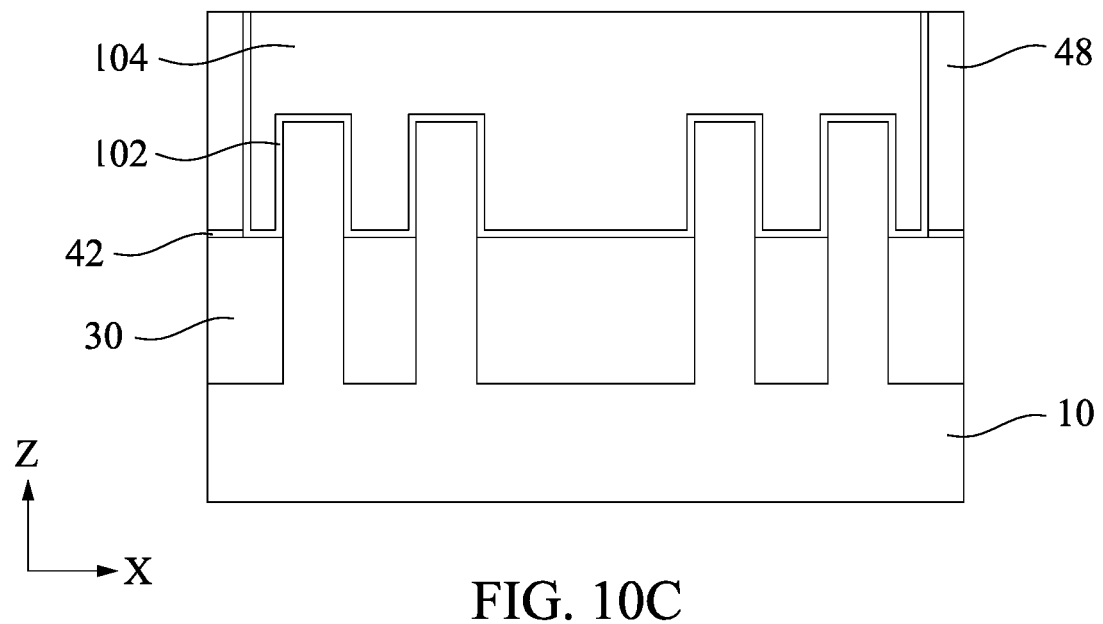
FIGS. 10C and 10D show cross sectional views of one of the stages of a sequential process for manufacturing a FinFET device according to an embodiment of the present disclosure.
Figure 10D:
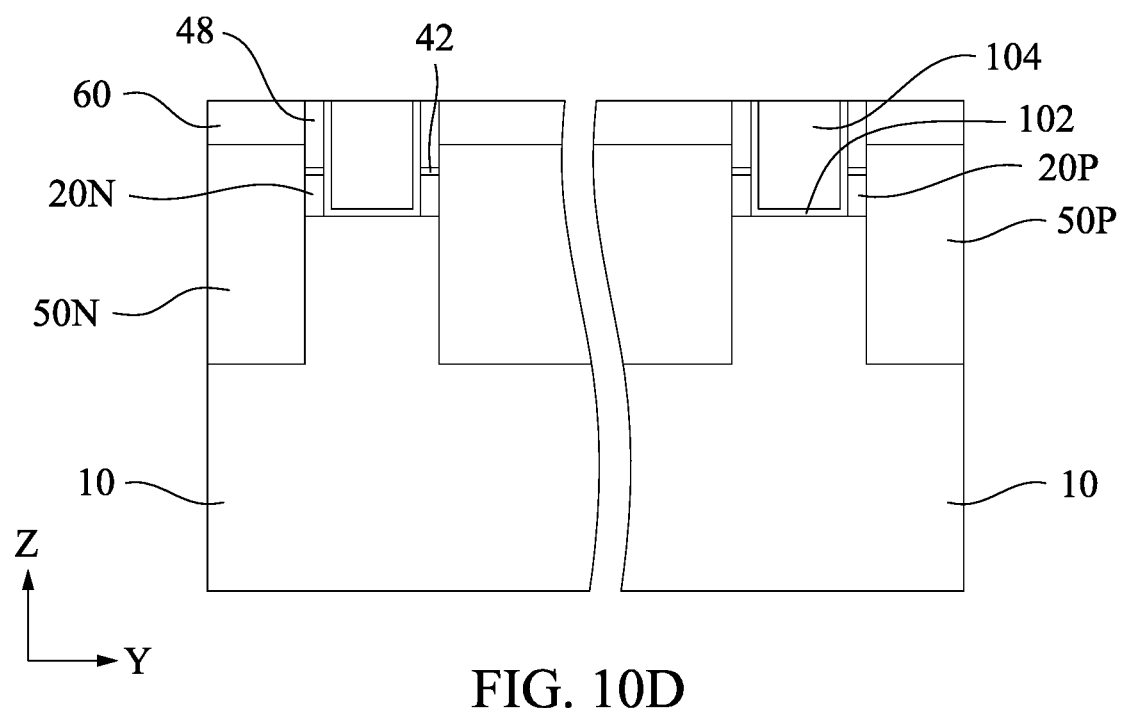

FIGS. 10C and 10D show a semiconductor device according to another embodiment, in which no epitaxial layer 11 is formed. The epitaxial growth enhancement layer 20P is formed on the Si fin structure.

FIGS. 11-17B show exemplary sequential processes for manufacturing the FET device according to an embodiment of the present disclosure. It is understood that additional operations can be provided before, during, and after processes shown by FIGS. 11-17B, and some of the operations described below can be replaced or eliminated, for additional embodiments of the method. The order of the operations/processes may be interchangeable. Materials, configurations, dimensions, processes and/or operations as described with respect to the foregoing embodiments may be employed in the following embodiments, and detailed description thereof may be omitted.

In the embodiments of FIGS. 1A-10B, an epitaxial growth enhancement layer is formed at the top of the fin structures. In the following embodiments, an epitaxial growth enhancement layer is formed at the middle of the fin structures.

Figure 11:
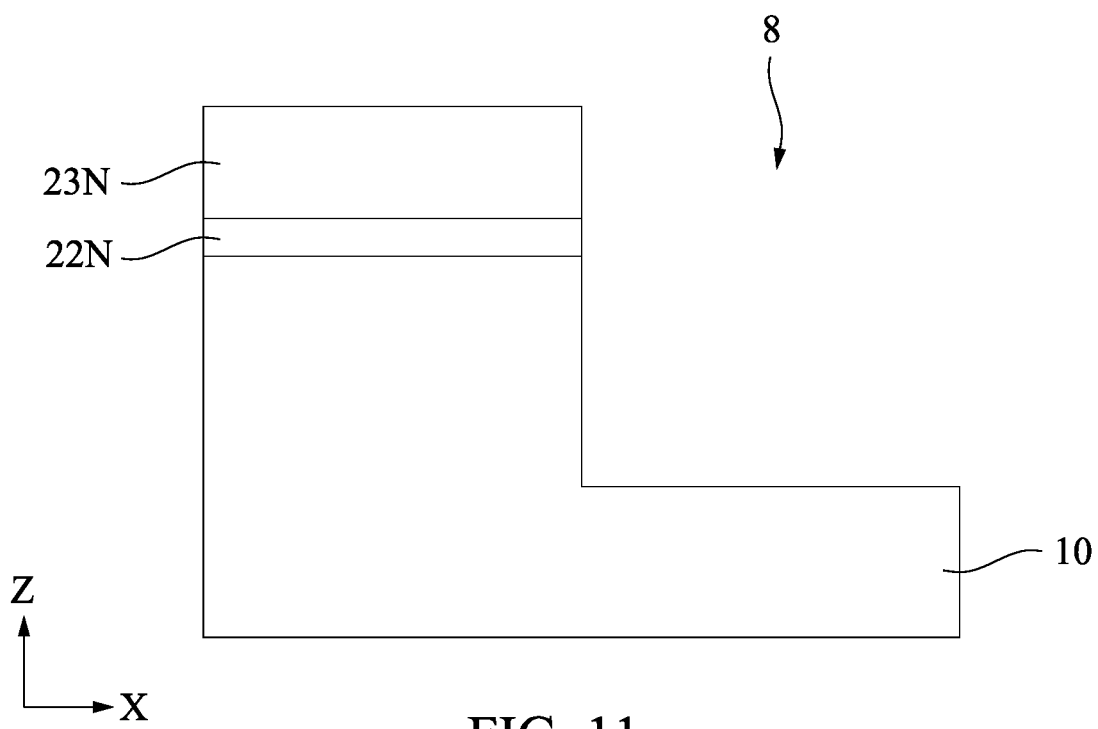
FIG. 11 shows a cross sectional view of one of the stages of a sequential process for manufacturing a FinFET device according to an embodiment of the present disclosure.

As shown in FIG. 11, an n-type epitaxial growth enhancement layer 22N is formed over the substrate 10 and a first semiconductor layer 23N is formed over the n-type epitaxial growth enhancement layer 22N. Then, by using one or more lithography and etching operations, a recess 8 is formed at the p-type region. In some embodiments, the first epitaxial layer 23N is made of the same material as the substrate 10, for example, Si. In other embodiments, the first epitaxial layer 23N is made of a different material or a material having different composition than the substrate 10.

Figure 12:
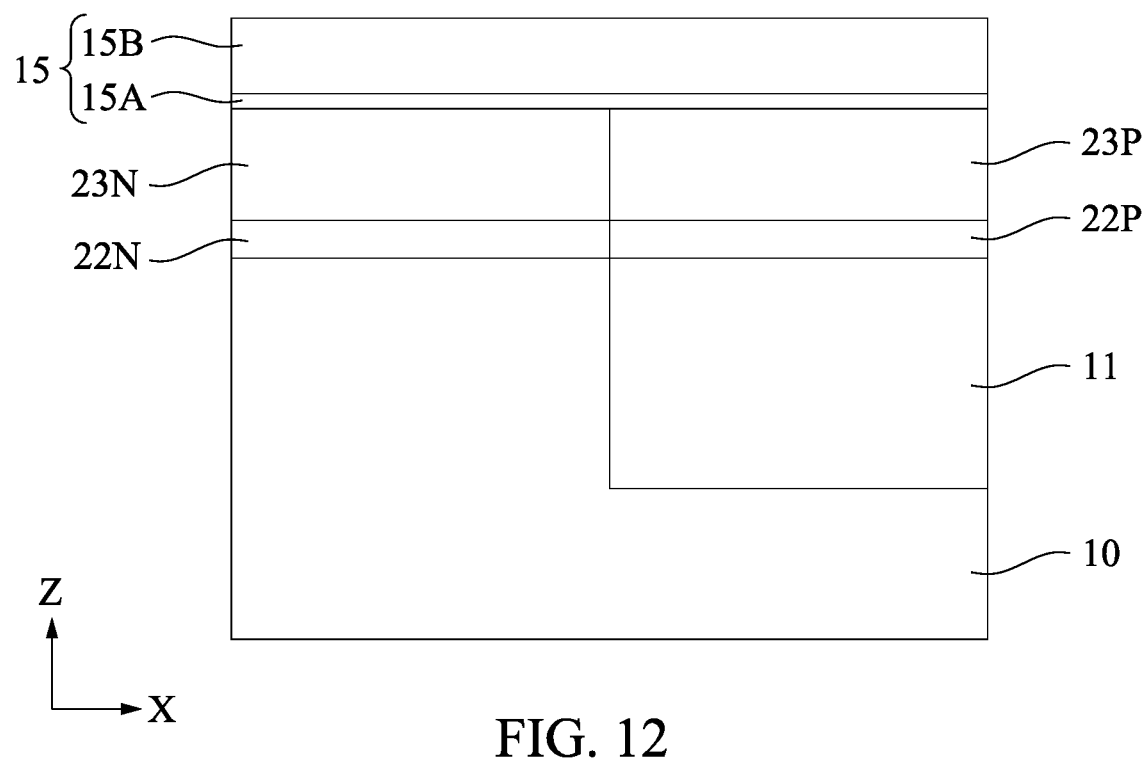
FIG. 12 shows a cross sectional view of one of the stages of a sequential process for manufacturing a FinFET device according to an embodiment of the present disclosure.

Then, as shown in FIG. 12, in the recess 8 of the p-type region, a second epitaxial layer 11, a p-type epitaxial growth enhancement layer 22P and a third epitaxial layer 23P are sequentially formed in the recess 8. In some embodiments, the third epitaxial layer 23P is made of the same material as the second epitaxial layer 11. In other embodiments, the third epitaxial layer 23P is made of a different material or a material having different composition than the second epitaxial layer 11.

The thickness of the n-type and p-type epitaxial growth enhancement layers 22N and 22P is in a range from about 1 nm to about 50 nm in some embodiments, and is in a range from 5 nm to 30 nm in other embodiments. The heights (levels) of the n-type and p-type epitaxial growth enhancement layers 22N and 22P can be the same or different from each other.

Further, a mask layer 15 including a first mask layer 15A and a second mask layer 15B is further formed over the first and third epitaxial layers 23N, 23P, as shown in FIG. 12. In some embodiments, the first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. In other embodiments, the mask layer 15 is a single layer.

In other embodiments, no recess 8 is formed and no second epitaxial layer 11 is formed. In such a case, an epitaxial growth enhancement layer is formed on both n-type region and p-type region over the substrate 10 and an epitaxial layer is formed on the epitaxial growth enhancement layer.

Similar to FIG. 3, the mask layer 15 is patterned, and the first, second and third epitaxial layers, the p-type and n-type epitaxial growth enhancement layers and the substrate 10 are patterned by using the patterned mask layer, thereby the stacked layers are formed into fin structures 12N and 12P (collectively fin structures 12) extending in the Y direction, as shown in FIG. 12.

Figure 14:
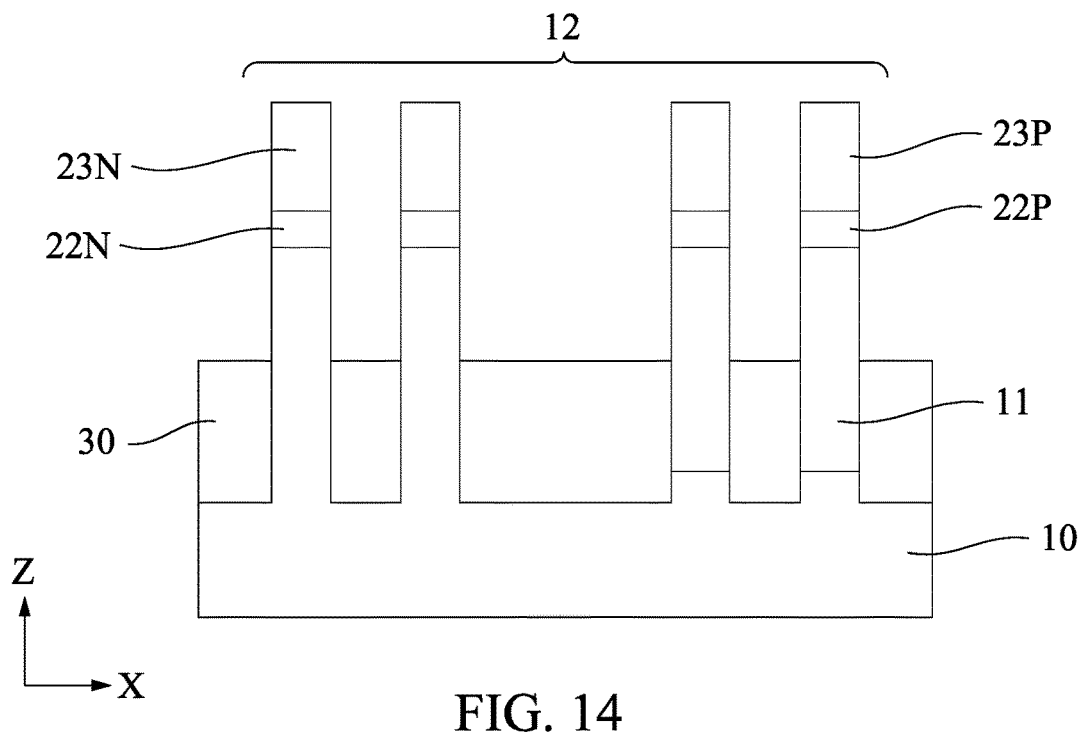
FIG. 14 shows a cross sectional view of one of the stages of a sequential process for manufacturing a FinFET device according to an embodiment of the present disclosure.

After the fin structures 12 are formed, similar to FIG. 4, an isolation insulating layer 30 is formed, as shown in FIG. 14. In some embodiments, the n-type and p-type epitaxial growth enhancement layers 22N and 22P are located above the upper surface of the isolation insulating layer 30.

Figure 15A:
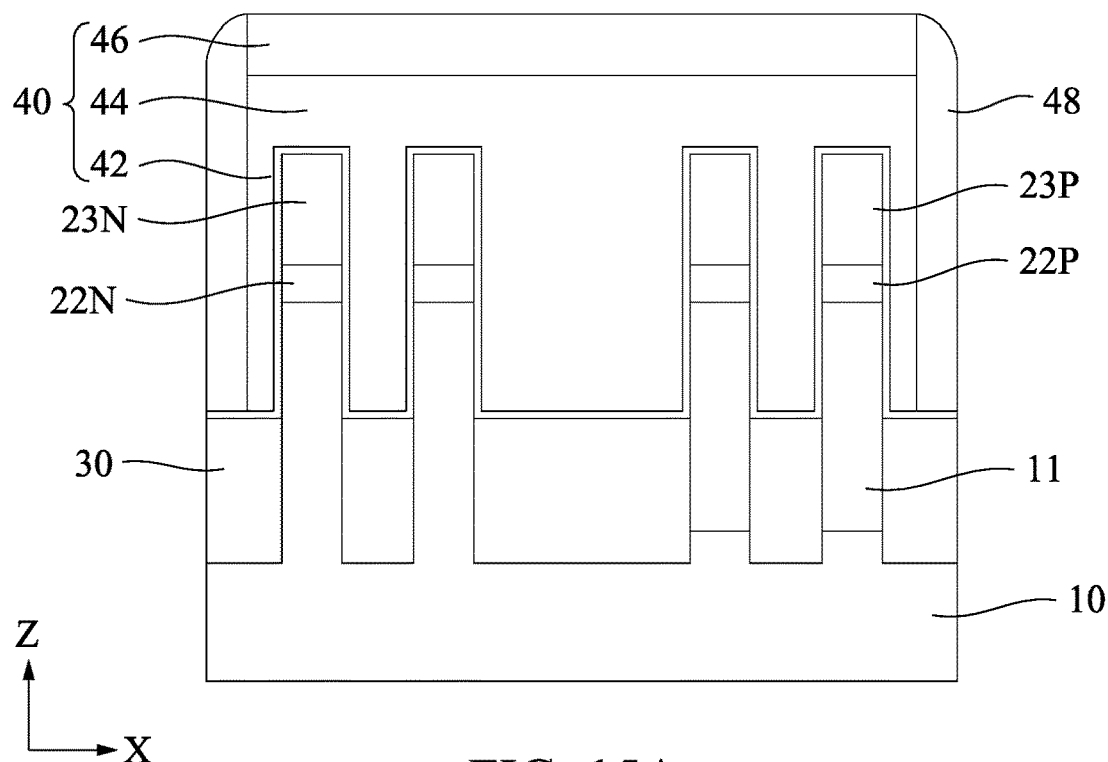
FIGS. 15A and 15B show views of one of the stages of a sequential process for manufacturing a FinFET device according to an embodiment of the present disclosure.
Figure 15B:
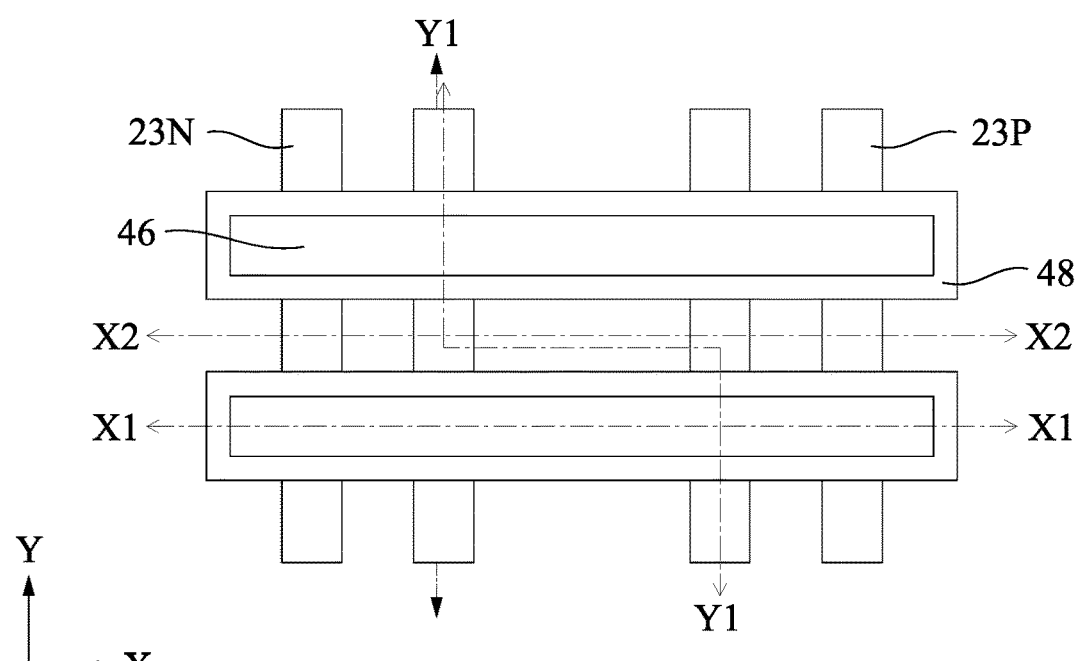

After the isolation insulating layer 30 is formed, similar to FIGS. 5A-5D, sacrificial gate structures 40 are formed over the fin structures, and gate sidewall spacers 48 are formed, as shown in FIGS. 15A and 15B. FIG. 15B is a top (plan) view and FIG. 15A is a cross sectional view corresponding to line X1-X1 of FIG. 15B.

Figure 16A:
FIGS. 16A and 16B show cross sectional views of one of the stages of a sequential process for manufacturing a FinFET device according to an embodiment of the present disclosure.
Figure 16B:
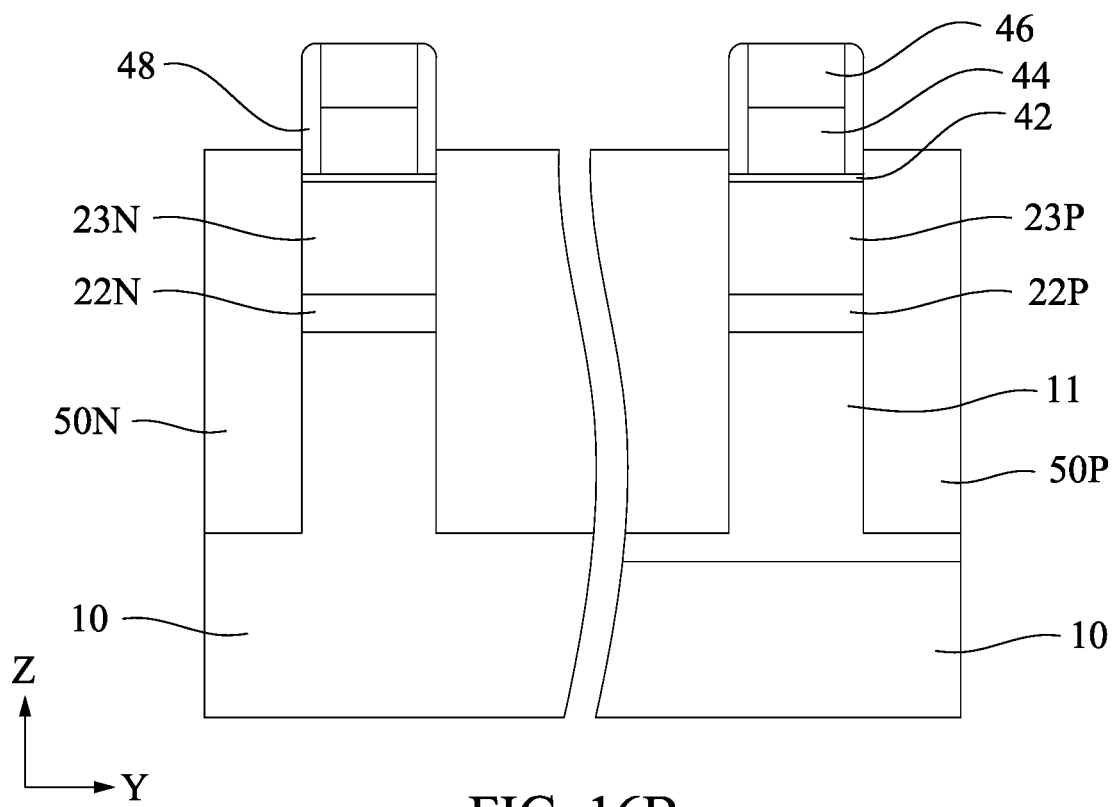

Subsequently, similar to FIGS. 6A-7B, the fin structures of source/drain regions are recessed down below the upper surface of the isolation insulating layer 30 by using dry etching and/or wet etching, and source/drain epitaxial layers 50N and 50P are formed, as shown in FIGS. 16A and 16B. FIG. 16A is the cross sectional view corresponding to line X2-X2 of FIG. 15B, and FIG. 16B is the cross sectional view corresponding to line Y1-Y1 of FIG. 15B.

As shown in FIG. 16B, the side faces of the epitaxial growth enhancement layer 22N (and 22P) is exposed in the source/drain recess, and functions as an additional source of the epitaxial layer 50N (and 50P). Since the n-type epitaxial growth enhancement layer 22N includes P, the n-type epitaxial growth enhancement layer 22N functions as an additional source of P in addition to P source gas for the epitaxial growth. Thus, the size of the source/drain epitaxial layer 50N can be larger compared with the case where no epitaxial growth enhancement layer 20N is formed. Similarly, the S/D epitaxial layer 50P for p-type FETs includes SiGe, Ge and SiGeB. Since the p-type epitaxial growth enhancement layer 22P includes Ge, the p-type epitaxial growth enhancement layer 22P functions as an additional source of Ge in addition to Ge source gas for the epitaxial growth. Thus, the size of the source/drain epitaxial layer 50P can be larger compared with the case where no epitaxial growth enhancement layer 22P is formed.

Figure 17A:
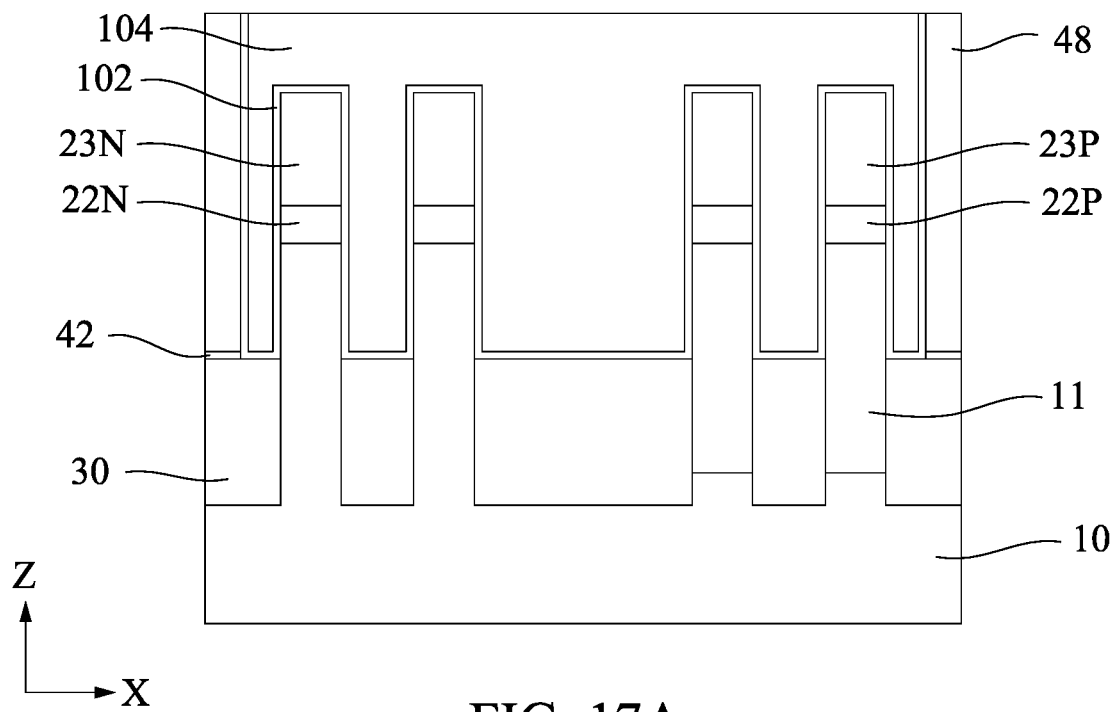
FIGS. 17A and 17B show cross sectional views of one of the stages of a sequential process for manufacturing a FinFET device according to an embodiment of the present disclosure.
Figure 17B:
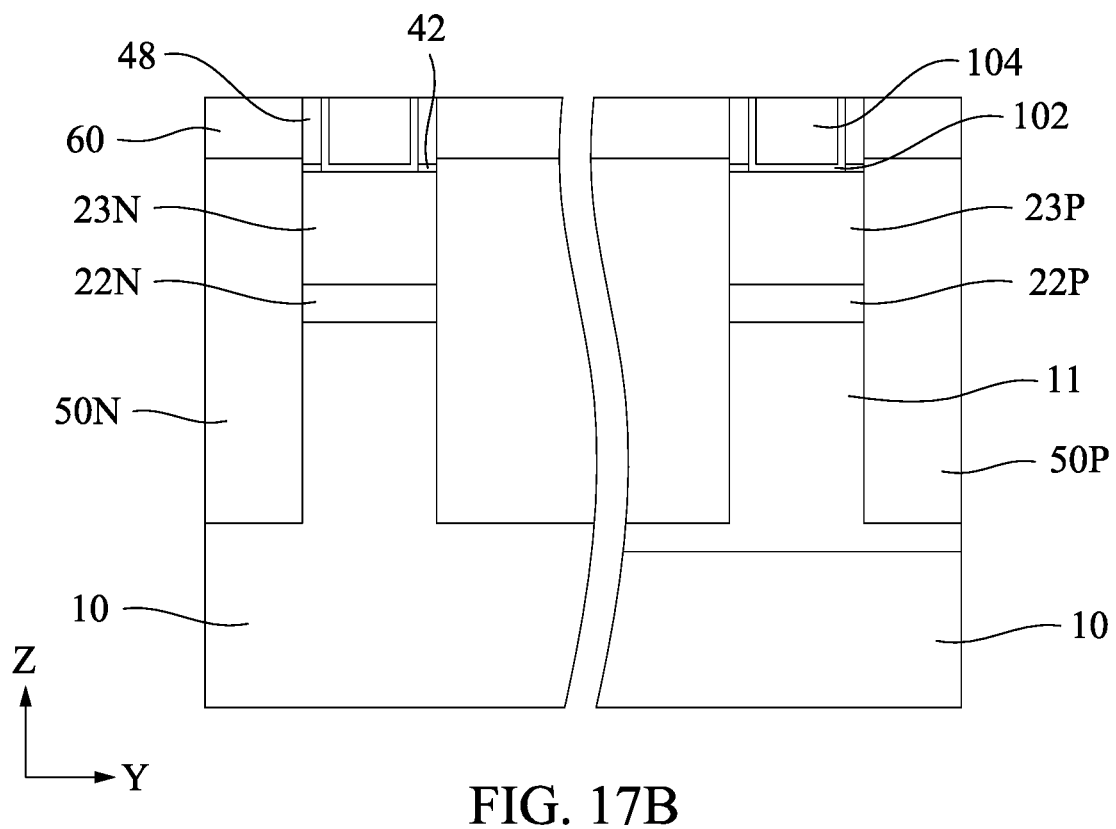

Subsequently, similar to FIGS. 8A-9B, a first interlayer dielectric (ILD) layer 60 is formed over the source/drain epitaxial layers 50N and 50P and the sacrificial gate structures 40. Then, a planarization operation, such as CMP, is performed, so that the top portion of the sacrificial gate electrode layer 44 is exposed. Then, the sacrificial gate electrode layer 44 and sacrificial gate dielectric layer 42 are removed, thereby exposing the fin structures. After the sacrificial gate structures are removed, a gate dielectric layer 102 is formed over channel regions, and a gate electrode layer 104 is formed on the gate dielectric layer 102, as shown in FIGS. 17A and 17B. FIG. 17A is the cross sectional view corresponding to line X1-X1 of FIG. 15B, and FIG. 17B is the cross sectional view corresponding to line Y1-Y1 of FIG. 15B. When the epitaxial growth enhancement layers are made of semiconductor material, the epitaxial growth enhancement layers are not removed and the gate dielectric layer 102 covers the side faces of the epitaxial growth enhancement layers in some embodiments.

It is understood that the semiconductor device shown in FIGS. 17A and 17B undergoes further CMOS processes to form various features such as contacts/vias, interconnect metal layers, dielectric layers, passivation layers, etc.

Figure 17C:
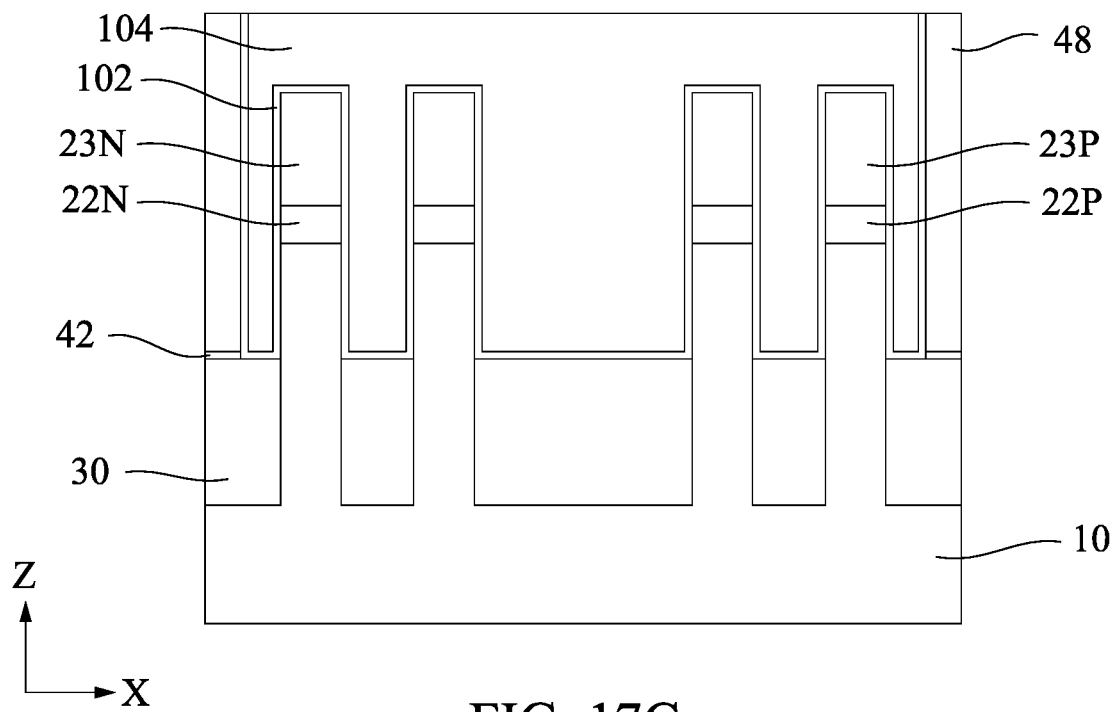
FIGS. 17C and 17D show cross sectional views of one of the stages of a sequential process for manufacturing a FinFET device according to another embodiment of the present disclosure.
Figure 17D:
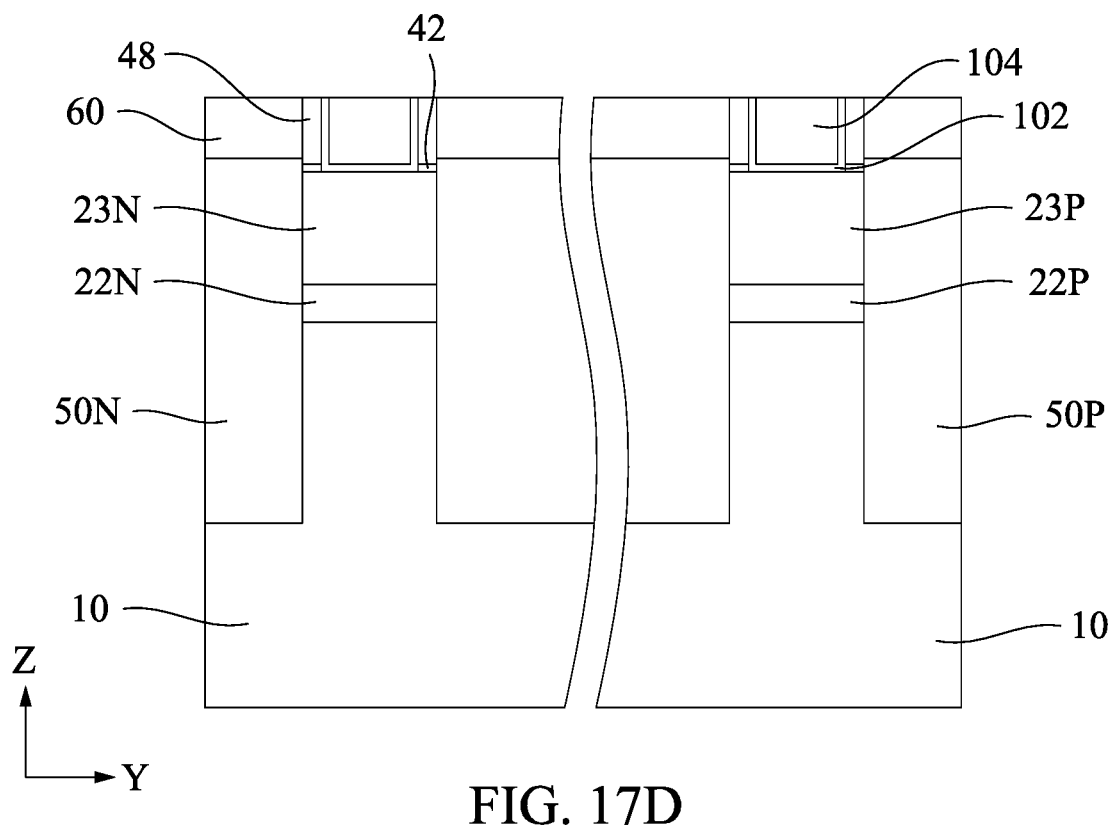

FIGS. 17C and 17D show a semiconductor device according to another embodiment, in which no epitaxial layer 11 is formed. The epitaxial growth enhancement layer 22P is formed in the Si fin structure.

Figure 18A:
FIGS. 18A and 18B show cross sectional views of one of the stages of a sequential process for manufacturing a FinFET device according to an embodiment of the present disclosure.
Figure 18B:
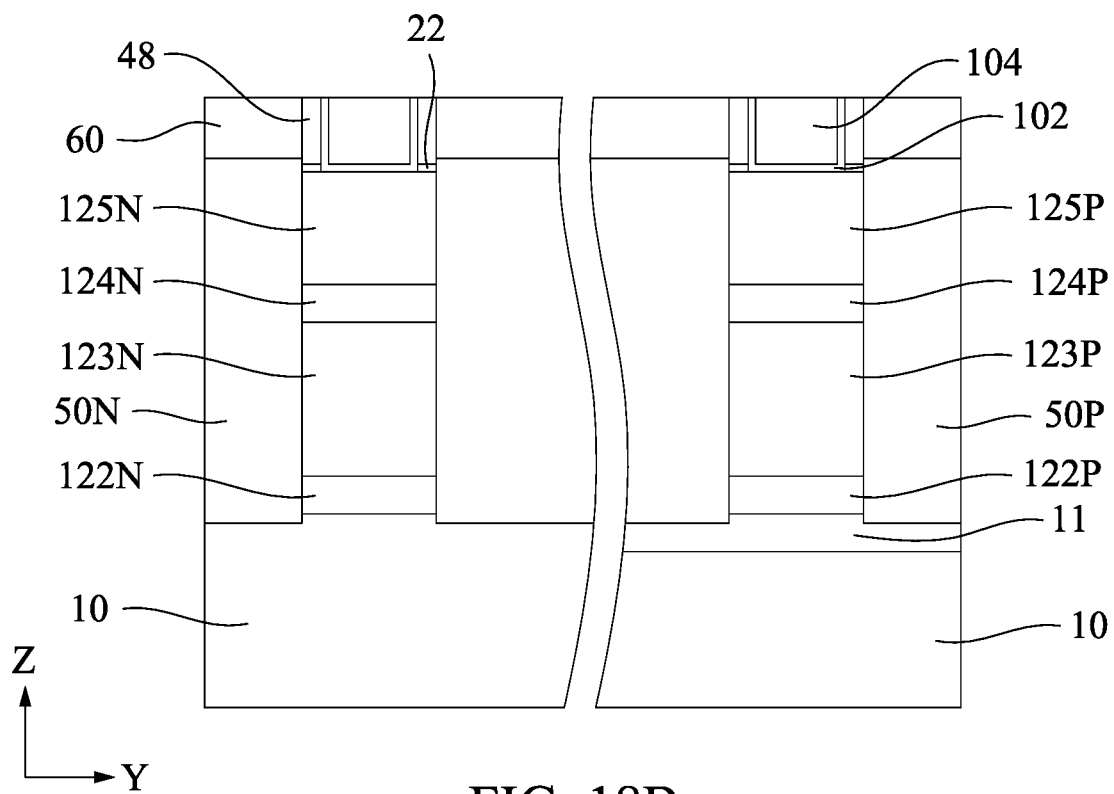

FIGS. 18A and 18B show cross sectional views of one of the stages of a sequential process for manufacturing a FinFET device according to an embodiment of the present disclosure. Materials, configurations, dimensions, processes and/or operations as described with respect to the foregoing embodiments may be employed in the following embodiments, and detailed description thereof may be omitted. FIG. 18A is the cross sectional view corresponding to line X1-X1 of FIG. 15B, and FIG. 18B is the cross sectional view corresponding to line Y1-Y1 of FIG. 15B.

As shown in FIGS. 18A and 18B, two epitaxial growth enhancement layers are disposed in the fin structures for at least one of an n-type FET and a p-type FET. In some embodiments, the fin structure of the n-type FET includes a first n-type epitaxial growth enhancement layer 122N, a first epitaxial layer 123N, a second n-type epitaxial growth enhancement layer 124N and a second epitaxial layer 125N sequentially stacked. The fin structure for the n-type FET can be formed by stacking the semiconductor materials corresponding to respective layers and patterning by one or more lithography and etching operations. In some embodiments, the first and second n-type epitaxial growth enhancement layers are made of the same materials (e.g., SiP), or made of different materials or materials having different composition from each other in other embodiments. The first and second epitaxial layers 123N and 125N are made of the same materials (e.g., Si), or made of different materials or materials having different composition from each other in other embodiments. Similarly, in some embodiments, the fin structure of the p-type FET includes a first p-type epitaxial growth enhancement layer 122P, a third epitaxial layer 123P, a second p-type epitaxial growth enhancement layer 124P and a fourth epitaxial layer 125P sequentially stacked. The fin structure for the p-type FET can be formed by stacking the semiconductor materials corresponding to respective layers and patterning by one or more lithography and etching operations. In some embodiments, the first and second p-type epitaxial growth enhancement layers are made of the same materials (e.g., SiGe), or made of different materials or materials having different composition from each other in other embodiments. The third and fourth epitaxial layers 123P and 125P are made of the same materials (e.g., SiGe), or made of different materials or materials having different composition from each other in other embodiments. In some embodiments, the Ge concentration of the first and second p-type epitaxial growth enhancement layers is greater than the Ge concentration of the epitaxial layer 11 and the third and fourth epitaxial layers, before and/or after the source/drain epitaxial layer 50P is formed.

In some embodiments, the first n-type and first p-type epitaxial growth enhancement layers 122N and 122P are located below the upper surface of the isolation insulating layer 30 and the second n-type and second p-type epitaxial growth enhancement layers 124N and 124P are located above the upper surface of the isolation insulating layer 30, as shown in FIG. 18A.

As shown in FIG. 18B, the side faces of the first and second n-type epitaxial growth enhancement layers 122N and 124N is exposed in the source/drain recess, and functions as an additional source of the epitaxial layer 50N. Thus, the size of the source/drain epitaxial layer 50N can be larger compared with the case where no epitaxial growth enhancement layer is formed. Similarly, since the first and second p-type epitaxial growth enhancement layer 122P and 124P includes Ge, the p-type epitaxial growth enhancement layers functions as an additional source of Ge in addition to Ge source gas for the epitaxial growth. Thus, the size of the source/drain epitaxial layer 50P can be larger compared with the case where no epitaxial growth enhancement layer is formed.

Figure 18C:
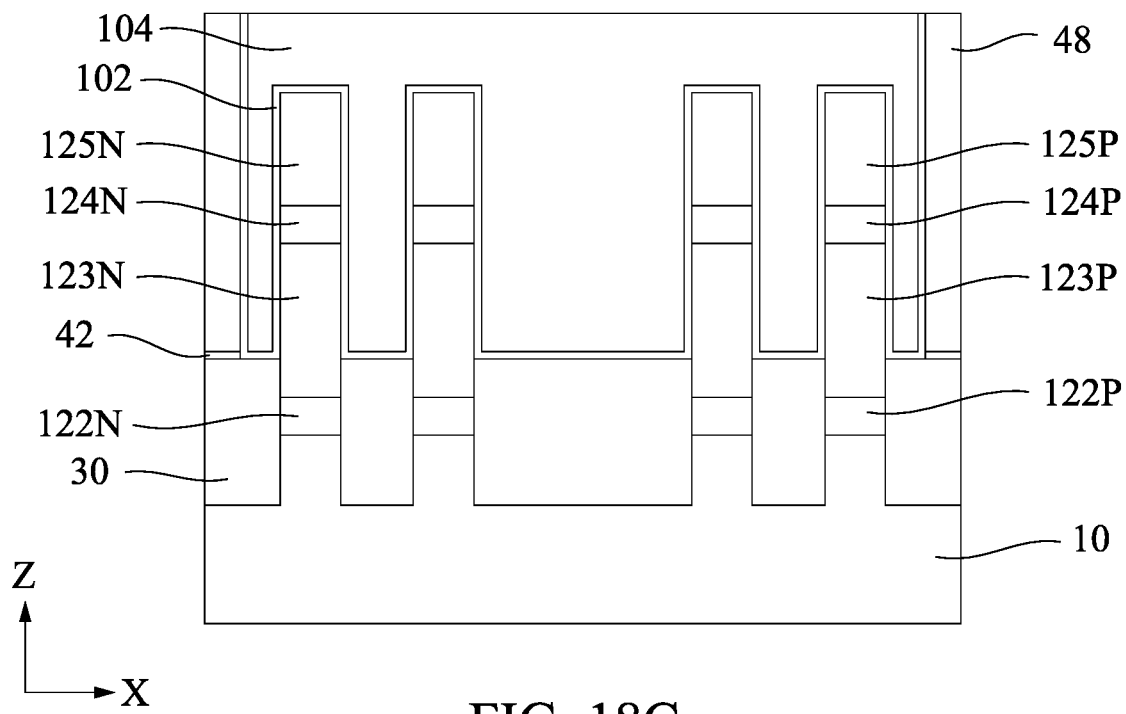
FIGS. 18C and 18D show cross sectional views of one of the stages of a sequential process for manufacturing a FinFET device according to another embodiment of the present disclosure.
Figure 18D:
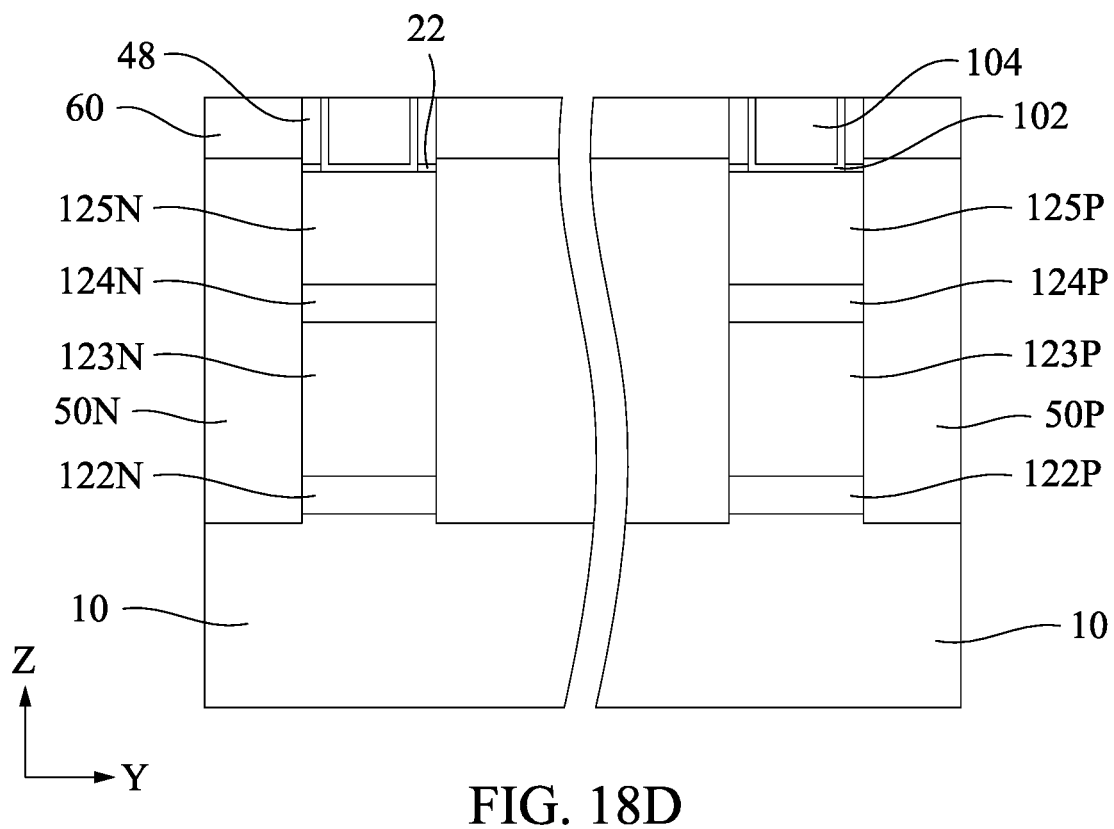

FIGS. 18C and 18D show a semiconductor device according to another embodiment, in which no epitaxial layer 11 is formed. The epitaxial growth enhancement layers 122P and 124P are formed in the Si fin structure.

Figure 19A:
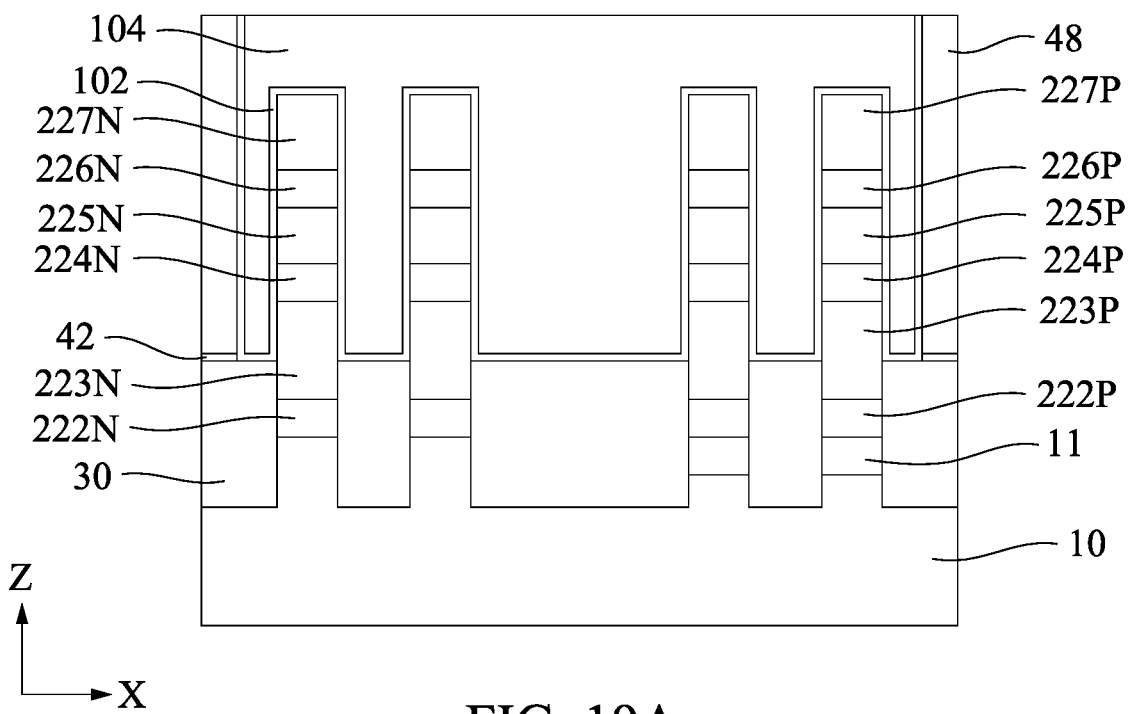
FIGS. 19A and 19B show cross sectional views of one of the stages of a sequential process for manufacturing a FinFET device according to an embodiment of the present disclosure.
Figure 19B:
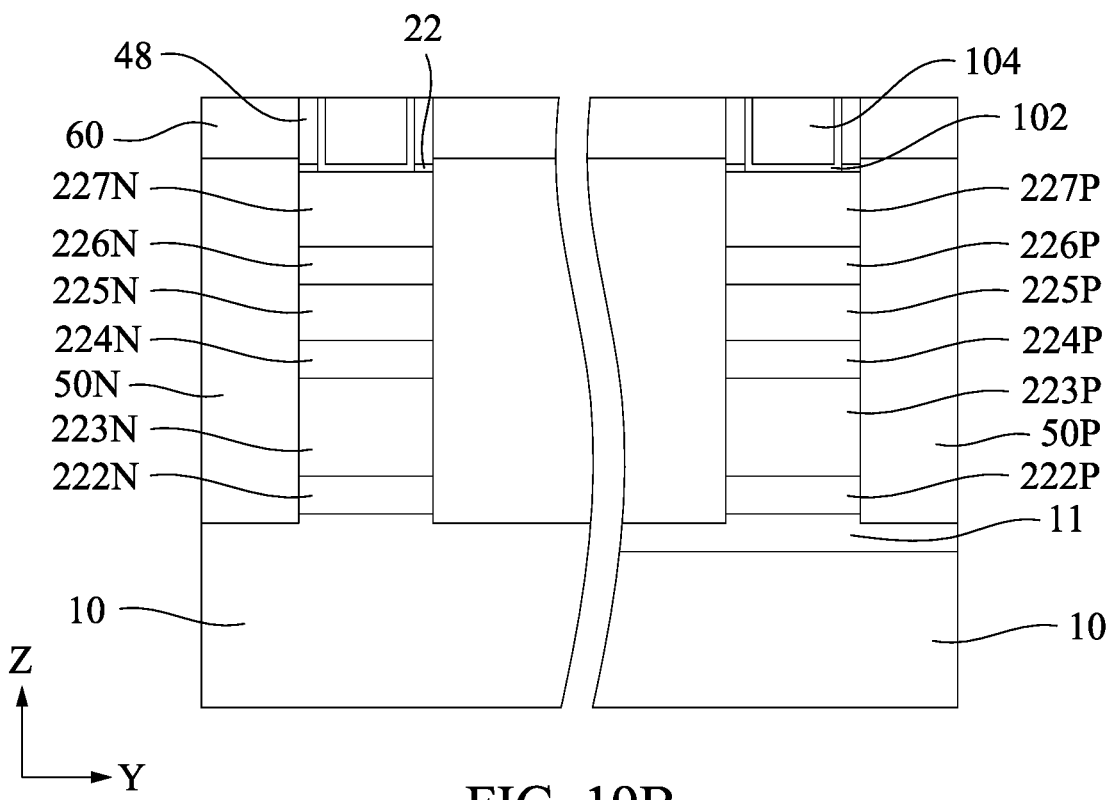

FIGS. 19A and 19B show cross sectional views of one of the stages of a sequential process for manufacturing a FinFET device according to an embodiment of the present disclosure. Materials, configurations, dimensions, processes and/or operations as described with respect to the foregoing embodiments may be employed in the following embodiments, and detailed description thereof may be omitted. FIG. 19A is the cross sectional view corresponding to line X1-X1 of FIG. 15B, and FIG. 19B is the cross sectional view corresponding to line Y1-Y1 of FIG. 15B.

As shown in FIGS. 19A and 19B, three epitaxial growth enhancement layers are disposed in the fin structures for at least one of an n-type FET and a p-type FET. In some embodiments, the fin structure of the n-type FET includes a first n-type epitaxial growth enhancement layer 222N, a first epitaxial layer 223N, a second n-type epitaxial growth enhancement layer 224N, a second epitaxial layer 225N, a third n-type epitaxial growth enhancement layer 226N and a third epitaxial layer 227N sequentially stacked. The fin structure for the n-type FET can be formed by stacking the semiconductor materials corresponding to respective layers and patterning by one or more lithography and etching operations. In some embodiments, the first, second and third n-type epitaxial growth enhancement layers are made of the same materials (e.g., SiP), or made of different materials or materials having different composition from each other in other embodiments. The first, second and third epitaxial layers 223N, 225N and 227N are made of the same materials (e.g., Si), or made of different materials or materials having different composition from each other in other embodiments. Similarly, in some embodiments, the fin structure of the p-type FET includes a first p-type epitaxial growth enhancement layer 222P, a fourth epitaxial layer 223P, a second p-type epitaxial growth enhancement layer 224P, a fifth epitaxial layer 225P, a third p-type epitaxial growth enhancement layer 226P and a sixth epitaxial layer 227P sequentially stacked. The fin structure for the p-type FET can be formed by stacking the semiconductor materials corresponding to respective layers and patterning by one or more lithography and etching operations. In some embodiments, the first, second and third p-type epitaxial growth enhancement layers are made of the same materials (e.g., SiGe), or made of different materials or materials having different composition from each other in other embodiments. The fourth, fifth and sixth epitaxial layers 223P, 225P and 227P are made of the same materials (e.g., SiGe), or made of different materials or materials having different composition from each other in other embodiments. In some embodiments, the Ge concentration of the first, second and third p-type epitaxial growth enhancement layers is greater than the Ge concentration of the epitaxial layer 11 and the fourth, fifth and sixth epitaxial layers, before and/or after the source/drain epitaxial layer 50P is formed.

In some embodiments, the first n-type and first p-type epitaxial growth enhancement layers 222N and 222P are located below the upper surface of the isolation insulating layer 30 and the second and third n-type and p-type epitaxial growth enhancement layers 224N, 226N, 224P and 226P are located above the upper surface of the isolation insulating layer 30, as shown in FIG. 19A.

Figure 19C:
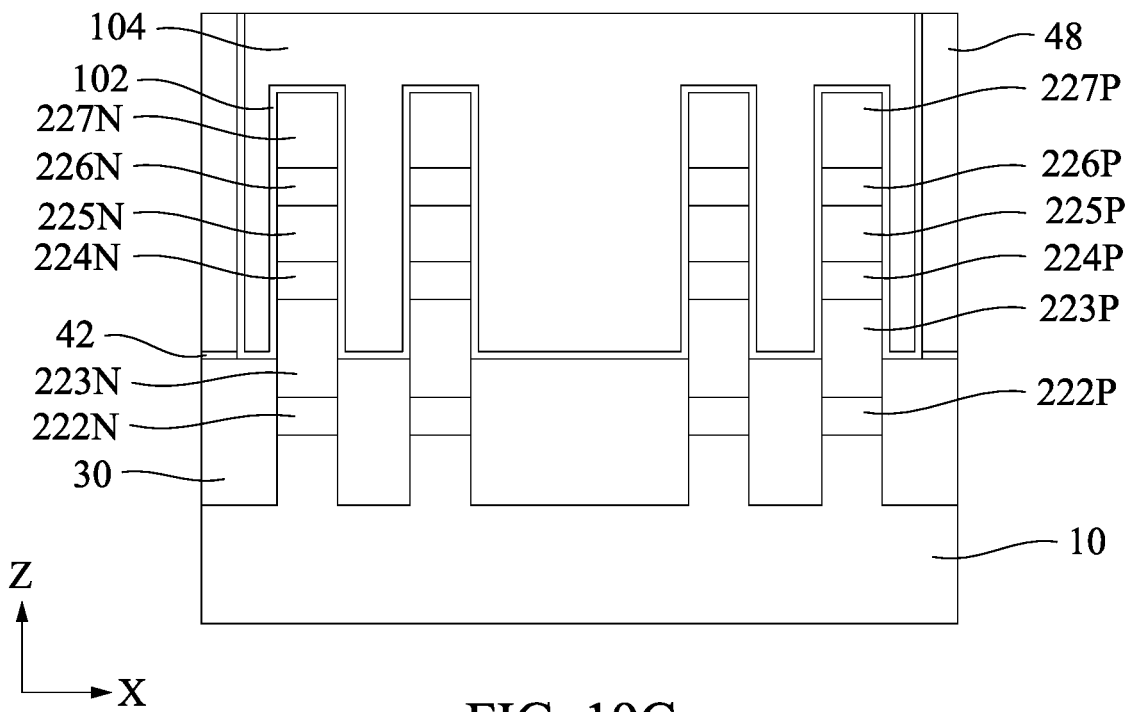
FIGS. 19C and 19D show cross sectional views of one of the stages of a sequential process for manufacturing a FinFET device according to another embodiment of the present disclosure.
Figure 19D:
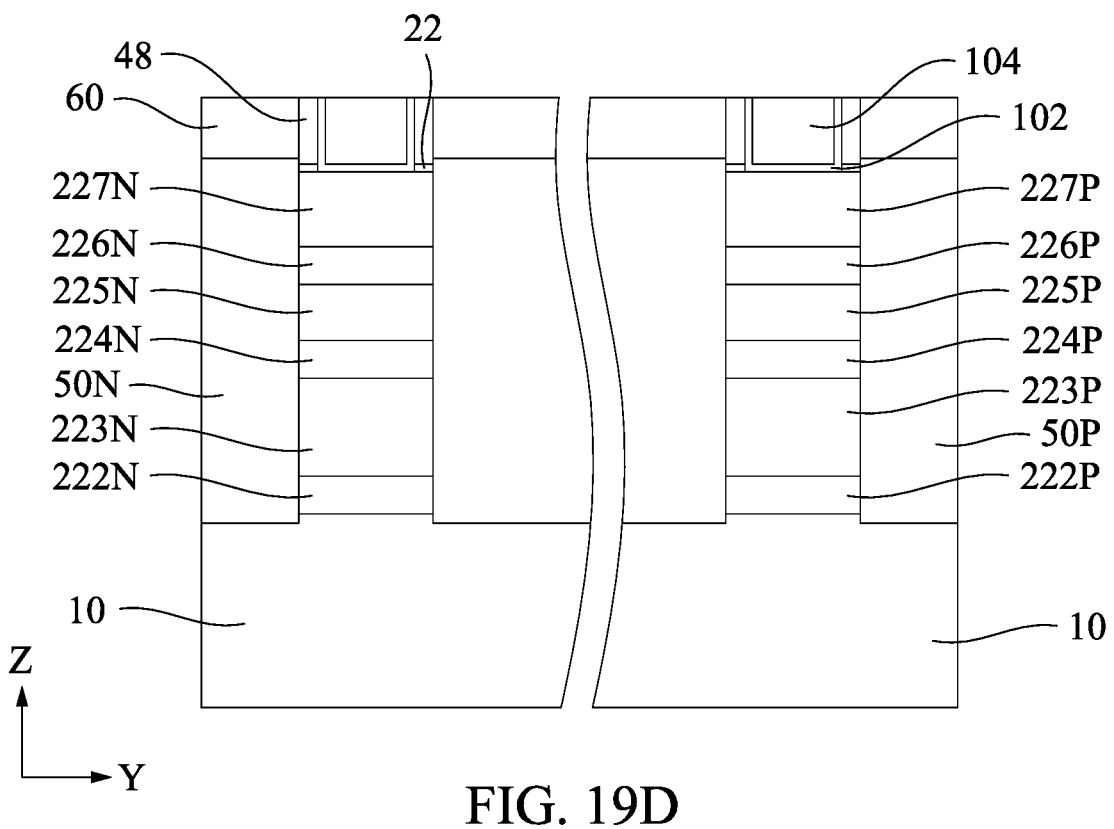

FIGS. 19C and 19D show a semiconductor device according to another embodiment, in which no epitaxial layer 11 is formed. The epitaxial growth enhancement layers 222P, 224P and 226P are formed in the Si fin structure.

Figure 20A:
FIGS. 20A and 20B show cross sectional views of one of the stages of a sequential process for manufacturing a FinFET device according to an embodiment of the present disclosure.
Figure 20B:
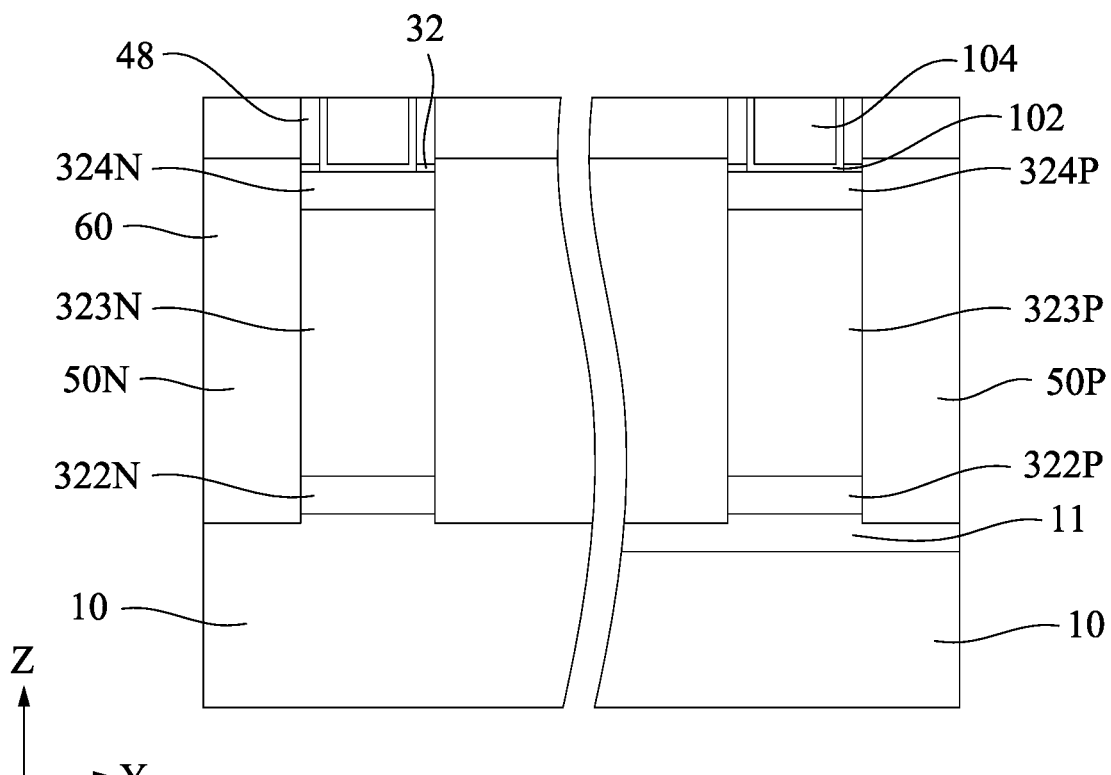

FIGS. 20A and 20B show cross sectional views of one of the stages of a sequential process for manufacturing a FinFET device according to an embodiment of the present disclosure. Materials, configurations, dimensions, processes and/or operations as described with respect to the foregoing embodiments may be employed in the following embodiments, and detailed description thereof may be omitted. FIG. 20A is the cross sectional view corresponding to line X1-X1 of FIG. 15B, and FIG. 20B is the cross sectional view corresponding to line Y1-Y1 of FIG. 15B.

As shown in FIGS. 20A and 20B, two epitaxial growth enhancement layers are disposed in the fin structures for at least one of an n-type FET and a p-type FET. In some embodiments, the fin structure of the n-type FET includes a first n-type epitaxial growth enhancement layer 322N, a first epitaxial layer 323N and a second n-type epitaxial growth enhancement layer 324N sequentially stacked. The fin structure for the n-type FET can be formed by stacking the semiconductor materials corresponding to respective layers and patterning by one or more lithography and etching operations. In some embodiments, the first and second n-type epitaxial growth enhancement layers are made of the same materials (e.g., SiP), or made of different materials or materials having different composition from each other in other embodiments. The first epitaxial layer 323N is made of the same materials (e.g., Si) as the substrate 10 in some embodiments. Similarly, in some embodiments, the fin structure of the p-type FET includes a first p-type epitaxial growth enhancement layer 322P, a second epitaxial layer 323P and a second p-type epitaxial growth enhancement layer 324P sequentially stacked. The fin structure for the p-type FET can be formed by stacking the semiconductor materials corresponding to respective layers and patterning by one or more lithography and etching operations. In some embodiments, the first and second p-type epitaxial growth enhancement layers are made of the same materials (e.g., SiGe), or made of different materials or materials having different composition from each other in other embodiments. The second epitaxial layer 323P is are made of the same material (e.g., SiGe) as the epitaxial layer 11, or made of different materials or materials having different composition from each other in other embodiments. In some embodiments, the Ge concentration of the first and second p-type epitaxial growth enhancement layers is greater than the Ge concentration of the epitaxial layer 11 and the third epitaxial layer, before and/or after the source/drain epitaxial layer 50P is formed.

In some embodiments, the first n-type and first p-type epitaxial growth enhancement layers 322N and 322P are located below the upper surface of the isolation insulating layer 30 and the second n-type and second p-type epitaxial growth enhancement layers 324N and 324P are located above the upper surface of the isolation insulating layer 30, as shown in FIG. 20A.

Figure 20C:
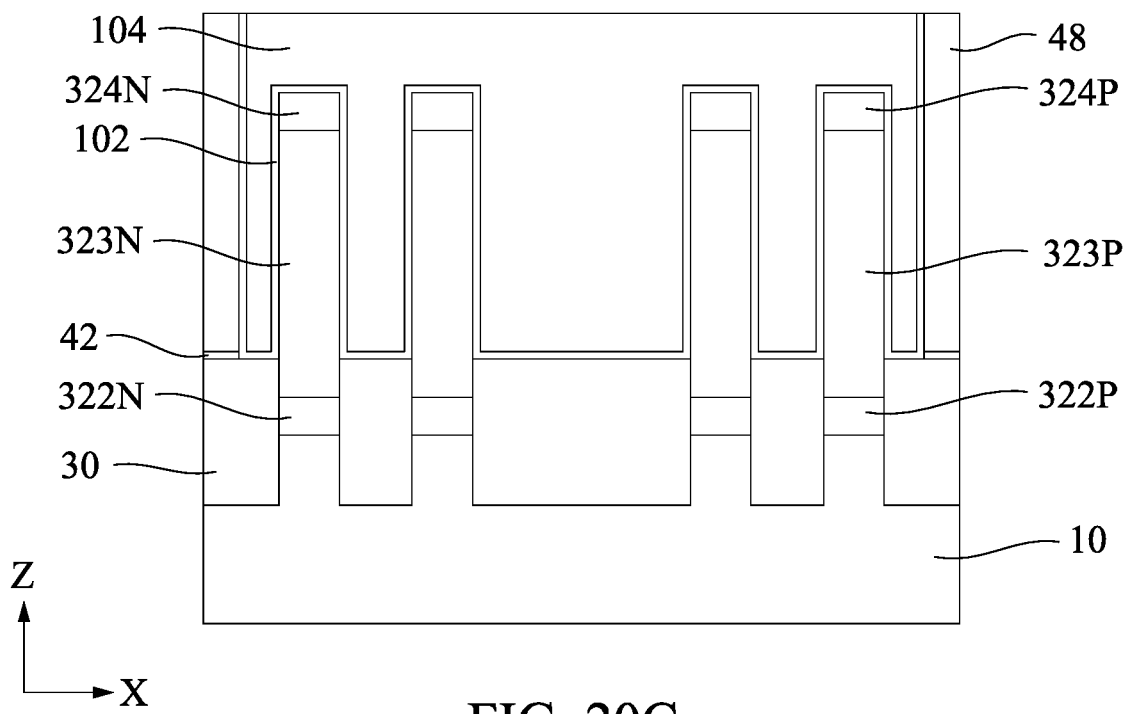
FIGS. 20C and 20D show cross sectional views of one of the stages of a sequential process for manufacturing a FinFET device according to another embodiment of the present disclosure.
Figure 20D:
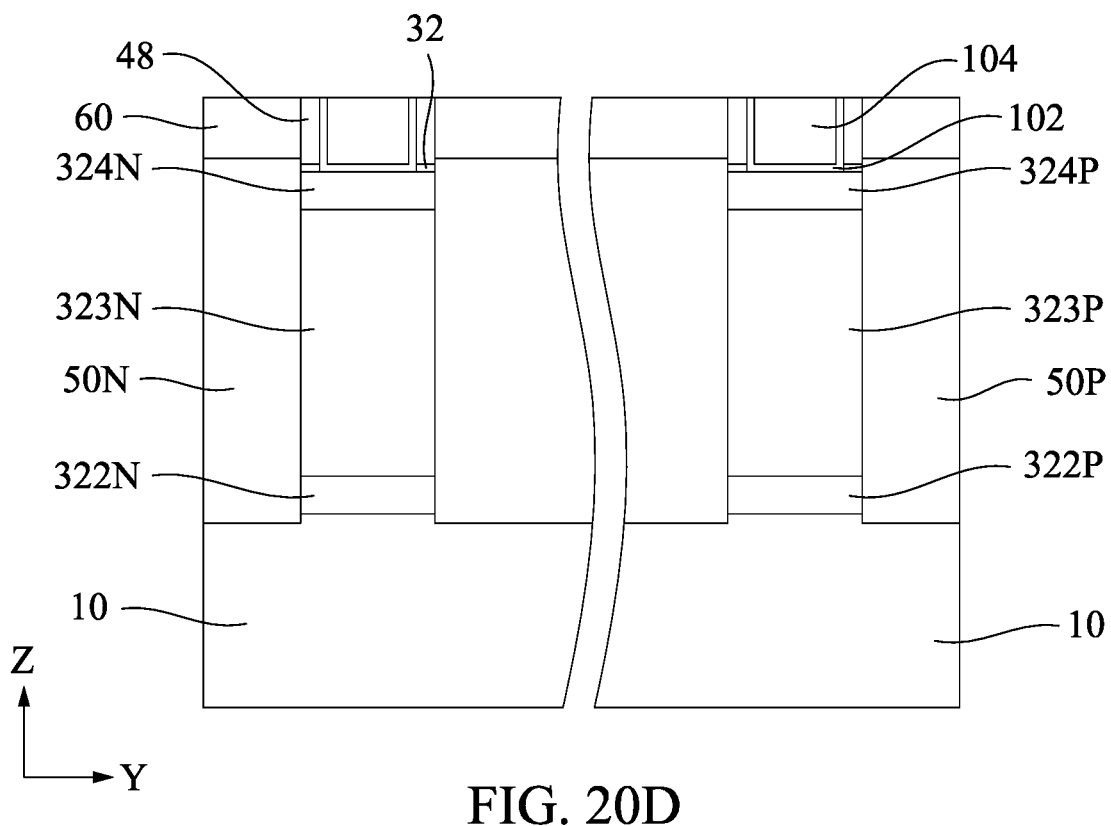

FIGS. 20C and 20D show a semiconductor device according to another embodiment, in which no epitaxial layer 11 is formed. The epitaxial growth enhancement layer 322P is formed in the Si fin structure and the epitaxial growth enhancement layers 324P is formed on the Si fin structure.

Figure 21A:
FIGS. 21A and 21B show cross sectional views of one of the stages of a sequential process for manufacturing a FinFET device according to an embodiment of the present disclosure.
Figure 21B:
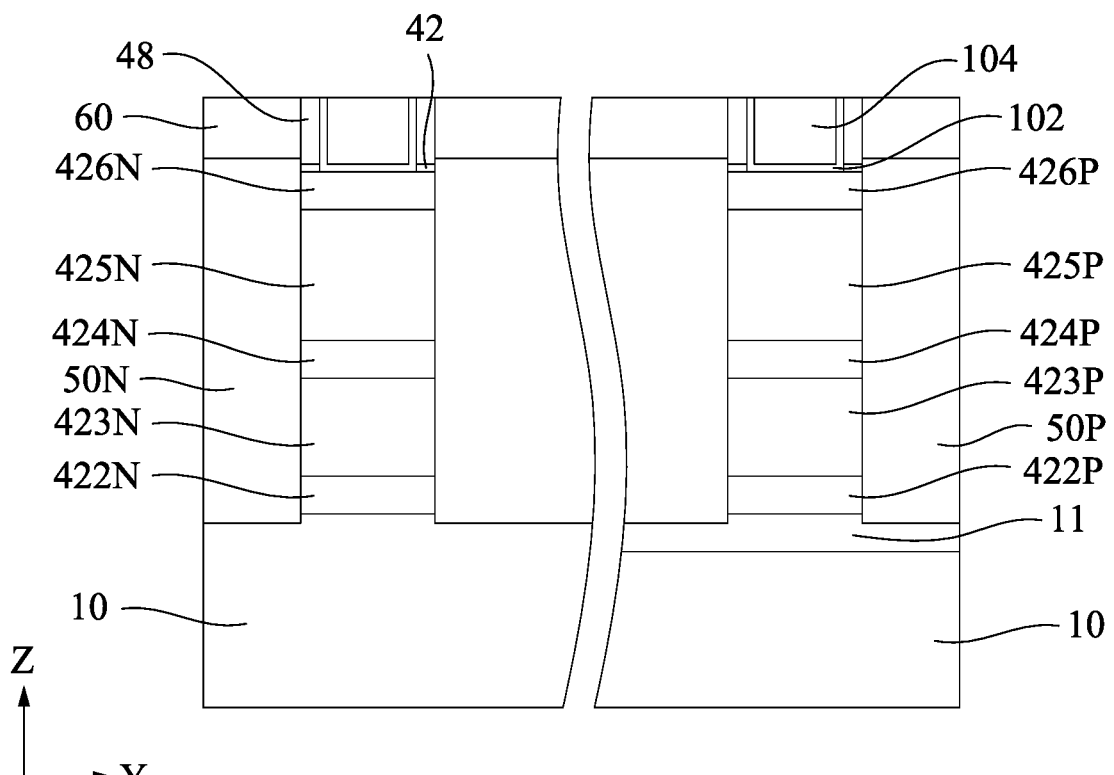

FIGS. 21A and 21B show cross sectional views of one of the stages of a sequential process for manufacturing a FinFET device according to an embodiment of the present disclosure. Materials, configurations, dimensions, processes and/or operations as described with respect to the foregoing embodiments may be employed in the following embodiments, and detailed description thereof may be omitted. FIG. 21A is the cross sectional view corresponding to line X1-X1 of FIG. 15B, and FIG. 21B is the cross sectional view corresponding to line Y1-Y1 of FIG. 15B.

As shown in FIGS. 21A and 21B, three epitaxial growth enhancement layers are disposed in the fin structures for at least one of an n-type FET and a p-type FET. In some embodiments, the fin structure of the n-type FET includes a first n-type epitaxial growth enhancement layer 422N, a first epitaxial layer 423N, a second n-type epitaxial growth enhancement layer 424N, a second epitaxial layer 425N, and a third n-type epitaxial growth enhancement layer 426N sequentially stacked. The fin structure for the n-type FET can be formed by stacking the semiconductor materials corresponding to respective layers and patterning by one or more lithography and etching operations. In some embodiments, the first, second and third n-type epitaxial growth enhancement layers are made of the same materials (e.g., SiP), or made of different materials or materials having different composition from each other in other embodiments. The first and second epitaxial layers 423N and 425N are made of the same materials (e.g., Si) as the substrate 10, or made of different materials or materials having different composition from each other in other embodiments. Similarly, in some embodiments, the fin structure of the p-type FET includes a first p-type epitaxial growth enhancement layer 422P, a third epitaxial layer 423P, a second p-type epitaxial growth enhancement layer 424P, a fourth epitaxial layer 425P, and a third p-type epitaxial growth enhancement layer 426P sequentially stacked. The fin structure for the p-type FET can be formed by stacking the semiconductor materials corresponding to respective layers and patterning by one or more lithography and etching operations. In some embodiments, the first, second and third p-type epitaxial growth enhancement layers are made of the same materials (e.g., SiGe), or made of different materials or materials having different composition from each other in other embodiments. The third and fourth epitaxial layers 423P and 425P are made of the same materials (e.g., SiGe), or made of different materials or materials having different composition from each other in other embodiments. In some embodiments, the Ge concentration of the first, second and third p-type epitaxial growth enhancement layers is greater than the Ge concentration of the epitaxial layer 11 and the third and fourth epitaxial layers, before and/or the source/drain epitaxial layer 50P is formed.

In some embodiments, the first n-type and first p-type epitaxial growth enhancement layers 422N and 422P are located below the upper surface of the isolation insulating layer 30 and the second and third n-type and p-type epitaxial growth enhancement layers 424N, 426N, 424P and 426P are located above the upper surface of the isolation insulating layer 30, as shown in FIG. 21A.

Figure 21C:
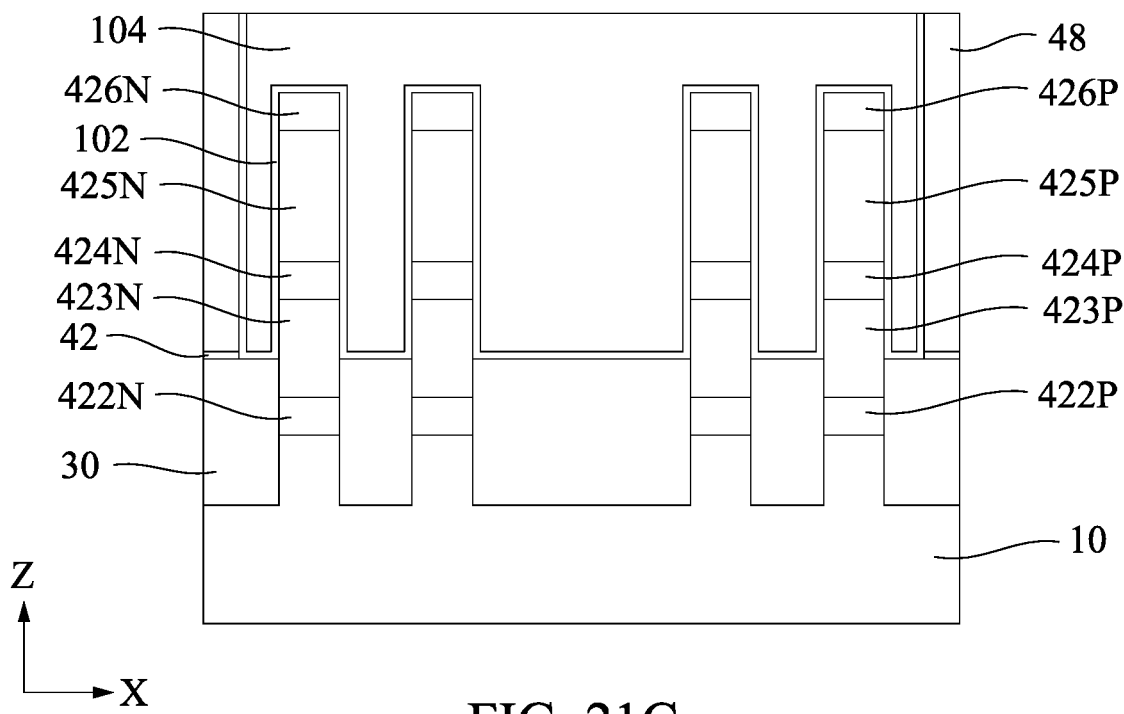
FIGS. 21C and 21D show cross sectional views of one of the stages of a sequential process for manufacturing a FinFET device according to another embodiment of the present disclosure.
Figure 21D:
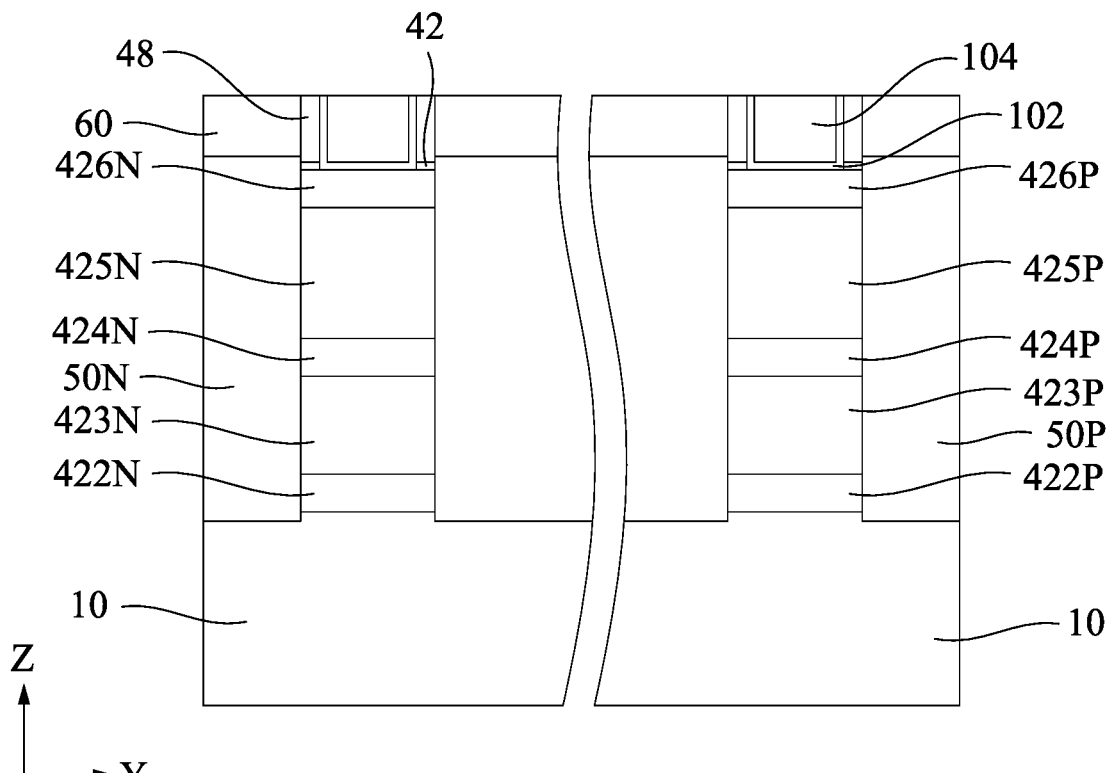

FIGS. 21C and 21D show a semiconductor device according to another embodiment, in which no epitaxial layer 11 is formed. The epitaxial growth enhancement layers 422P, 424P are formed in the Si fin structure and the epitaxial growth enhancement layers 426P is formed on the Si fin structure.

Figure 22A:
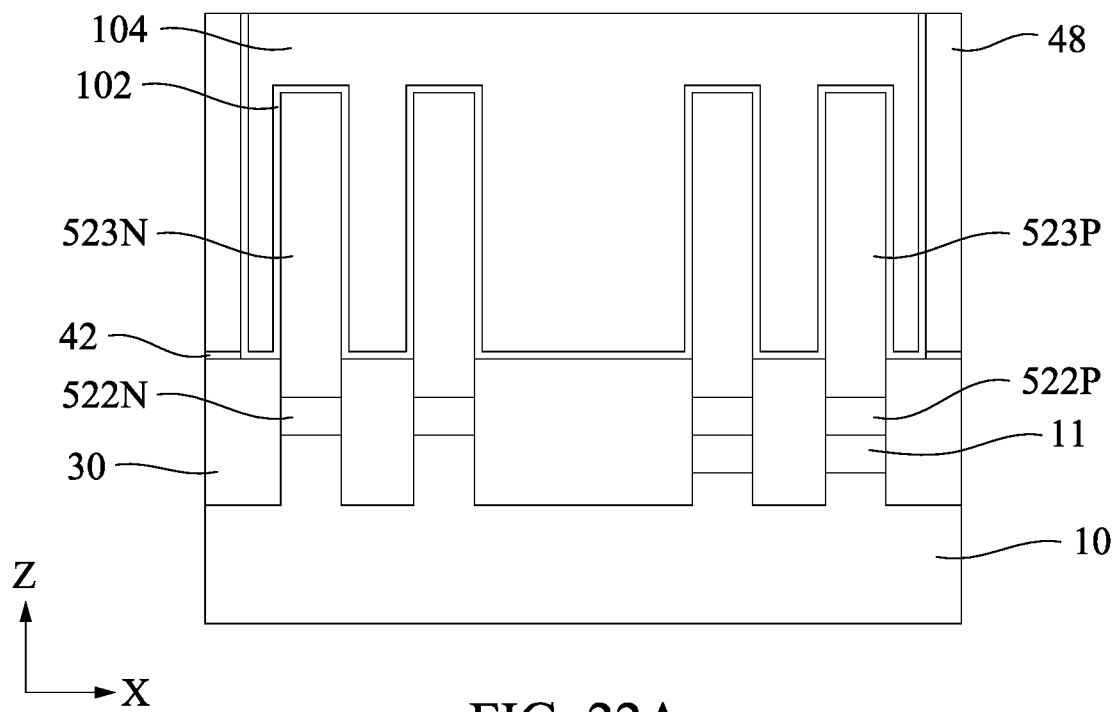
FIGS. 22A and 22B show cross sectional views of one of the stages of a sequential process for manufacturing a FinFET device according to an embodiment of the present disclosure.
Figure 22B:
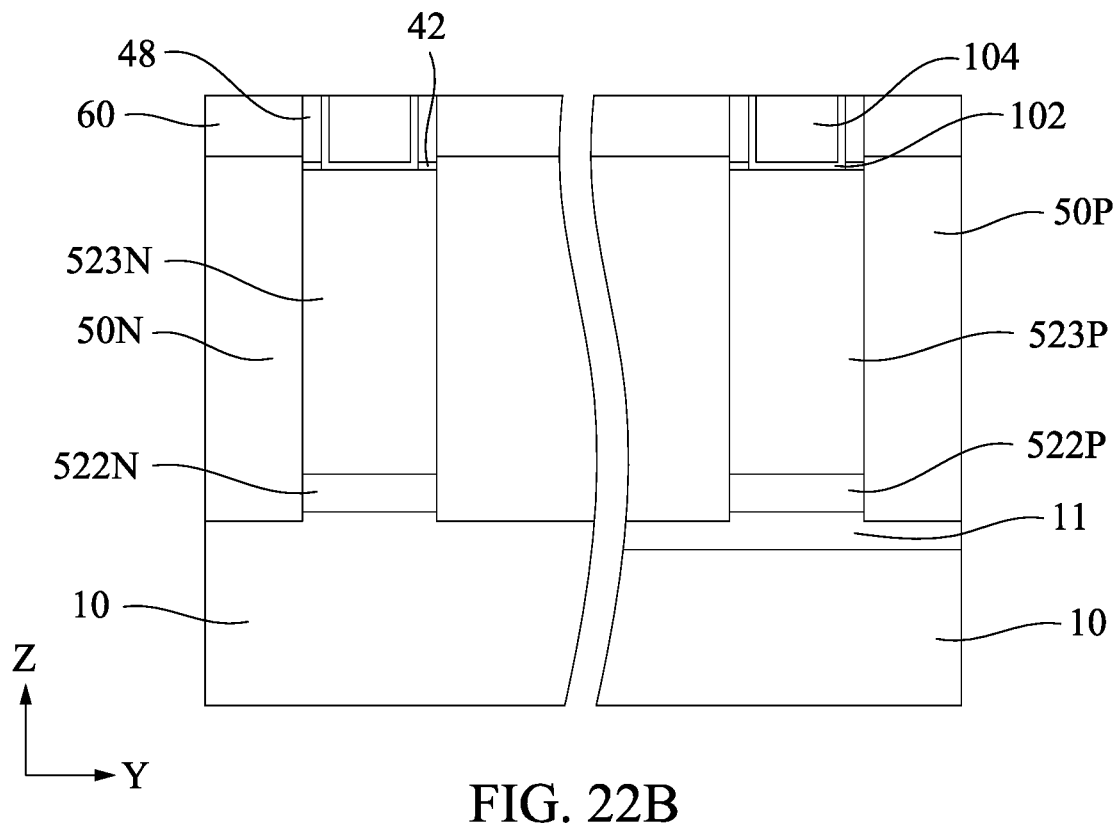

FIGS. 22A and 22B show cross sectional views of one of the stages of a sequential process for manufacturing a FinFET device according to an embodiment of the present disclosure. Materials, configurations, dimensions, processes and/or operations as described with respect to the foregoing embodiments may be employed in the following embodiments, and detailed description thereof may be omitted. FIG. 22A is the cross sectional view corresponding to line X1-X1 of FIG. 15B, and FIG. 22B is the cross sectional view corresponding to line Y1-Y1 of FIG. 15B.

As shown in FIGS. 22A and 22B, one epitaxial growth enhancement layer is disposed in the fin structures for at least one of an n-type FET and a p-type FET. In some embodiments, the fin structure of the n-type FET includes an n-type epitaxial growth enhancement layer 522N and a first epitaxial layer 523N sequentially stacked. The fin structure for the n-type FET can be formed by stacking the semiconductor materials corresponding to respective layers and patterning by one or more lithography and etching operations. The first epitaxial layers 523N is made of the same material (e.g., Si) as the substrate 10, or made of different materials or materials having different composition from each other in other embodiments. Similarly, in some embodiments, the fin structure of the p-type FET includes a p-type epitaxial growth enhancement layer 522P and a second epitaxial layer 523P sequentially stacked. The fin structure for the p-type FET can be formed by stacking the semiconductor materials corresponding to respective layers and patterning by one or more lithography and etching operations. The second epitaxial layer 523P is made of the same materials (e.g., SiGe) as the epitaxial layer 11, or made of different materials or materials having different composition from each other in other embodiments. In some embodiments, the Ge concentration of the p-type epitaxial growth enhancement layer is greater than the Ge concentration of the epitaxial layer 11 and the second epitaxial layer, before and/or the source/drain epitaxial layer 50P is formed.

In some embodiments, the n-type and p-type epitaxial growth enhancement layers 522N and 522P are located below the upper surface of the isolation insulating layer 30, as shown in FIG. 22A.

Figure 22C:
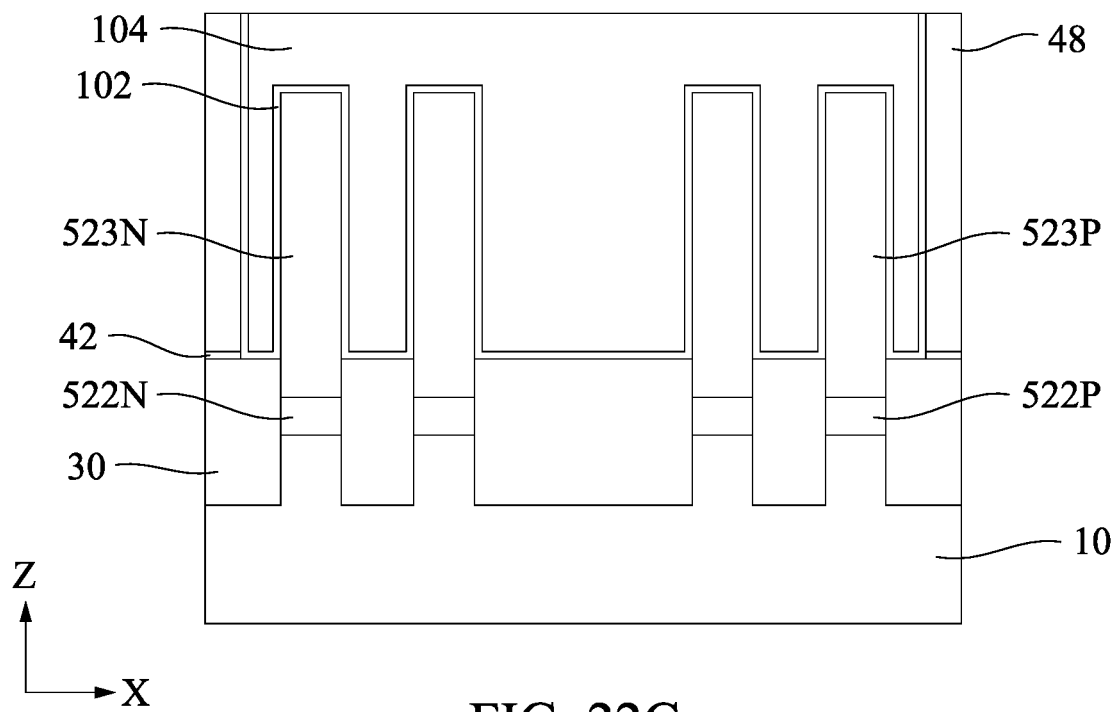
FIGS. 22C and 22D show cross sectional views of one of the stages of a sequential process for manufacturing a FinFET device according to another embodiment of the present disclosure.
Figure 22D:
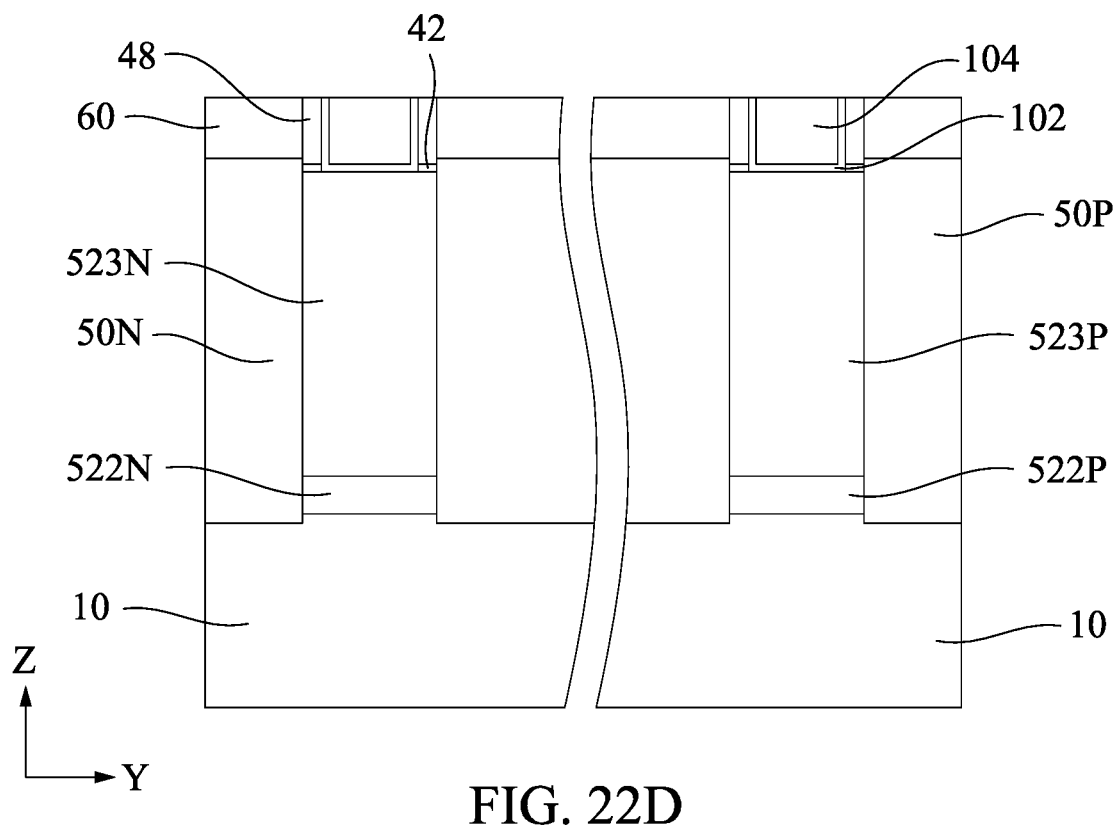

FIGS. 22C and 22D show a semiconductor device according to another embodiment, in which no epitaxial layer 11 is formed. The epitaxial growth enhancement layer 522P is formed in the Si fin structure.

In some embodiments, the number of n-type and/or p-type epitaxial growth enhancement layers is more than three and up to 20.

FIGS. 23-29B show exemplary sequential processes for manufacturing the FET device according to an embodiment of the present disclosure. It is understood that additional operations can be provided before, during, and after processes shown by FIGS. 23A-29B, and some of the operations described below can be replaced or eliminated, for additional embodiments of the method. The order of the operations/processes may be interchangeable. Materials, configurations, dimensions, processes and/or operations as described with respect to the foregoing embodiments may be employed in the following embodiments, and detailed description thereof may be omitted.

Figure 13:
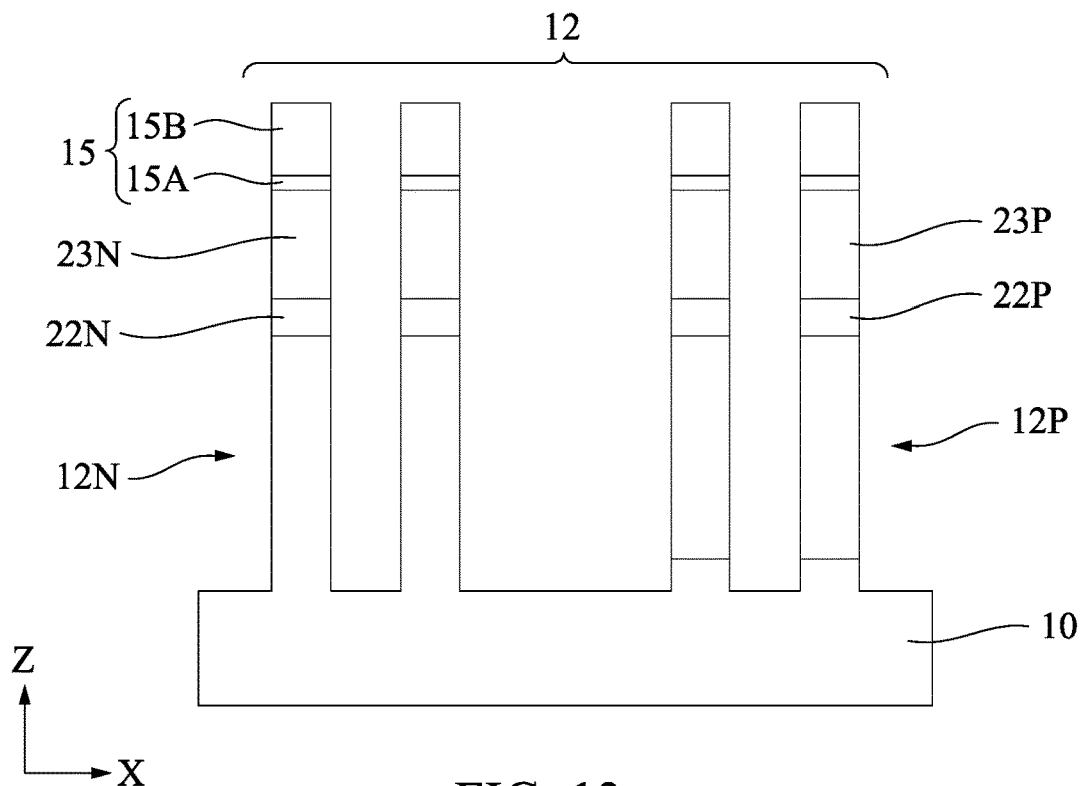
FIG. 13 shows a cross sectional view of one of the stages of a sequential process for manufacturing a FinFET device according to an embodiment of the present disclosure.
Figure 23:
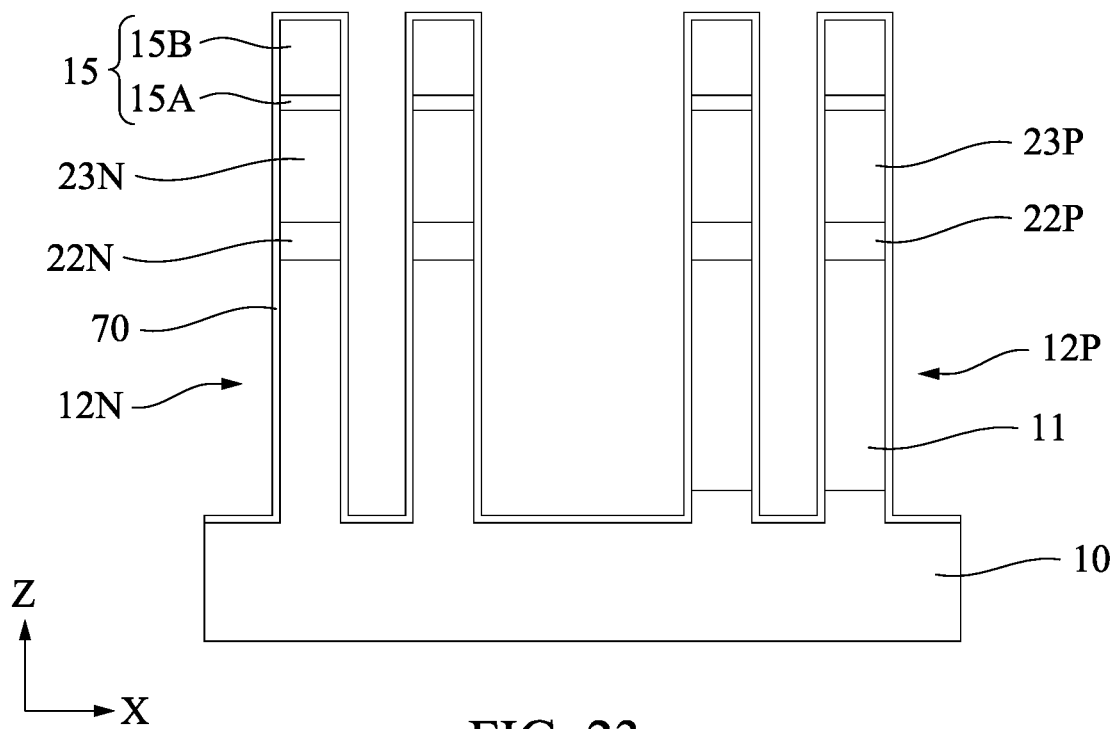
FIG. 23 shows a cross sectional view of one of the stages of a sequential process for manufacturing a FinFET device according to an embodiment of the present disclosure.

After the fin structures 12N and 12P are formed as shown in FIG. 13, a liner layer 70 is formed to cover the fin structures as shown in FIG. 23. The liner layer 70 includes one or more of silicon nitride, SiON, SiCN, SiOCN, SiOC and other suitable material. In some embodiments, silicon nitride is used. In some embodiments the thickness of the liner layer 70 is in a range from about 0.5 nm to about 20 nm. The liner layer 70 prevents out-diffusion of the P or Ge in the epitaxial growth enhancement layers before the source/drain epitaxial layer formation. The liner layer 70 can be formed by CVD, PVD, ALD, or other suitable film formation process.

Figure 24:
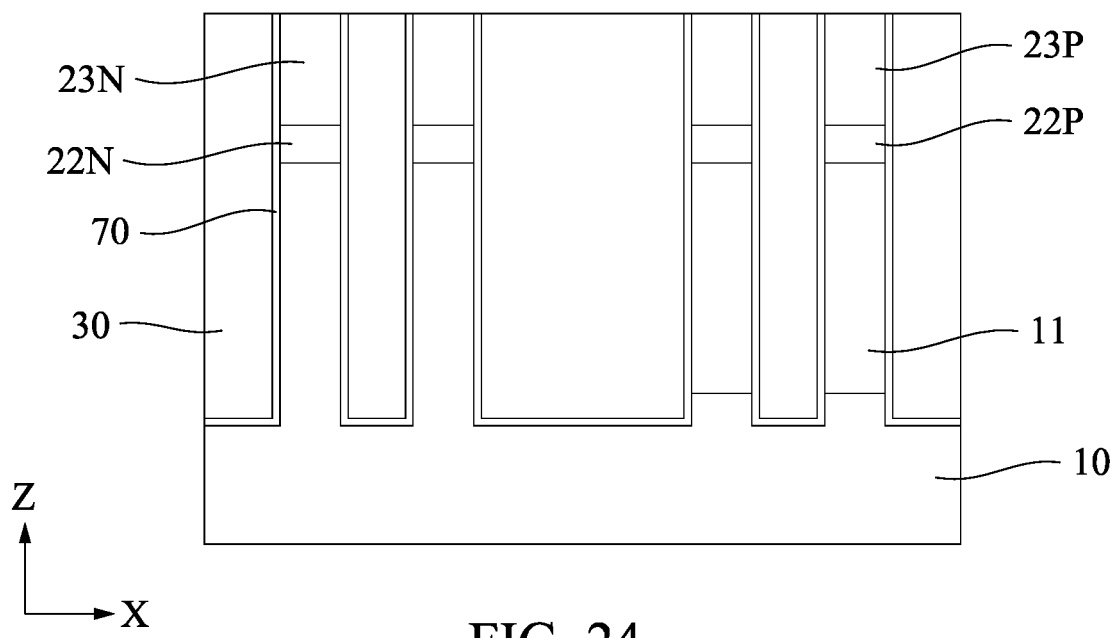
FIG. 24 shows a cross sectional view of one of the stages of a sequential process for manufacturing a FinFET device according to an embodiment of the present disclosure.

After the liner layer 70 is formed, an insulating material layer 30 including one or more layers of insulating material is formed over the substrate so that the fin structures 12 are fully embedded in the insulating layer. The insulating material for the insulating layer 30 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surfaces of the fin structures 12N, 12P are exposed from the insulating material layer, as shown in FIG. 24.

Figure 25:
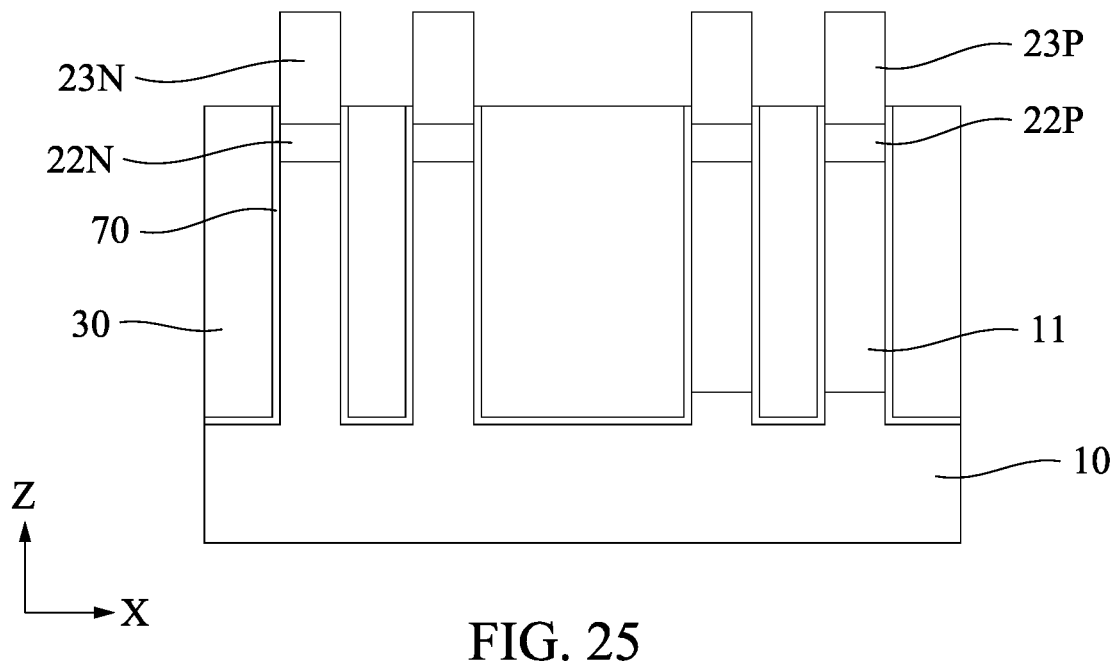
FIG. 25 shows a cross sectional view of one of the stages of a sequential process for manufacturing a FinFET device according to an embodiment of the present disclosure.
Figure 26:
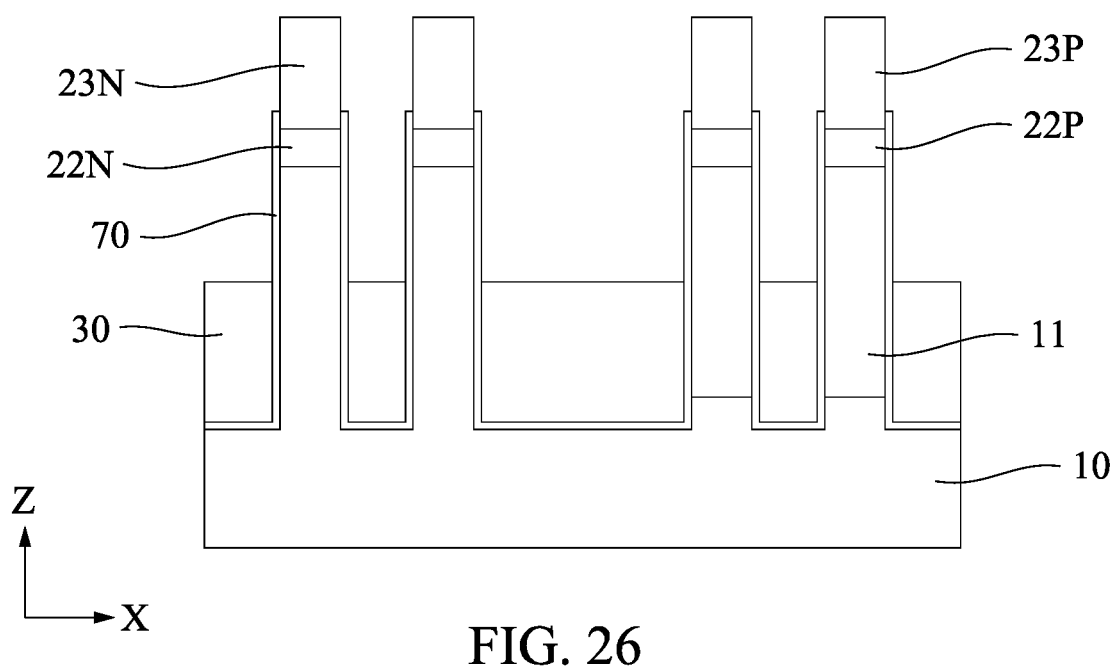
FIG. 26 shows a cross sectional view of one of the stages of a sequential process for manufacturing a FinFET device according to an embodiment of the present disclosure.

Then, as shown in FIG. 25, the insulating material layer 30 is recessed to a level above the upper surface of the n-type and p-type epitaxial growth enhancement layers 22N and 22P, and further, the liner layer 70 exposed by the recessing process is removed, as shown in FIG. 25. Then, the insulating material layer 30 is further recessed to form an isolation insulating layer 30 so that the upper portions of the fin structures 12 including the n-type and p-type epitaxial growth enhancement layers 22N and 22P covered with the liner layer 70 are exposed, as shown in FIG. 26. In some embodiments, one or more plasma dry etching operations are used to recess the insulating material layer 30 and the liner layer 70. In other embodiments, wet etching is used. In some embodiments, when the insulating material layer 30 is silicon oxide and the liner layer 70 is silicon nitride, buffered HF or dilute HF are used to recess the insulating material layer 30 and H3PO4 is used to remove the liner layer.

Figure 27A:
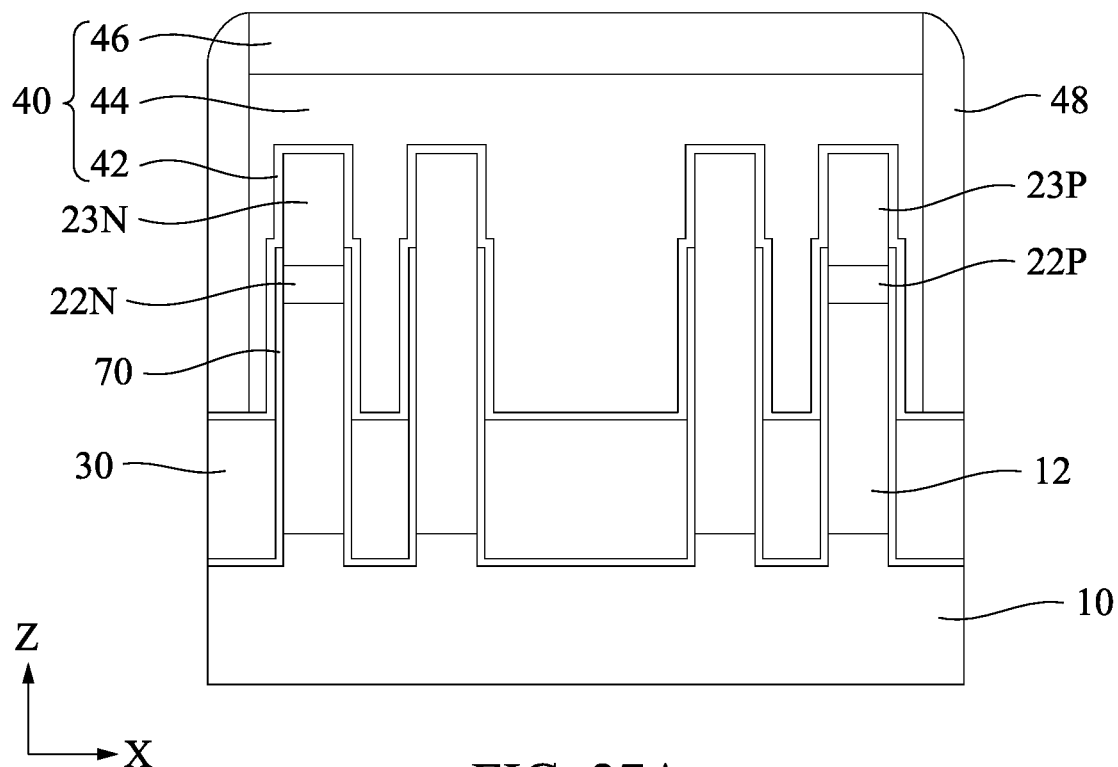
FIGS. 27A and 27B show views of one of the stages of a sequential process for manufacturing a FinFET device according to an embodiment of the present disclosure.
Figure 27B:
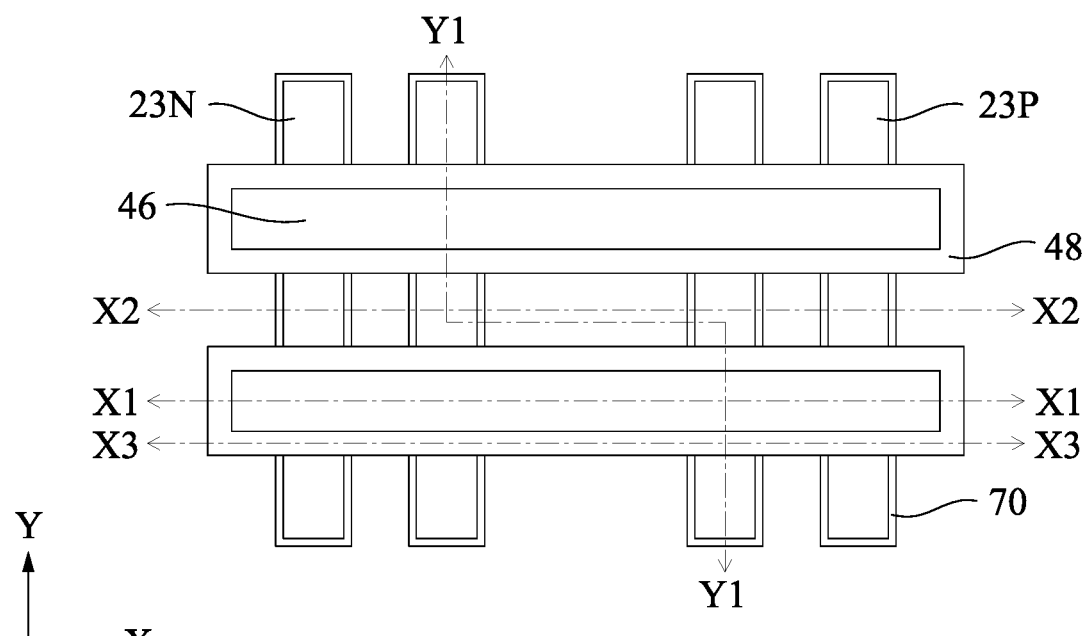

After the isolation insulating layer 30 is formed, similar to FIGS. 5A-5D, a sacrificial gate structures 40 are formed over the fin structures, and gate sidewall spacers 48 are formed, as shown in FIGS. 27A and 27B. FIG. 27B is a top (plan) view and FIG. 27A is a cross sectional view corresponding to line X1-X1 of FIG. 27B.

Figure 28A:
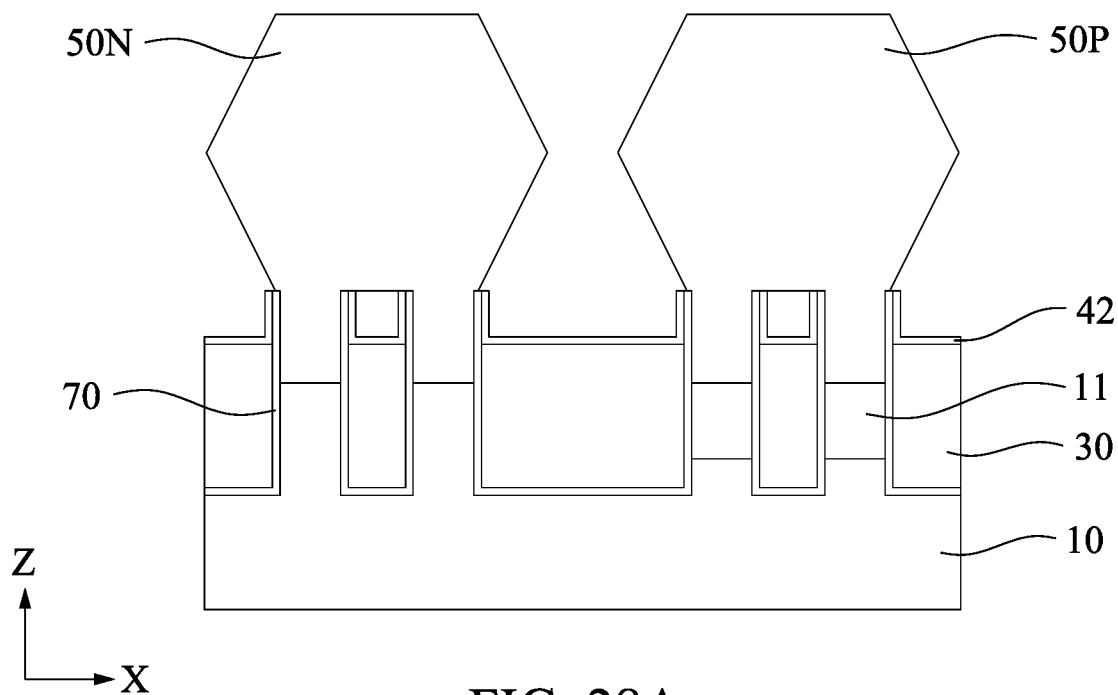
FIGS. 28A and 28B show cross sectional views of one of the stages of a sequential process for manufacturing a FinFET device according to an embodiment of the present disclosure.

Subsequently, similar to FIGS. 6A-7B, the fin structures of source/drain regions are recessed down below the upper surface of the isolation insulating layer 30 by using dry etching and/or wet etching, and source/drain epitaxial layers 50N and 50P are formed, as shown in FIG. 28A. FIG. 28A is a cross sectional view corresponding to line X2-X2 of FIG. 27B.

Figure 28B:
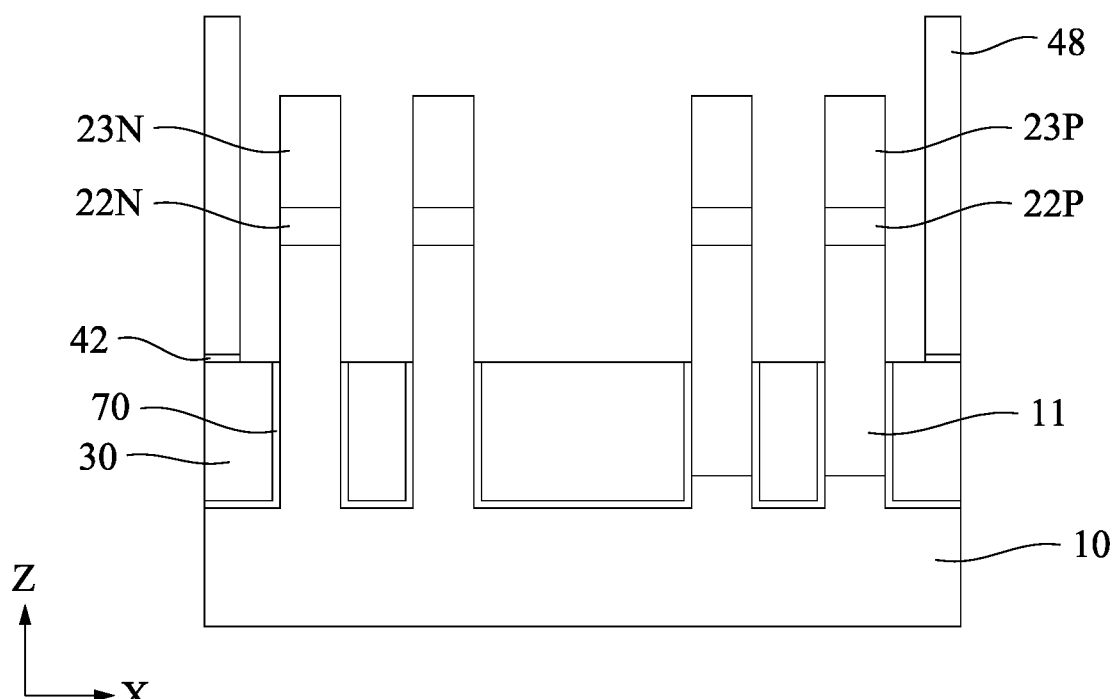

Subsequently, similar to FIGS. 8A-9B, a first interlayer dielectric (ILD) layer 60 is formed over the source/drain epitaxial layers 50N and 50P and the sacrificial gate structures 40. Then, a planarization operation, such as CMP, is performed, so that the top portion of the sacrificial gate electrode layer 44 is exposed. Then, the sacrificial gate electrode layer 44 and sacrificial gate dielectric layer 42 are removed to form a gate space, thereby exposing the fin structures in the gate space, as shown in FIG. 28B. FIG. 28B is a cross sectional view corresponding to line X1-X1 of FIG. 27B. As shown in FIG. 28, the liner layer 70 is further removed from the upper portion of the fin structures in the gate space.

Figure 29A:
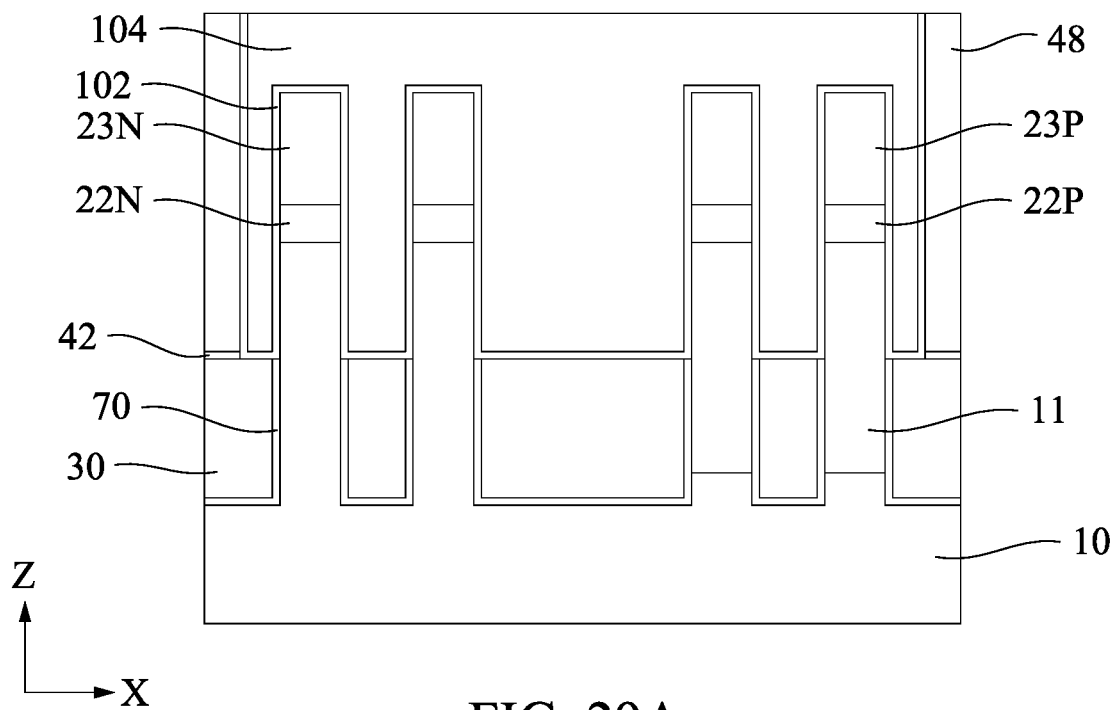
FIGS. 29A and 29B show cross sectional views of one of the stages of a sequential process for manufacturing a FinFET device according to an embodiment of the present disclosure.
Figure 29B:
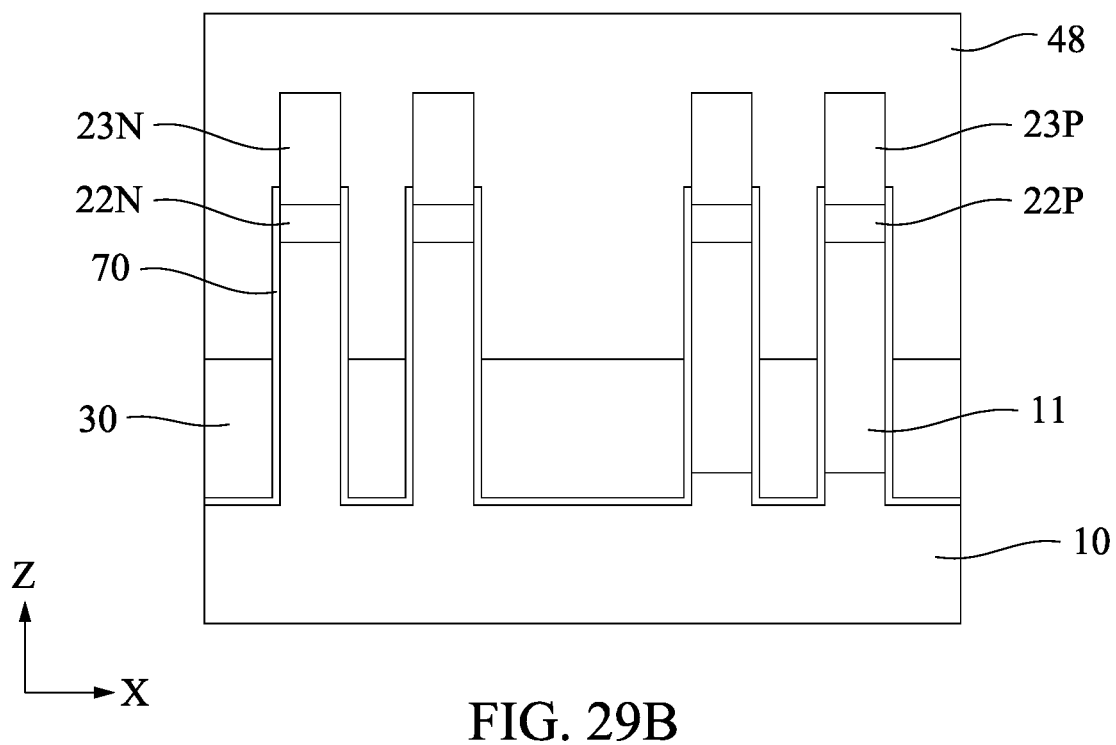

After the sacrificial gate structures are removed, a gate dielectric layer 102 is formed over channel regions, and a gate electrode layer 104 is formed on the gate dielectric layer 102, as shown in FIGS. 29A and 29B. FIG. 29A is a cross sectional view corresponding to line X1-X1 of FIG. 27B and FIG. 29B is a cross sectional view corresponding to line X3-X3 of FIG. 27B. As shown in FIG. 29B, under the sidewall spacers 48, the liner layer 70 remains and maintains the initial height.

Since the epitaxial growth enhancement layers are covered by the liner layer 70, it is possible to prevent diffusion of P or Ge from the epitaxial growth enhancement layers to the regions other than the source/drain epitaxial layers 50N or 50P.

Figure 29C:
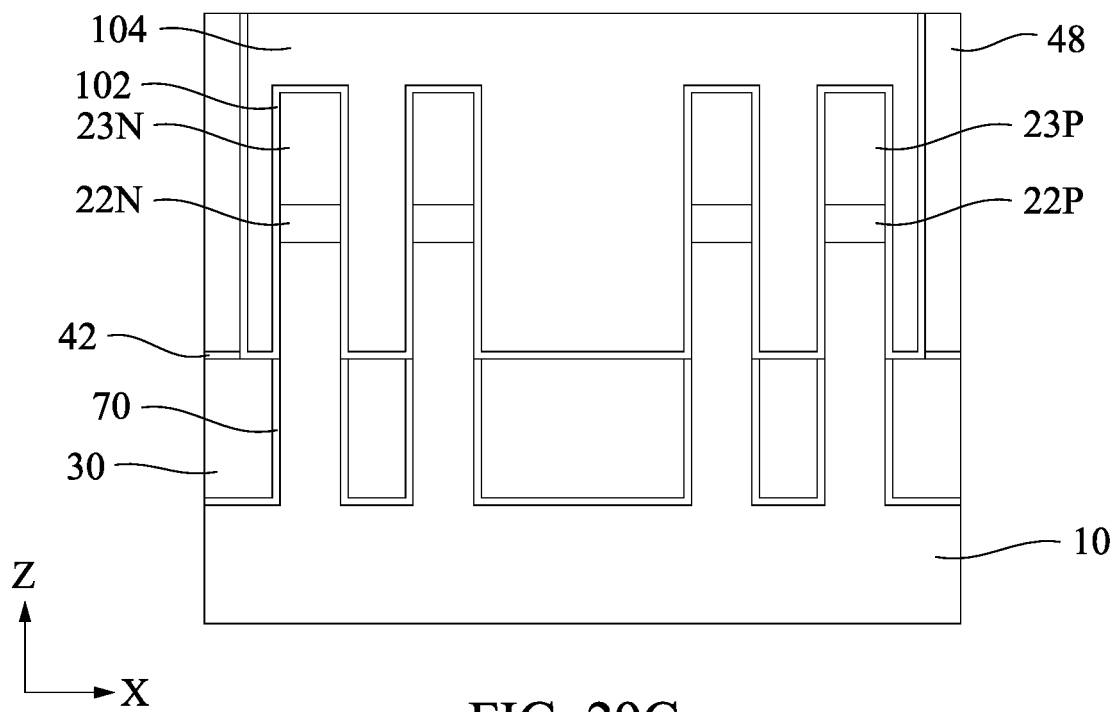
FIGS. 29C and 29D show cross sectional views of one of the stages of a sequential process for manufacturing a FinFET device according to another embodiment of the present disclosure.
Figure 29D:
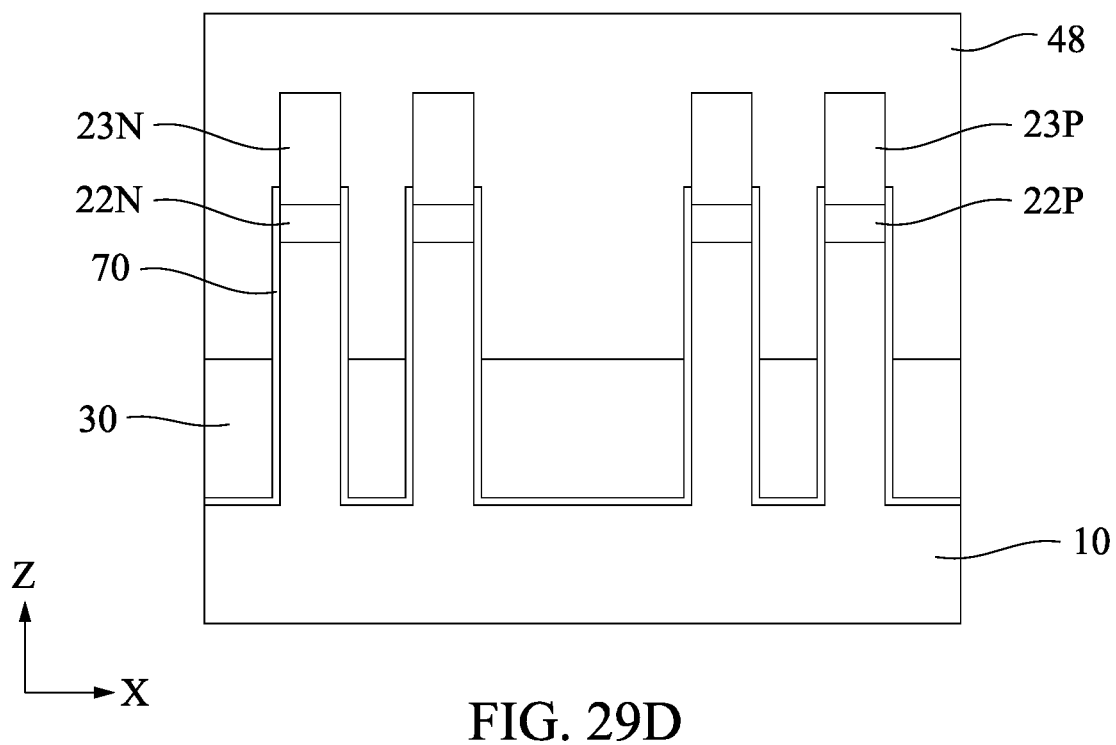

FIGS. 29C and 29D show a semiconductor device according to another embodiment, in which no epitaxial layer 11 is formed. The epitaxial growth enhancement layer 20P is formed in the Si fin structure.

Figure 30A:
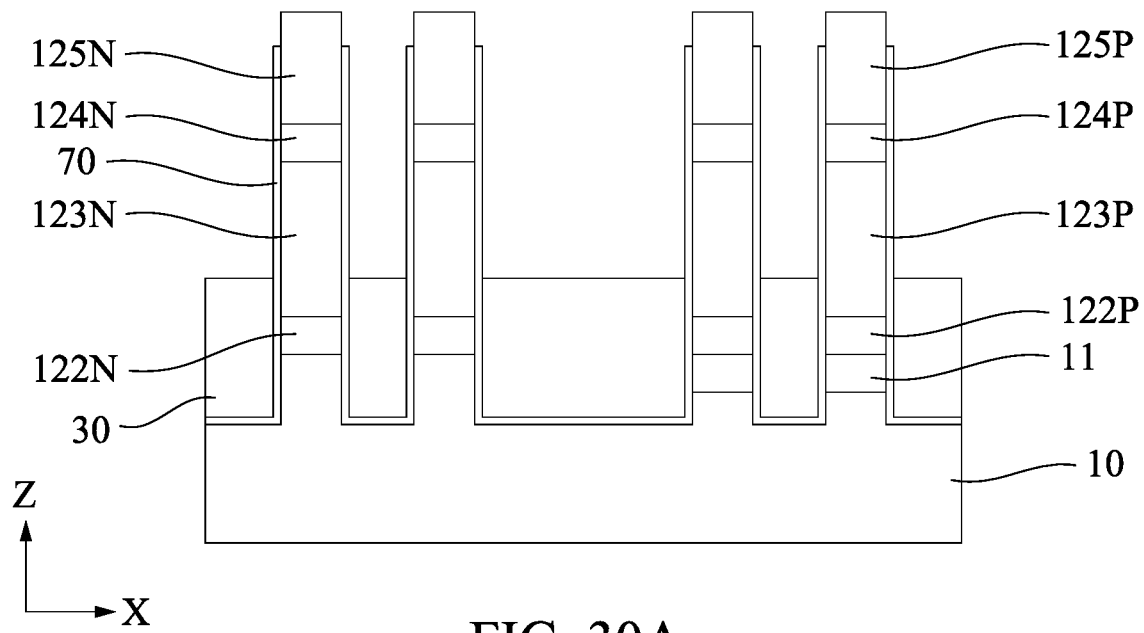
FIGS. 30A and 30B show cross sectional views of one of the stages of a sequential process for manufacturing a FinFET device according to an embodiment of the present disclosure.
Figure 30B:
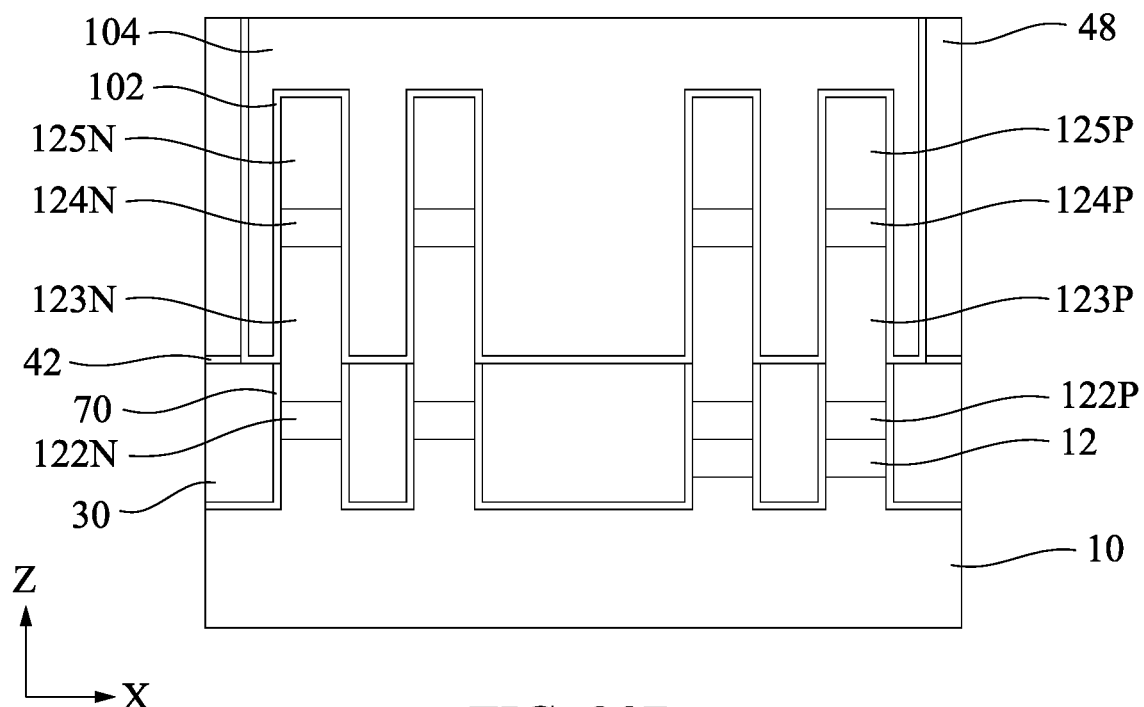

FIGS. 30A and 30B show cross sectional views of one of the stages of a sequential process for manufacturing a FinFET device according to an embodiment of the present disclosure. Materials, configurations, dimensions, processes and/or operations as described with respect to the foregoing embodiments may be employed in the following embodiments, and detailed description thereof may be omitted.

Similar to FIGS. 18A and 18B and FIG. 26, fin structures having two epitaxial growth enhancement layers are covered by the liner layer 70, as shown in FIG. 30A. The top of the liner layer 70 is located above the top (highest) of the second epitaxial growth enhancement layers 124N and 124P. FIG. 30B shows a structure after the gate dielectric layer 102 and the gate electrode layer 104 are formed.

Figure 31A:
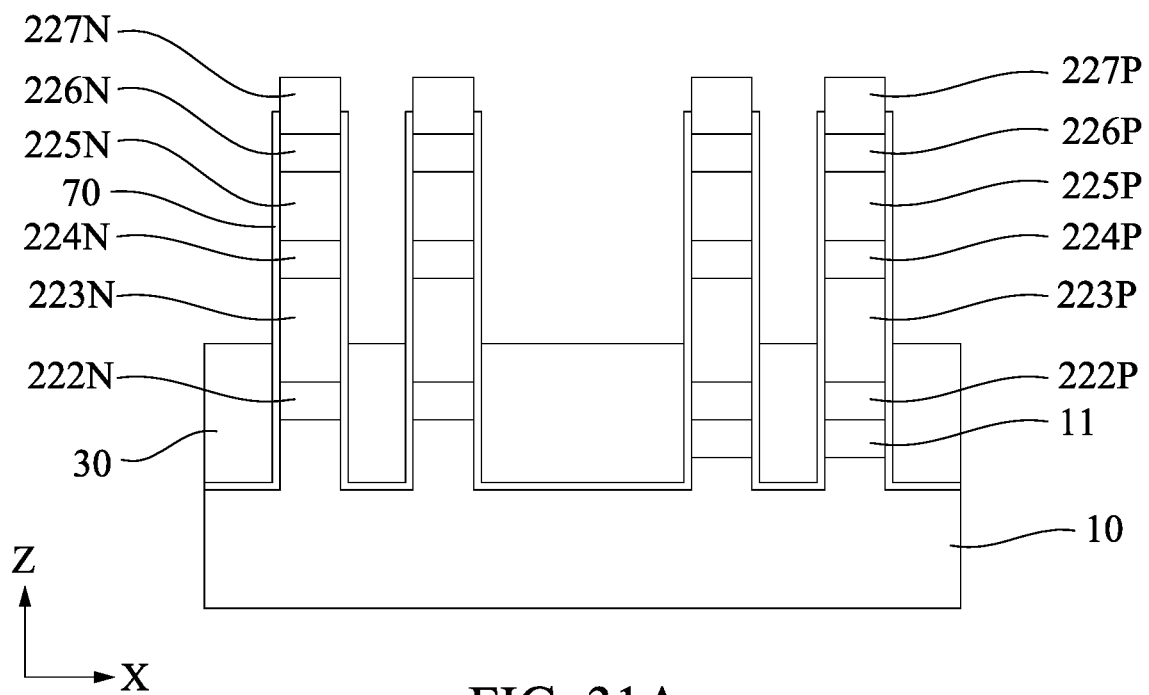
FIGS. 31A and 31B show cross sectional views of one of the stages of a sequential process for manufacturing a FinFET device according to an embodiment of the present disclosure.
Figure 31B:
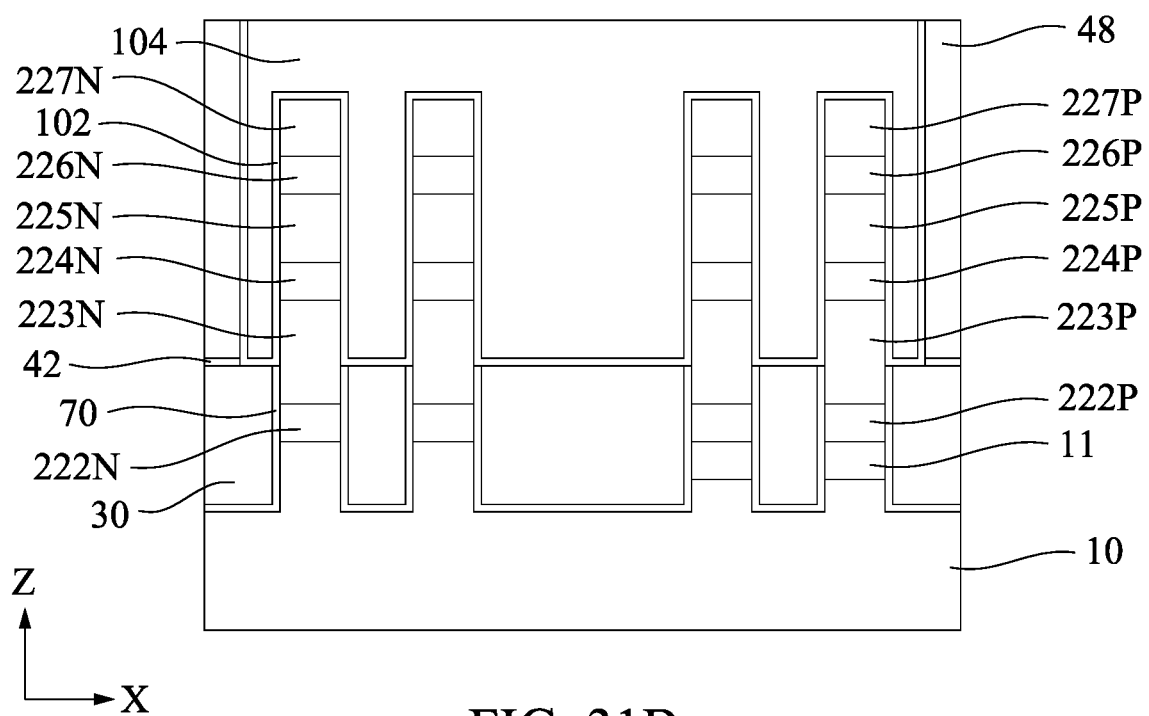

FIGS. 31A and 31B show cross sectional views of one of the stages of a sequential process for manufacturing a FinFET device according to an embodiment of the present disclosure. Materials, configurations, dimensions, processes and/or operations as described with respect to the foregoing embodiments may be employed in the following embodiments, and detailed description thereof may be omitted.

Similar to FIGS. 19A and 19B and FIG. 26, fin structures having three epitaxial growth enhancement layers are disposed are covered by the liner layer 70, as shown in FIG. 31A. The top of the liner layer 70 is located above the top (highest) of the third epitaxial growth enhancement layers 226N and 226P. FIG. 31B shows a structure after the gate dielectric layer 102 and the gate electrode layer 104 are formed.

The liner layer 70 can be applied to other configurations of the fin structures. In some embodiments, the top of the liner layer 70 is located above the highest point of the epitaxial growth enhancement layer(s).

Figure 31C:
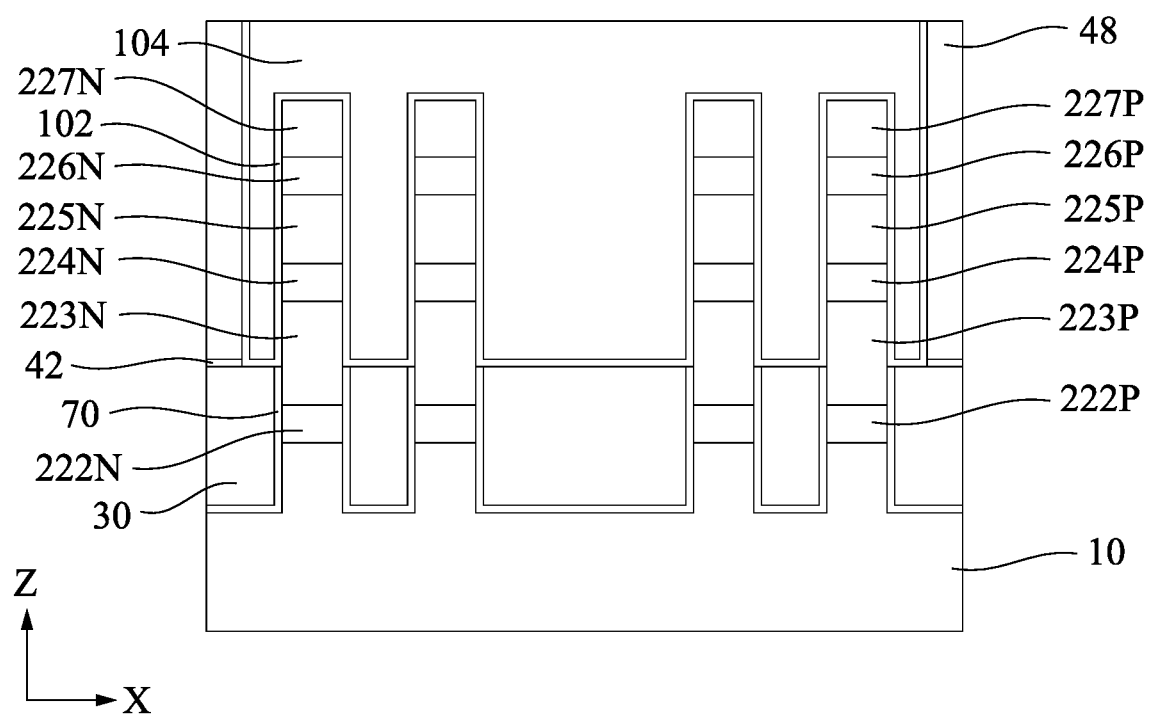
FIG. 31C shows a cross sectional view of one of the stages of a sequential process for manufacturing a FinFET device according to another embodiment of the present disclosure.

FIG. 31C shows a semiconductor device according to another embodiment, in which no epitaxial layer 11 is formed. The epitaxial growth enhancement layers 222P, 224P and 226P are formed in the Si fin structure.

FIGS. 32A-39B show cross sectional views of one of the stages of a sequential process for manufacturing a FinFET device according to embodiments of the present disclosure. Materials, configurations, dimensions, processes and/or operations as described with respect to the foregoing embodiments may be employed in the following embodiments, and detailed description thereof may be omitted. The "A" figures (FIGS. 32A, 33A, . . . ) show cross sectional views corresponding to line X2-X2 of FIG. 5B, 15B or 27B, and the "B" figures (FIGS. 32B, 33B, . . . ) show cross sectional views corresponding to line Y1-Y1 of FIG. 5B, 15B or 27B. In FIGS. 6A and 6B, the source/drain regions of the fin structures are deeply recessed below the isolation insulating layer 30.

Figure 32A:
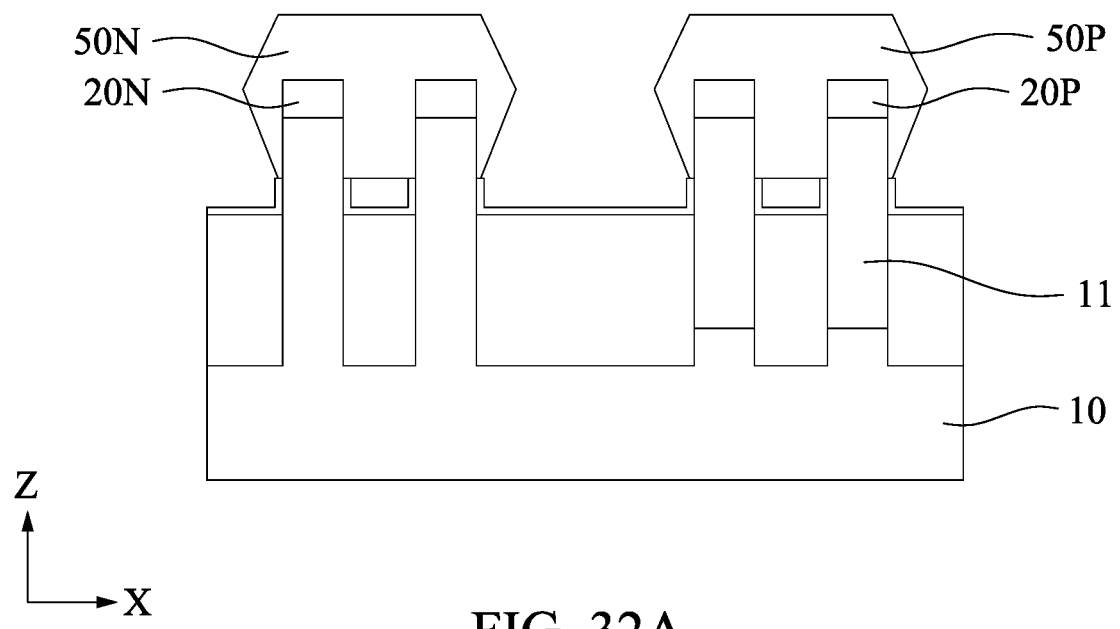
FIGS. 32A and 32B show cross sectional views of one of the stages of a sequential process for manufacturing a FinFET device according to an embodiment of the present disclosure.
Figure 32B:
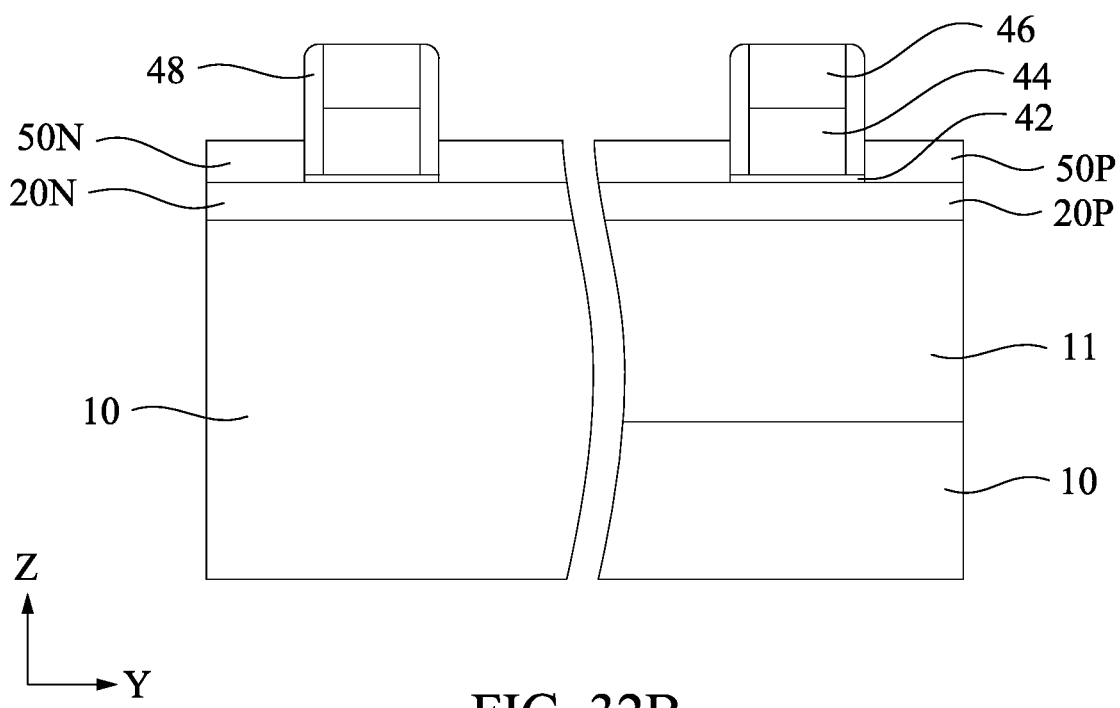

In the embodiment of FIGS. 32A and 32B, the recess etching is not performed, and the source/drain epitaxial layers 50N and 50P are formed over the epitaxial growth enhancement layers 20N and 20P, respectively.

Figure 33A:
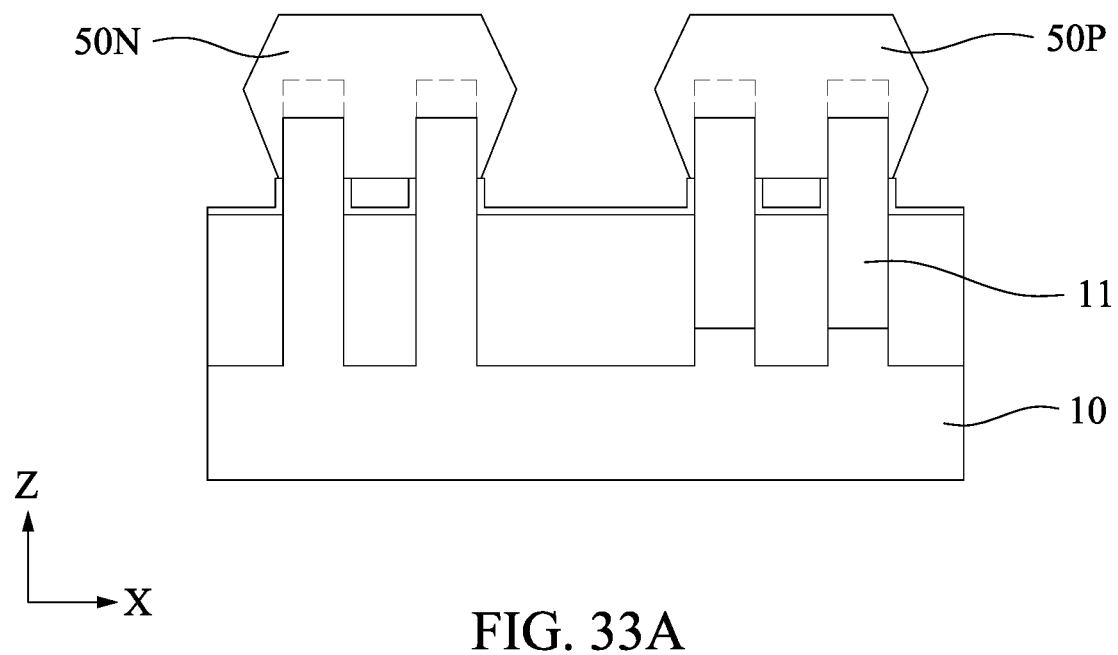
FIGS. 33A and 33B show cross sectional views of one of the stages of a sequential process for manufacturing a FinFET device according to an embodiment of the present disclosure.
Figure 33B:
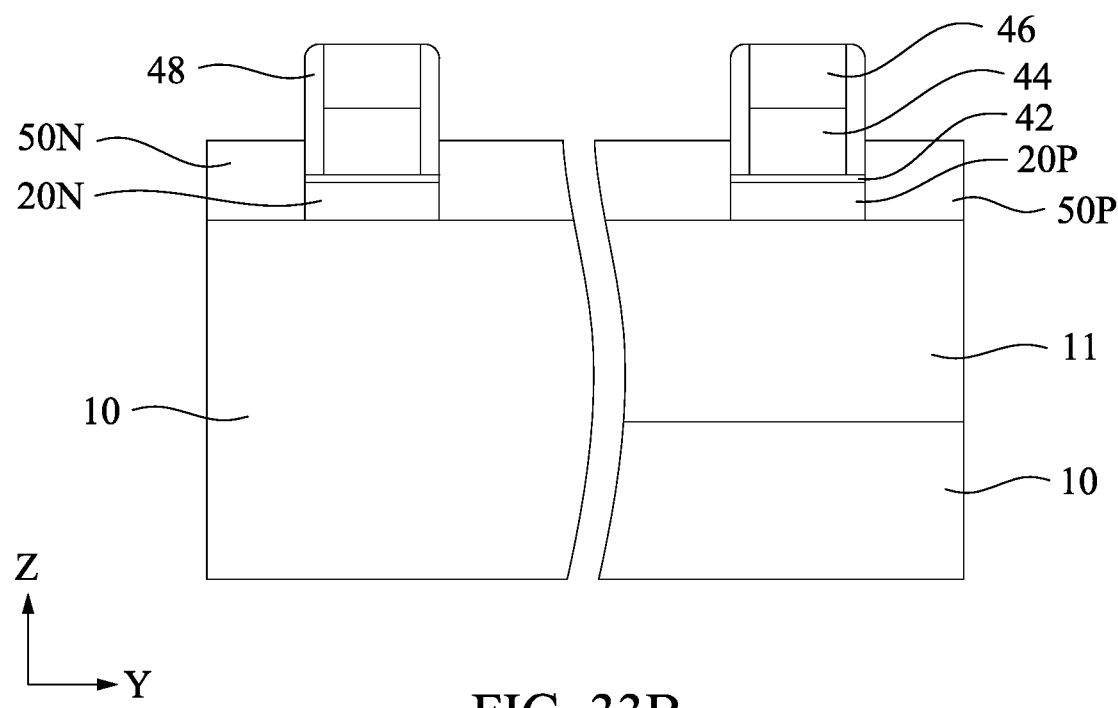

In the embodiment of FIGS. 33A and 33B, the recess etching is stopped at the substrate 10 for the n-type region and at the epitaxial layer 11 for the p-type region. In other words, the recess etching is stopped after the epitaxial growth enhancement layers are removed. In other embodiments, a thin layer of the epitaxial growth enhancement layers remains. The source/drain epitaxial layers 50N and 50P are formed over the side faces of the epitaxial growth enhancement layers 20N and 20P and on the substrate 10 and the epitaxial layer 11, respectively.

Figure 34A:
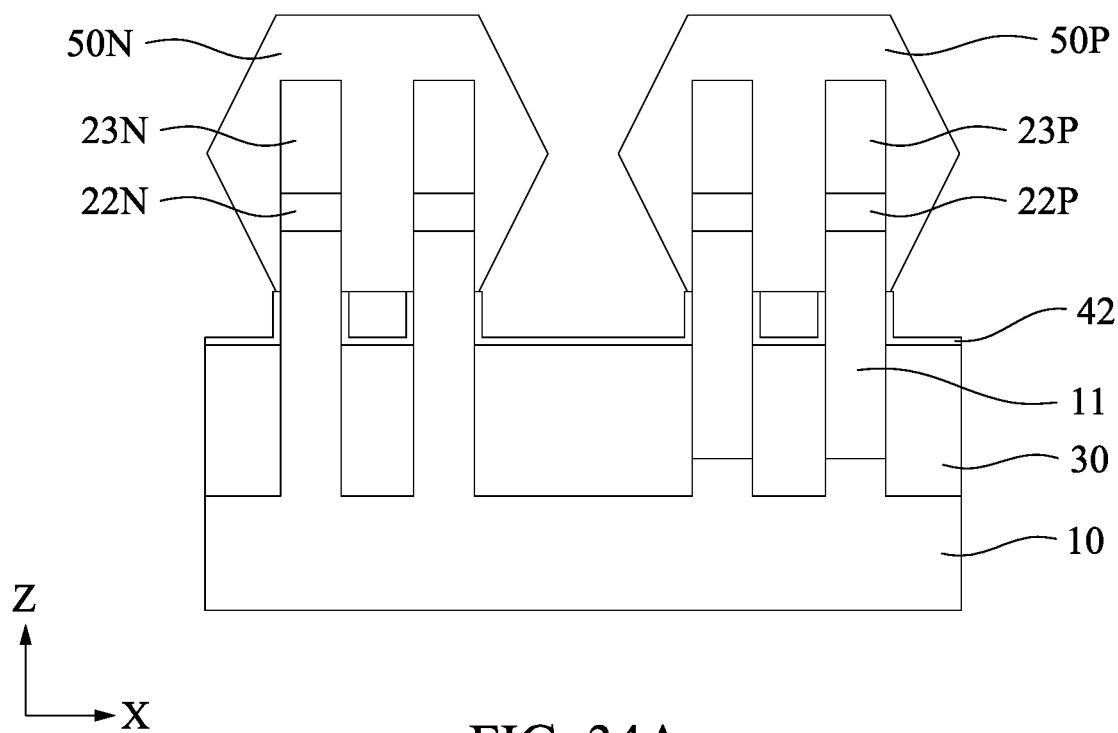
FIGS. 34A and 34B show cross sectional views of one of the stages of a sequential process for manufacturing a FinFET device according to an embodiment of the present disclosure.
Figure 34B:
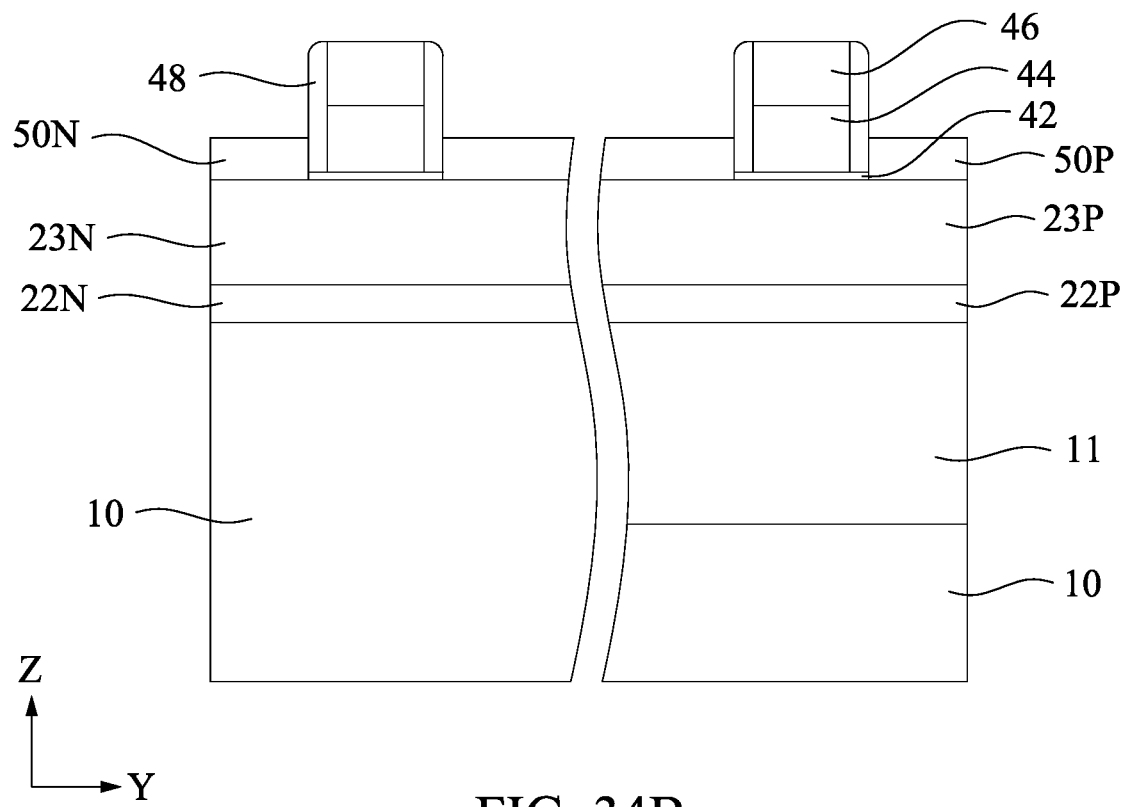

In the embodiment of FIGS. 34A and 34B having a similar fin structure to FIGS. 14 and 26, the recess etching is not performed, and the source/drain epitaxial layers 50N and 50P are formed over the sides of the epitaxial growth enhancement layers 22N and 22P, respectively.

Figure 35A:
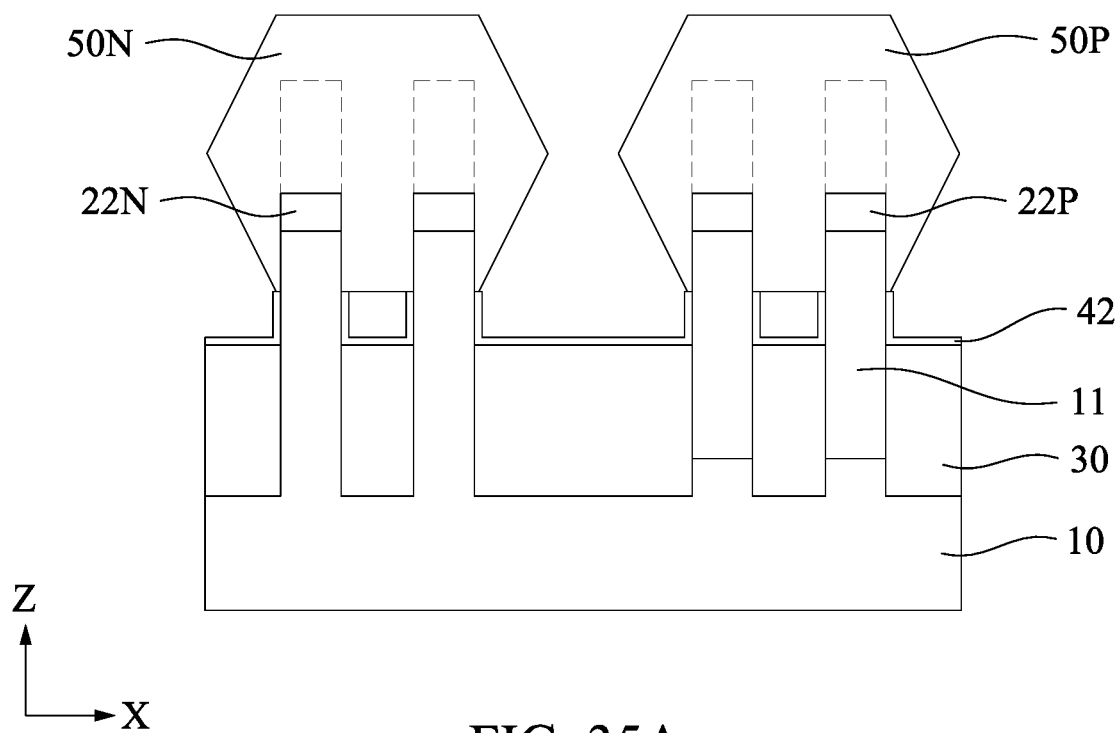
FIGS. 35A and 35B show cross sectional views of one of the stages of a sequential process for manufacturing a FinFET device according to an embodiment of the present disclosure.
Figure 35B:
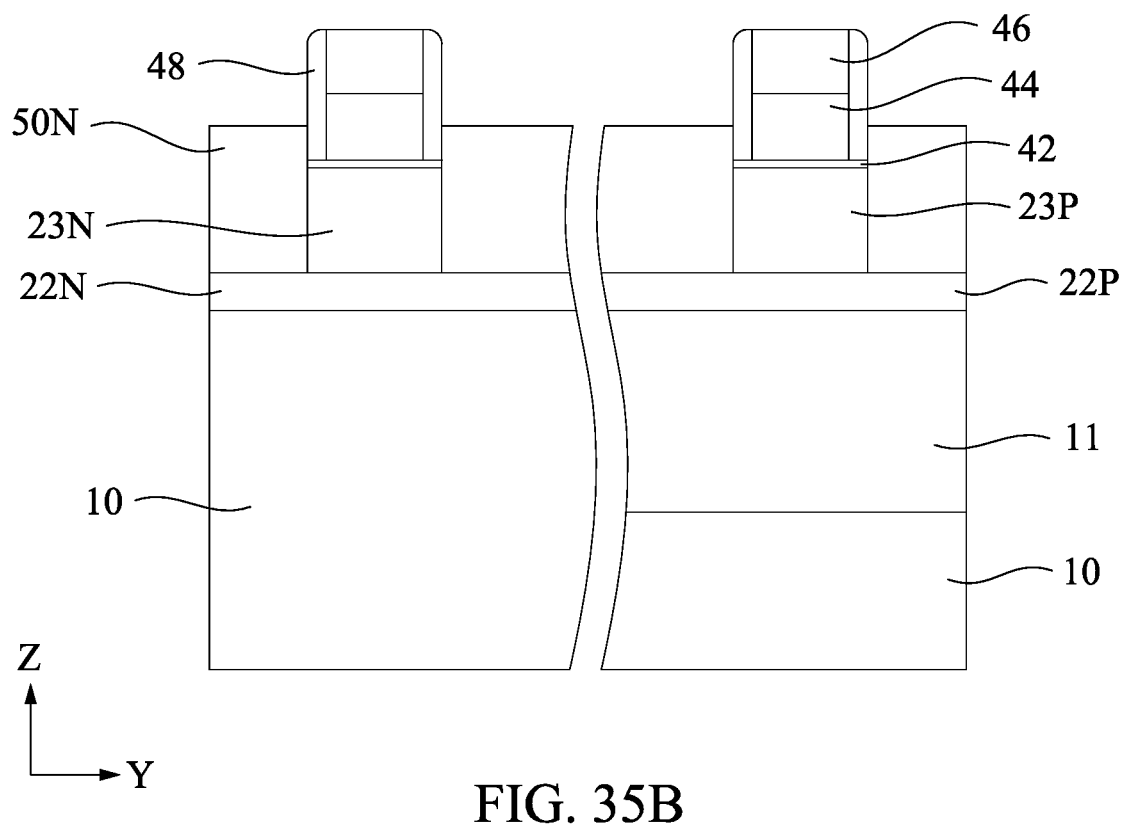

In the embodiment of FIGS. 35A and 35B having a similar fin structure to FIGS. 14 and 26, the recess etching is stopped at the epitaxial growth enhancement layers. The source/drain epitaxial layers 50N and 50P are formed on the epitaxial growth enhancement layers 22N and 22P, respectively.

Figure 36A:
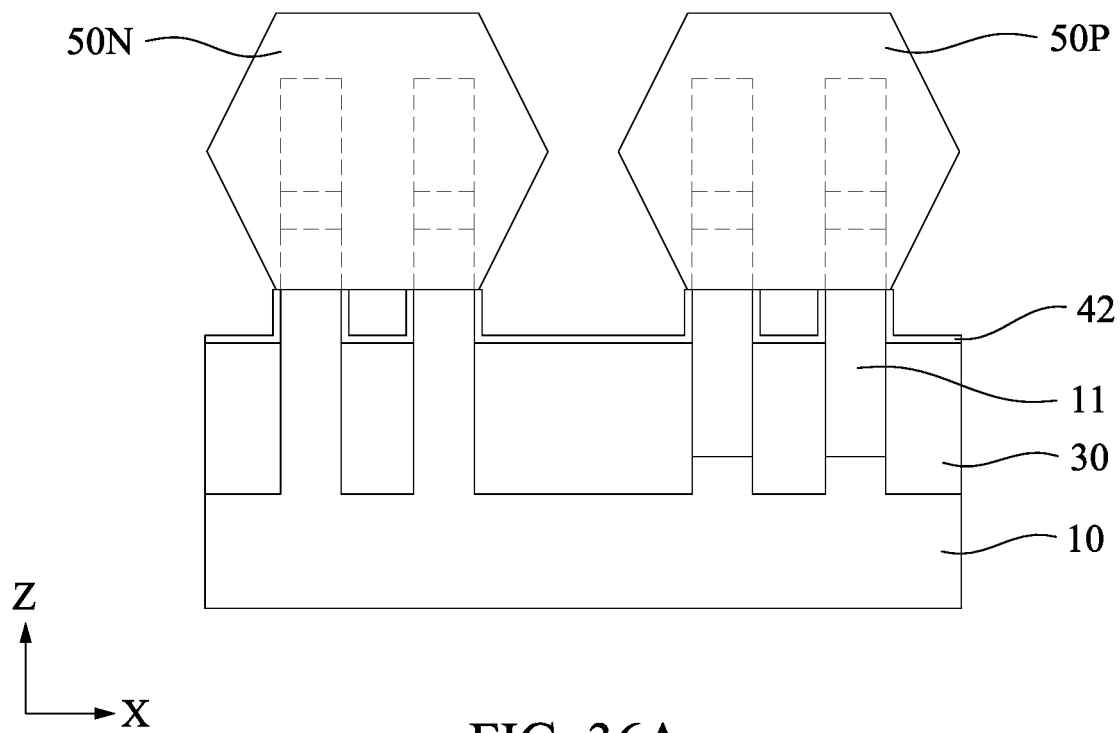
FIGS. 36A and 36B show cross sectional views of one of the stages of a sequential process for manufacturing a FinFET device according to an embodiment of the present disclosure.
Figure 36B:
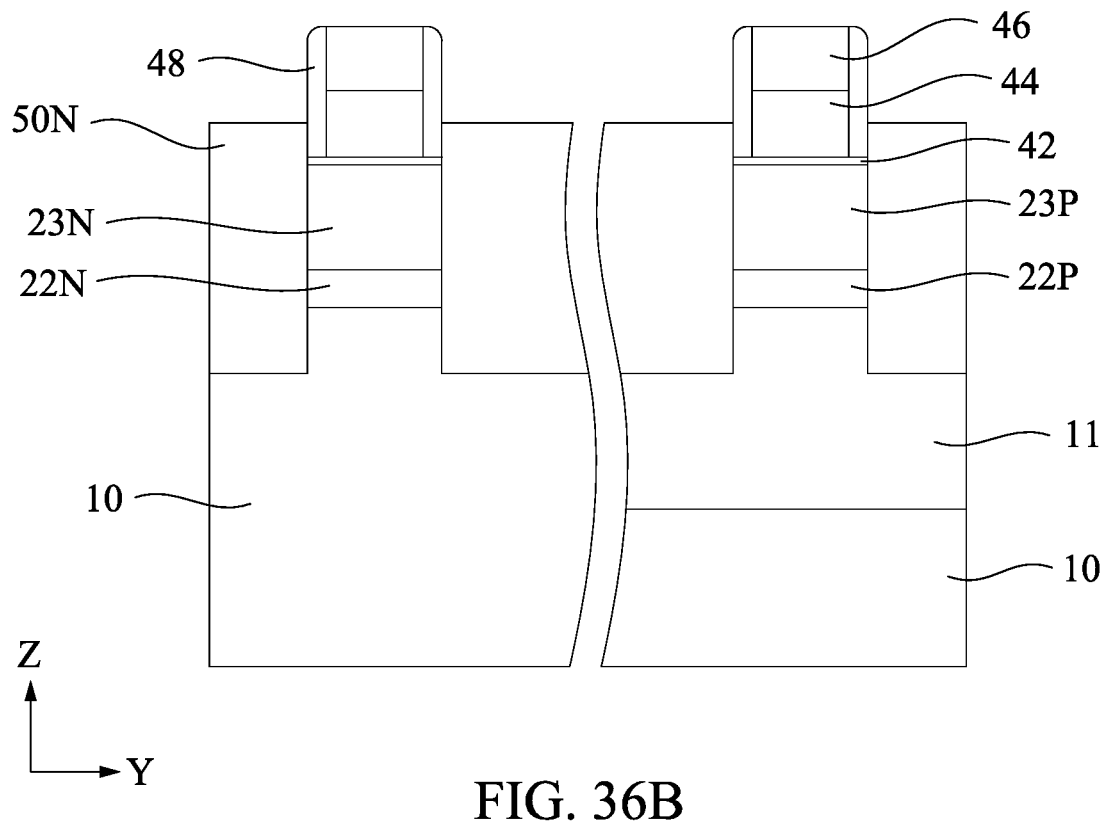

In the embodiment of FIGS. 36A and 36B having a similar fin structure to FIGS. 14 and 26, the recess etching is stopped below the epitaxial growth enhancement layers, similar to FIG. 16. The source/drain epitaxial layers 50N and 50P are formed on the side faces of the epitaxial growth enhancement layers 22N and 22P, respectively.

Figure 37A:
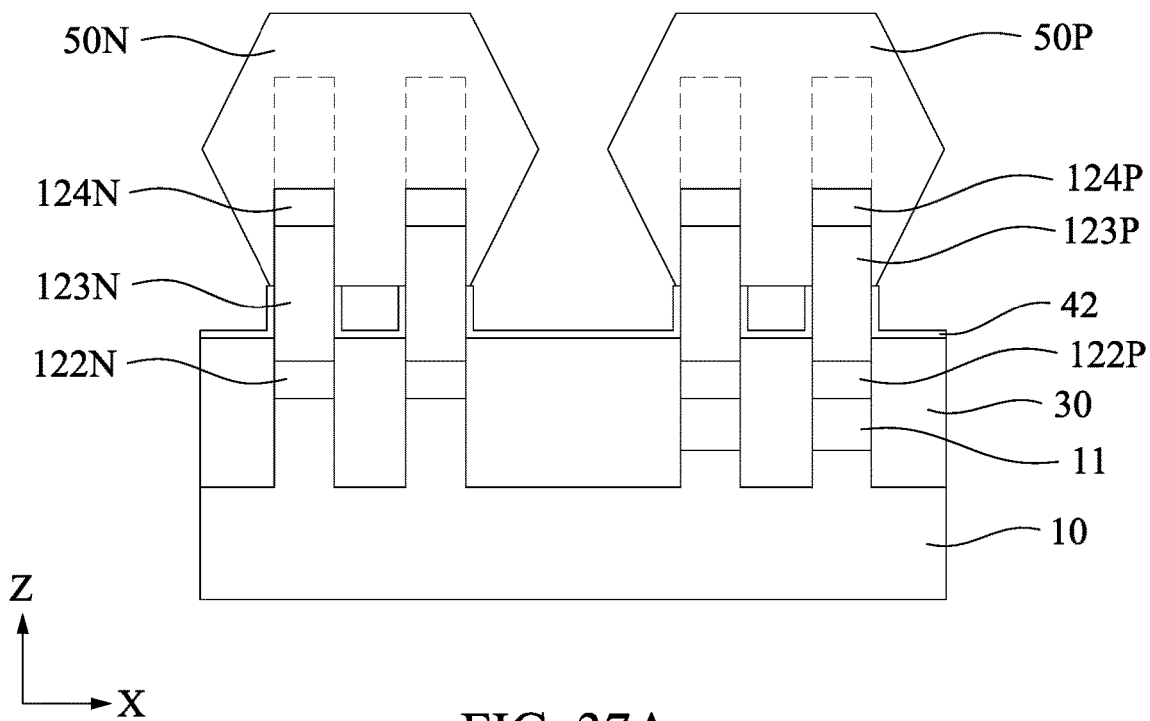
FIGS. 37A and 37B show cross sectional views of one of the stages of a sequential process for manufacturing a FinFET device according to an embodiment of the present disclosure.
Figure 37B:
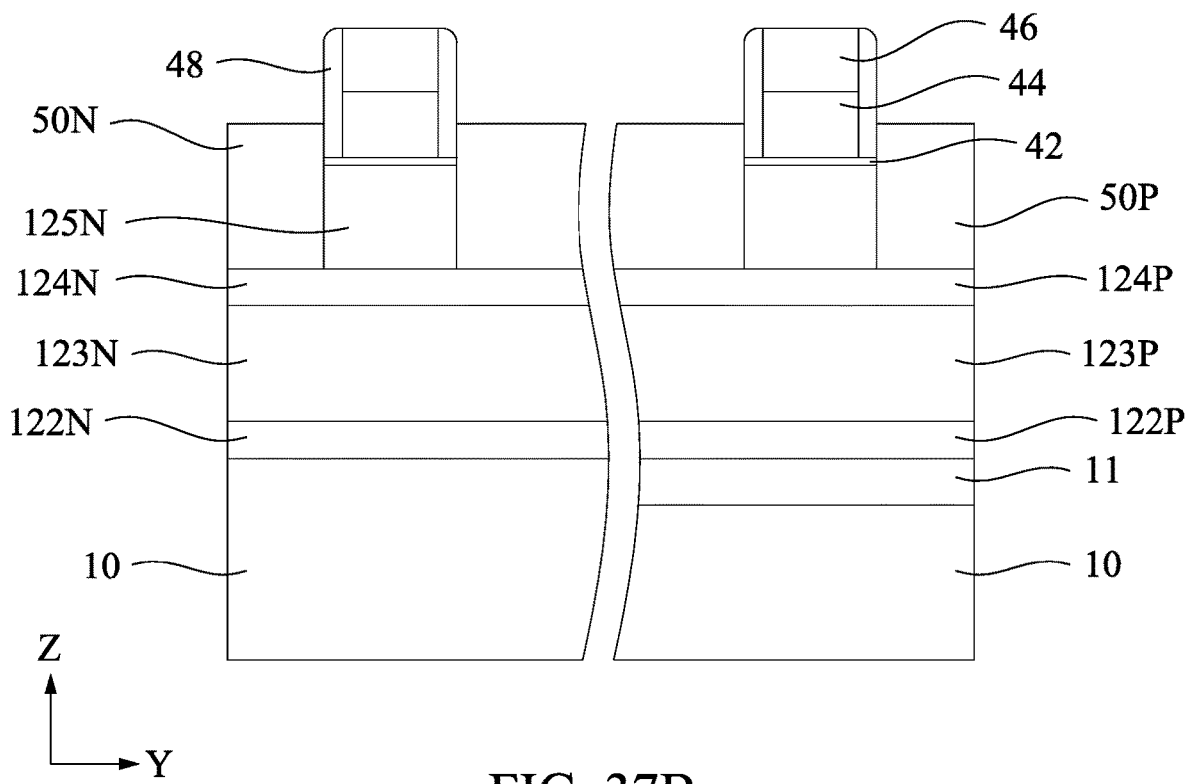

In the embodiment of FIGS. 37A and 37B having a similar fin structure to FIGS. 18A and 30A, the recess etching is stopped at the second epitaxial growth enhancement layers 124N and 124P. The source/drain epitaxial layers 50N and 50P are formed on the second epitaxial growth enhancement layers 124N and 124P, respectively.

Figure 38A:
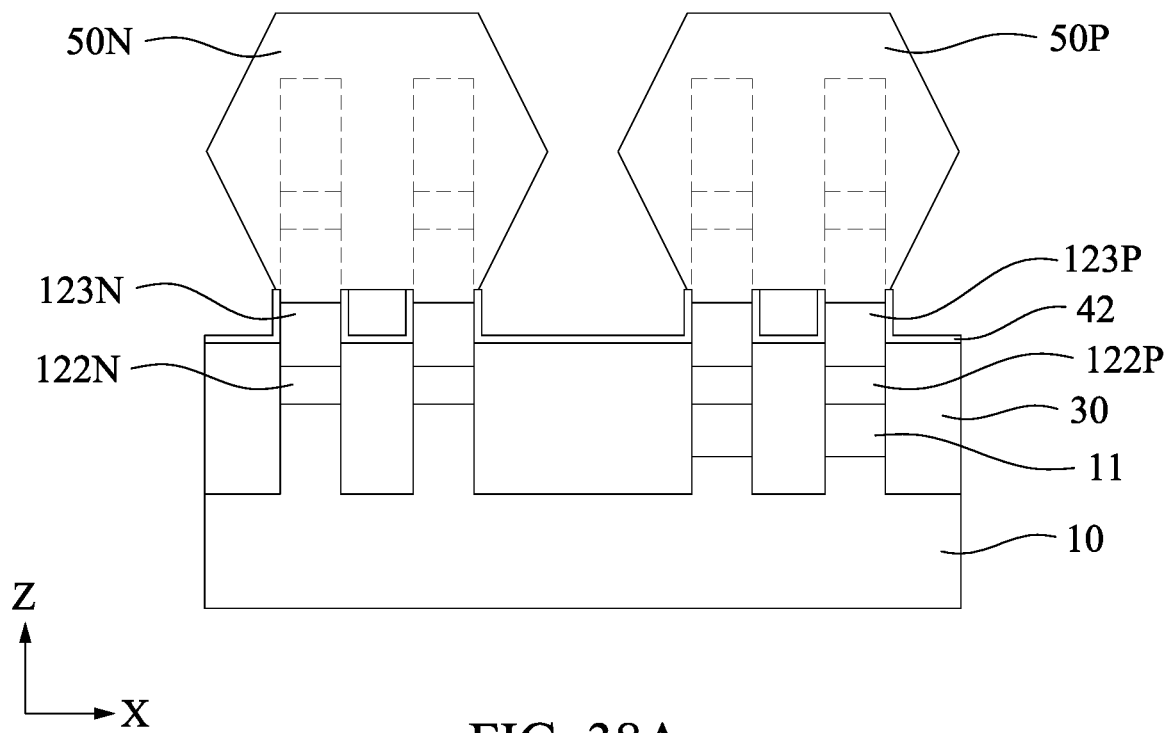
FIGS. 38A and 38B show cross sectional views of one of the stages of a sequential process for manufacturing a FinFET device according to an embodiment of the present disclosure.
Figure 38B:
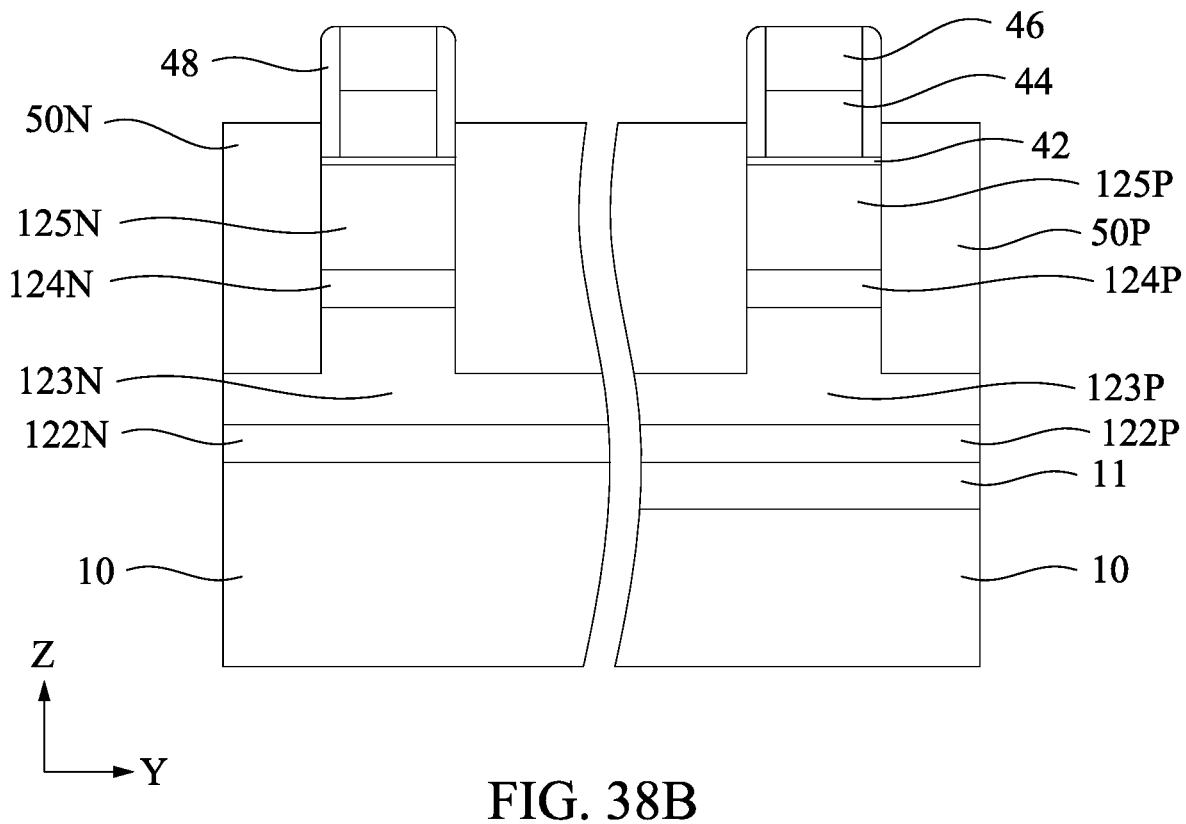

In the embodiment of FIGS. 38A and 38B having a similar fin structure to FIGS. 18A and 30A, the recess etching is stopped at the middle of the first epitaxial layer 123N and the third epitaxial layer 123P. The source/drain epitaxial layers 50N and 50P are formed on the side faces of the second epitaxial growth enhancement layers 124N and 124P, respectively.

Figure 39A:
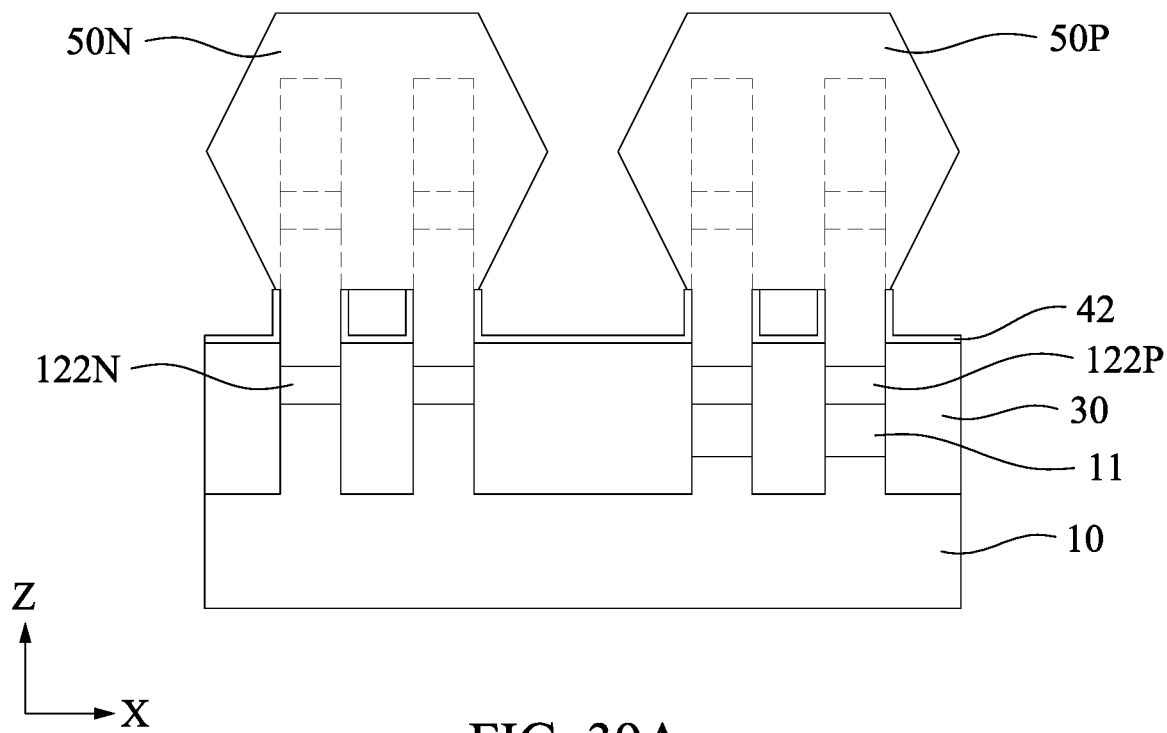
FIGS. 39A and 39B show cross sectional views of one of the stages of a sequential process for manufacturing a FinFET device according to an embodiment of the present disclosure.
Figure 39B:
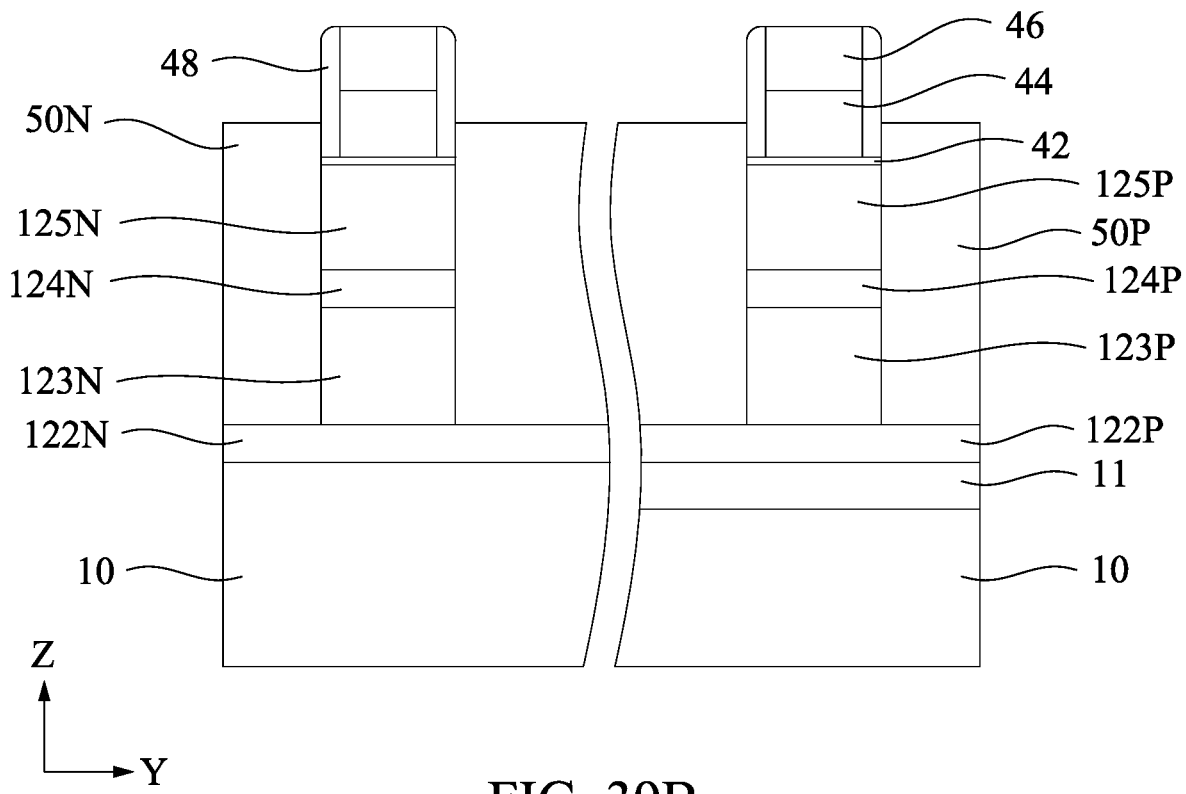

In the embodiment of FIGS. 39A and 39B having a similar fin structure to FIGS. 18A and 30A, the recess etching is stopped at the first epitaxial growth enhancement layers 122N and 122P. The source/drain epitaxial layers 50N and 50P are formed on the first epitaxial growth enhancement layers 122N and 122P, respectively.

In addition to the foregoing embodiments, other combinations of the stacked structures of the fin structures, the liner layer and/or the source/drain recess etching are possible.

Figure 40:
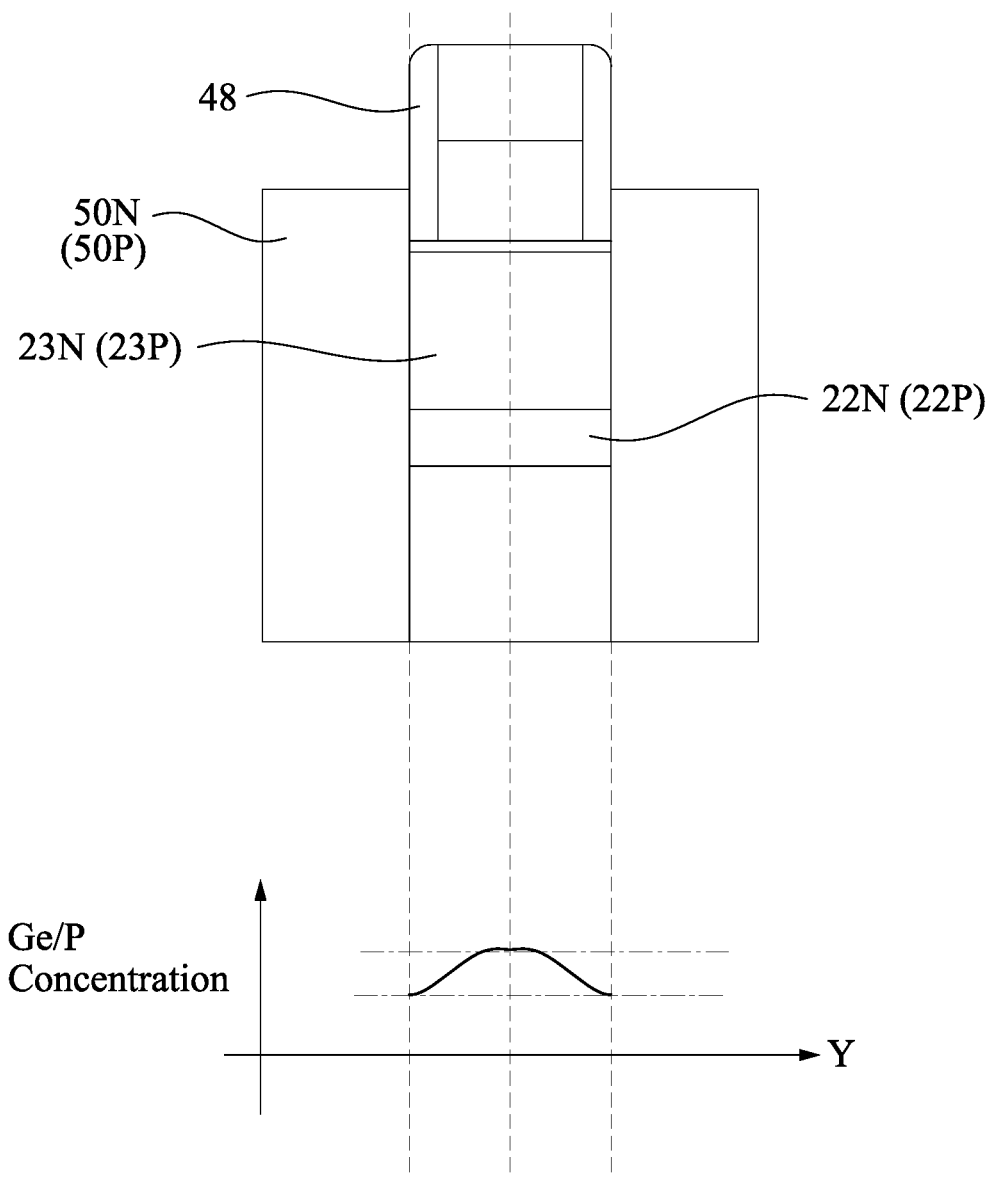
FIG. 40 shows a cross sectional view of one of the stages of a sequential process for manufacturing a FinFET device according to an embodiment of the present disclosure.

FIG. 40 shows a cross sectional view of one of the stages of a sequential process for manufacturing a FinFET device according to an embodiment of the present disclosure.

As set forth above, the epitaxial growth enhancement layers can function as a source of P or Ge for the source/drain epitaxial layers. In some embodiments, after the source/drain epitaxial layer 50N, 50P is formed, the concentration of the P or Ge is not uniform in the epitaxial growth enhancement layers, because the out diffusion of P or Ge occurs from an area closer to the source/drain epitaxial layers. In some embodiments, the concentration of the P or Ge in the epitaxial growth enhancement layers decreases toward the source/drain epitaxial layers 50N and 50P as shown in FIG. 40.

In some embodiments, the concentration of P and/or Ge in the epitaxial growth enhancement layers as formed (before the source/drain epitaxial layer formation) has a gradient. In some embodiments, the concentration of P and/or Ge is higher in the fin structure at sides of the fin structure than the middle of the fin structure in the fin extending direction (Y). In some embodiments, the concentration of P and/or Ge is higher in the fin structure at one side of the fin structure than the other side of the fin structure in the fin extending direction (Y). In other embodiments, the concentration of P and/or Ge is higher in the fin structure at a side of the fin structure than the middle of the fin structure in the fin width direction (X).

The various embodiments or examples described herein offer several advantages over the existing art. For example, in the present disclosure, since one or more epitaxial growth enhancement layers are inserted in the fin structures, it is possible to make the source/drain epitaxial layer larger, which improves device performance.

It will be understood that not all advantages have been necessarily discussed herein, no particular advantage is required for all embodiments or examples, and other embodiments or examples may offer different advantages.

In accordance with one aspect of the present disclosure, a semiconductor device includes an isolation insulating layer disposed over a substrate, a semiconductor fin disposed over the substrate, an upper portion of the semiconductor fin protruding from the isolation insulating layer and a lower portion of the semiconductor fin being embedded in the isolation insulating layer, a gate structure disposed over the upper portion of the semiconductor fin and including a gate dielectric layer and a gate electrode layer, gate sidewall spacers disposed over opposing side faces of the gate structure, and a source/drain epitaxial layer. The upper portion of the semiconductor fin includes a first epitaxial growth enhancement layer made of a semiconductor material different from a remaining part of the semiconductor fin. The first epitaxial growth enhancement layer is in contact with the source/drain epitaxial layer. The gate dielectric layer covers the upper portion of the semiconductor fin including the first epitaxial growth enhancement layer. In one of more of the foregoing and the following embodiments, the first epitaxial growth enhancement layer includes one of SiP, SiCP, SiGe and SiGeB. In one of more of the foregoing and the following embodiments, the first epitaxial growth enhancement layer is located at a top of the semiconductor fin. In one of more of the foregoing and the following embodiments, the first epitaxial growth enhancement layer includes an oxide of one of Si, SiP and SiGe. In one of more of the foregoing and the following embodiments, the lower portion of the semiconductor fin includes a second epitaxial growth enhancement layer made of a semiconductor material different from the remaining part of the semiconductor fin other than the first epitaxial growth enhancement layer. In one of more of the foregoing and the following embodiments, a composition of the first epitaxial growth enhancement layer is different from a composition of the second epitaxial growth enhancement layer. In one of more of the foregoing and the following embodiments, the upper portion of the semiconductor fin further includes a third epitaxial growth enhancement layer made of a semiconductor material different from the remaining part of the semiconductor fin other than the first and second epitaxial growth enhancement layers. In one of more of the foregoing and the following embodiments, a composition of the third epitaxial growth enhancement layer is different from compositions of the first and second epitaxial growth enhancement layers.

In accordance with another aspect of the present disclosure, a semiconductor device includes an isolation insulating layer disposed over a substrate, a semiconductor fin disposed over the substrate and including a bottom fin layer, one or more body layers and one or more epitaxial growth enhancement layers made of different material than the one or more body layers, a gate structure disposed over a channel region of the semiconductor fin and including a gate dielectric layer and a gate electrode layer, gate sidewall spacers disposed over opposing side faces of the gate structure, a source/drain epitaxial layer, and a fin liner layer partially covering the semiconductor fin. At least one of the one or more epitaxial growth enhancement layers is in contact with the source/drain epitaxial layer. The fin liner layer is disposed on the semiconductor fin at least below the gate sidewall spacers. A top of the fin liner layer is higher than a top of an uppermost one of the one or more epitaxial growth enhancement layers and lower than a top of the channel region. In one of more of the foregoing and the following embodiments, each of the one or more epitaxial growth enhancement layers is made of one of SiP, SiGe, SiGeB and SiCP. In one of more of the foregoing and the following embodiments, each of the one or more epitaxial growth enhancement layers is made of an oxide of one of Si, SiGe and SiP. In one of more of the foregoing and the following embodiments, the semiconductor fin includes two or more epitaxial growth enhancement layers, and at least one of the two or more epitaxial growth enhancement layers is in contact with the source/drain epitaxial layer, and at least one of the two or more epitaxial growth enhancement layers is not in contact with the source/drain epitaxial layer. In one of more of the foregoing and the following embodiments, the semiconductor fin includes two or more epitaxial growth enhancement layers, and at least one of the two or more epitaxial growth enhancement layers is located above an upper surface of the isolation insulating layer, and at least one of the two or more epitaxial growth enhancement layers is located below the upper surface of the isolation insulating layer. In one of more of the foregoing and the following embodiments, the gate dielectric layer covers the at least one of the two or more epitaxial growth enhancement layers located above an upper surface of the isolation insulating layer. In one of more of the foregoing and the following embodiments, the at least one of the one or more epitaxial growth enhancement layers in contact with the source/drain epitaxial layer has a non-uniform composition. In one of more of the foregoing and the following embodiments, the at least one of the one or more epitaxial growth enhancement layers in contact with the source/drain epitaxial layer laterally extend below the source/drain epitaxial layer. In one of more of the foregoing and the following embodiments, the fin liner layer does not exist under the gate electrode.

In accordance with another aspect of the present disclosure, a semiconductor device includes an isolation insulating layer disposed over a substrate, a semiconductor fin disposed over the substrate and including a bottom fin layer, one or more body layers and one or more epitaxial growth enhancement layers made of different material than the one or more body layers, a gate structure disposed over the semiconductor fin and including a gate dielectric layer and a gate electrode layer, gate sidewall spacers disposed over opposing side faces of the gate structure, and a source/drain epitaxial layer. At least one of the one or more epitaxial growth enhancement layers is in contact with the source/drain epitaxial layer. The source/drain epitaxial layer includes Si and another element, and the at least one of the one or more epitaxial growth enhancement layers in contact with the source/drain epitaxial layer includes Si and the another element, and the gate dielectric layer covers at least one of the one or more epitaxial growth enhancement layers. In one of more of the foregoing and the following embodiments, the another element is Ge or P. In one of more of the foregoing and the following embodiments, the semiconductor fin includes two or more epitaxial growth enhancement layers, and at least one of the two or more epitaxial growth enhancement layers is located above an upper surface of the isolation insulating layer, and at least one of the two or more epitaxial growth enhancement layers is located below the upper surface of the isolation insulating layer.

In accordance with one aspect of the present disclosure, in a method of manufacturing a semiconductor device, a fin structure is formed over a substrate. The fin structure includes a bottom fin layer, one or more body layers and one or more epitaxial growth enhancement layers made of different material than the one or more body layers. An isolation insulating layer is formed over a substrate so that an upper portion of the fin structure protrudes from the isolation insulating layer. A sacrificial gate structure is formed over a channel region of the fin structure. A source/drain space is formed by recessing a source/drain region of the fin structure such that at least one of the one or more epitaxial growth enhancement layers is exposed in the source/drain space. A source/drain epitaxial layer is formed in the source/drain recess. The at least one of the one or more epitaxial growth enhancement layers is in contact with the source/drain epitaxial layer. In one of more of the foregoing and the following embodiments, each of the one or more body layers is made of Si, and each of the one or more epitaxial growth enhancement layers is made of one of SiP, SiGe, SiGeB and SiCP. In one of more of the foregoing and the following embodiments, each of the one or more body layers is made of Si, and each of the one or more epitaxial growth enhancement layers is made of an oxide of one of Si, SiGe and SiP. In one of more of the foregoing and the following embodiments, each of the one or more body layers is made of Si, and each of the one or more epitaxial growth enhancement layers is made of a P containing semiconductor material. In one of more of the foregoing and the following embodiments, each of the one or more body layers is made of SiGe, and each of the one or more epitaxial growth enhancement layers is made of a Ge containing semiconductor material. In one of more of the foregoing and the following embodiments, the fin structure includes two epitaxial growth enhancement layers separated by one body layer. The isolation insulating layer is formed such that one of the two epitaxial growth enhancement layers is located above an upper surface of the isolation insulating layer and another of the two epitaxial growth enhancement layers is located below the upper surface of the isolation insulating layer. In one of more of the foregoing and the following embodiments, the source/drain region of the fin structure is recessed such that both of the two epitaxial growth enhancement layers are exposed in the source/drain space. In one of more of the foregoing and the following embodiments, the source/drain region of the fin structure is recessed such that the one of the two epitaxial growth enhancement layers located above an upper surface of the isolation insulating layer is exposed in the source/drain space, and the another of the two epitaxial growth enhancement layers located below the upper surface of the isolation insulating layer is not exposed. In one of more of the foregoing and the following embodiments, the fin structure includes three epitaxial growth enhancement layers separated by body layers, and the isolation insulating layer is formed such that two of the three epitaxial growth enhancement layers are located above an upper surface of the isolation insulating layer and one of the three epitaxial growth enhancement layers is located below the upper surface of the isolation insulating layer. In one of more of the foregoing and the following embodiments, at least one of two of the three epitaxial growth enhancement layers located above the upper surface of the isolation insulating layer is not in contact with the source/drain epitaxial layer.

In accordance with another aspect of the present disclosure, in a method of manufacturing a semiconductor device, a fin structure is formed over a substrate. The fin structure includes a bottom fin layer, one or more body layers and one or more epitaxial growth enhancement layers made of different material than the one or more body layers. A fin liner layer is formed to cover a part of the fin structure. An isolation insulating layer is formed over a substrate so that an upper portion of the fin structure protrudes from the isolation insulating layer. A sacrificial gate structure is formed over a channel region of the fin structure. A source/drain space is formed by recessing a source/drain region of the fin structure such that at least one of the one or more epitaxial growth enhancement layers is exposed in the source/drain space. A source/drain epitaxial layer is formed in the source/drain recess. The fin liner layer is formed such that a top of the fin liner layer is higher than a top of an uppermost one of the one or more epitaxial growth enhancement layers and lower than a top of the fin structure. In one of more of the foregoing and the following embodiments, the at least one of the one or more epitaxial growth enhancement layers is in contact with the source/drain epitaxial layer. In one of more of the foregoing and the following embodiments, the at least one of the one or more epitaxial growth enhancement layers is not in contact with the source/drain epitaxial layer. In one of more of the foregoing and the following embodiments, the source/drain epitaxial layer includes Si and another element, and the at least one of the one or more epitaxial growth enhancement layers in contact with the source/drain epitaxial layer includes Si and the another element. In one of more of the foregoing and the following embodiments, the another element is Ge or P. In one of more of the foregoing and the following embodiments, gate sidewall spacers are formed on opposing side faces of the sacrificial gate structure, a dielectric layer is formed over the source/drain epitaxial layer, a gate space is formed by removing the sacrificial gate structure, a gate dielectric layer and a gate electrode layer are formed in the gate space. The gate dielectric layer covers at least one of the one or more epitaxial growth enhancement layers. In one of more of the foregoing and the following embodiments, the fin liner layer is partially removed in the gate space such that the channel region is exposed in the gate space. In one of more of the foregoing and the following embodiments, in the partially removing the fin liner layer, the fin liner layer disposed under the gate sidewall spacers is not removed.

In accordance with another aspect of the present disclosure, in a method of manufacturing a semiconductor device, an epitaxial growth enhancement layer is formed on a semiconductor substrate. A hard mask pattern is formed on the epitaxial growth enhancement layer. A fin structure is formed by patterning the epitaxial growth enhancement layer and a part of the semiconductor substrate by using the hard mask as an etching mask. An isolation insulating layer is formed over a substrate so that an upper portion of the fin structure protrudes from the isolation insulating layer. A sacrificial gate structure is formed over a channel region of the fin structure. A source/drain space is formed by recessing a source/drain region of the fin structure such that the epitaxial growth enhancement layer of the fin structure is exposed in the source/drain space. A source/drain epitaxial layer is formed in the source/drain recess. The epitaxial growth enhancement layer is made of oxide of one of SiGe, Si and SiP. In one of more of the foregoing and the following embodiments, the epitaxial growth enhancement layer is in contact with the source/drain epitaxial layer. In one of more of the foregoing and the following embodiments, gate sidewall spacers are formed on opposing side faces of the sacrificial gate structure, a dielectric layer is formed over the source/drain epitaxial layer, a gate space is formed by removing the sacrificial gate structure, a gate dielectric layer and a gate electrode layer are formed in the gate space. The gate dielectric layer covers the epitaxial growth enhancement layer in the gate space. In one of more of the foregoing and the following embodiments, gate sidewall spacers are formed on opposing side faces of the sacrificial gate structure, a dielectric layer is formed over the source/drain epitaxial layer, a gate space is formed by removing the sacrificial gate structure, the epitaxial growth enhancement layer is formed in the gate space, and a gate dielectric layer and a gate electrode layer are formed in the gate space.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming a fin structure over a substrate, the fin structure including a bottom fin layer, one or more body layers and epitaxial growth enhancement layers made of different material than the one or more body layers, one of the epitaxial growth enhancement layers being a top layer of the fin structure;
forming an isolation insulating layer over the substrate so that an upper portion of the fin structure protrudes from the isolation insulating layer;
forming a sacrificial gate structure over a channel region of the fin structure;
forming a source/drain space by recessing a source/drain region of the fin structure below an upper surface of the isolation insulating layer such that at least one of the epitaxial growth enhancement layers is exposed in the source/drain space below the upper surface of the isolation insulating layer; and
forming a source/drain epitaxial layer in the source/drain space,
wherein the at least one of the epitaxial growth enhancement layers is in contact with the source/drain epitaxial layer,
the fin structure includes two epitaxial growth enhancement layers separated by one body layer, and
the source/drain region of the fin structure is recessed such that one of the two epitaxial growth enhancement layers located above the upper surface of the isolation insulating layer is exposed in the source/drain space, and another of the two epitaxial growth enhancement layers located below the upper surface of the isolation insulating layer is not exposed.

2. The method of claim 1, wherein:
each of the one or more body layers is made of Si, and
each of the epitaxial growth enhancement layers is made of a P containing semiconductor material.

3. The method of claim 2, wherein an amount of P in each of the epitaxial growth enhancement layers is in a range from 3 atomic % to 30 atomic %.

4. The method of claim 1, wherein:
each of the one or more body layers is made of SiGe, and
each of the epitaxial growth enhancement layers is made of a Ge containing semiconductor material.

5. The method of claim 4, wherein an amount of Ge in each of the epitaxial growth enhancement layers is in a range from 10 atomic % to 40 atomic %.

6. The method of claim 1, wherein a thickness of each of the epitaxial growth enhancement layers is in a range from 5 nm to 30 nm.

7. The method of claim 1, wherein the two epitaxial growth enhancement layers are made of the same material.

8. The method of claim 1, further comprising:
forming gate sidewall spacers on opposing side faces of the sacrificial gate structure;
forming a dielectric layer over the source/drain epitaxial layer;
forming a gate space by removing the sacrificial gate structure;
forming a gate dielectric layer and a gate electrode layer in the gate space,
wherein the gate dielectric layer is in contact with the one of the epitaxial growth enhancement layers being the top layer of the fin structure.

9. The method of claim 8, wherein the gate dielectric layer is in contact with an upper surface of the one of the epitaxial growth enhancement layers being the top layer of the fin structure.

10. The method of claim 8, further comprising:
partially removing the one of the epitaxial growth enhancement layers being the top layer of the fin structure in the gate space,
wherein the gate dielectric layer is in contact with an upper surface of an uppermost one of the one or more body layers.

11. The method of claim 1, wherein the sacrificial gate structure is interdisposed between two gate sidewall spacers.

12. A method of manufacturing a semiconductor device, the method comprising:
forming an epitaxial growth enhancement layer on a semiconductor substrate;
forming a hard mask pattern on the epitaxial growth enhancement layer;
forming a fin structure by patterning the epitaxial growth enhancement layer and a part of the semiconductor substrate by using the hard mask as an etching mask;
forming an isolation insulating layer over a substrate so that an upper portion of the fin structure protrudes from the isolation insulating layer;
forming a sacrificial gate structure over a channel region of the fin structure;
forming a source/drain space by recessing a source/drain region of the fin structure such that the epitaxial growth enhancement layer of the fin structure is exposed in the source/drain space; and
forming a source/drain epitaxial layer in the source/drain recess,
wherein the epitaxial growth enhancement layer is made of oxide of one of SiGe or SiP,
the fin structure includes two epitaxial growth enhancement layers separated by one body layer, and
the source/drain region of the fin structure is recessed such that one of the two epitaxial growth enhancement layers located above the upper surface of the isolation insulating layer is exposed in the source/drain space, and another of the two epitaxial growth enhancement layers located below the upper surface of the isolation insulating layer is not exposed.

13. The method of claim 12, wherein the one of the two epitaxial growth enhancement layers located above the upper surface of the isolation layer is in contact with the source/drain epitaxial layer.

14. The method of claim 12, further comprising:
forming gate sidewall spacers on opposing side faces of the sacrificial gate structure;
forming a dielectric layer over the source/drain epitaxial layer;
forming a gate space by removing the sacrificial gate structure;
forming a gate dielectric layer and a gate electrode layer in the gate space,
wherein the gate dielectric layer is in contact with the one of the two epitaxial growth enhancement layers being the top layer of the fin structure.

15. The method of claim 12, further comprising:
forming gate sidewall spacers on opposing side faces of the sacrificial gate structure;
forming a dielectric layer over the source/drain epitaxial layer;
forming a gate space by removing the sacrificial gate structure;
partially removing the one of the two epitaxial growth enhancement layers in the gate space; and
forming a gate dielectric layer and a gate electrode layer in the gate space.

16. The method of claim 12, wherein a thickness of each of the epitaxial growth enhancement layers is in a range from 1 nm to 50 nm.

17. A method of manufacturing a semiconductor device, the method comprising:
- forming a first fin structure and a second fin structure over a substrate, each of the first and second fin structures including a bottom fin layer, one or more body layers and epitaxial growth enhancement layers made of different material than the one or more body layers, one of the epitaxial growth enhancement layers being a top layer of the fin structure;
- forming an isolation insulating layer over the substrate so that upper portions of the first and second fin structure protrudes from the isolation insulating layer;
- forming a sacrificial gate structure over channel regions of the first and second fin structures;
- forming gate sidewall spacers on opposing side faces of the sacrificial gate structure;
- forming a first source/drain space by recessing a source/drain region of the first fin structure below an upper surface of the isolation insulating layer and a second source/drain space by recessing a source/drain region of the second fin structure below the upper surface of the isolation insulating layer such that at least one of the epitaxial growth enhancement layers of the first and second fin structures is exposed in the first and second source/drain spaces below the upper surface of the isolation insulating layer, respectively;
- forming a first source/drain epitaxial layer in the first source/drain space and a second source/drain epitaxial layer in the second source/drain space;
- forming a dielectric layer over the first and second source/drain epitaxial layers;
- forming a gate space by removing the sacrificial gate structure in which the upper portions of the first and second fin structures are exposed; and
- forming a gate dielectric layer and a gate electrode layer in the gate space, wherein:

each of the epitaxial growth enhancement layers of the first fin structure is made of SiP, and an amount of P in each of the epitaxial growth enhancement layers is in a range from 3 atomic % to 30 atomic %.

18. The method of claim 17, wherein:

at least one of the epitaxial growth enhancement layers of the first fin structure is in contact with the first source/drain epitaxial layer, and at least one of the epitaxial growth enhancement layers of the second fin structure is in contact with the second source/drain epitaxial layer.

19. The method of claim 17, wherein:

each of the epitaxial growth enhancement layers of the second fin structure is made of SiGe, and an amount of Ge in each of the epitaxial growth enhancement layers is in a range from 10 atomic % to 40 atomic %.

20. The method of claim 17, wherein a thickness of the gate dielectric layer is in a range from 1 nm to 6 nm.

* * * * *